(12) United States Patent
Labetski et al.

(10) Patent No.: US 12,389,519 B2
(45) Date of Patent: Aug. 12, 2025

(54) GUIDING DEVICE AND ASSOCIATED SYSTEM

(71) Applicant: ASML NETHERLANDS B.V., Veldhoven (NL)

(72) Inventors: Dzmitry Labetski, Eindhoven (NL); Christianus Wilhelmus Johannes Berendsen, Eindhoven (NL); Rui Miguel Duarte Rodrigues Nunes, Eindhoven (NL); Alexander Igorevich Ershov, Escondido, CA (US); Kornelis Frits Feenstra, Cuijk (NL); Igor Vladimirovich Fomenkov, San Diego, CA (US); Klaus Martin Hummler, San Diego, CA (US); Arun Johnkadaksham, San Diego, CA (US); Matthias Kraushaar, Eindhoven (NL); Andrew David Laforge, Poway, CA (US); Marc Guy Langlois, Rancho Mirage, CA (US); Maksim Loginov, Veldhoven (NL); Yue Ma, Escondido, CA (US); Seyedmohammad Mojab, San Diego, CA (US); Kerim Nadir, Eindhoven (NL); Alexander Shatalov, Eindhoven (NL); John Tom Stewart, Escondido, CA (US); Henricus Gerardus Tegenbosch, Eindhoven (NL); Chunguang Xia, San Diego, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/380,439

(22) Filed: Oct. 16, 2023

(65) Prior Publication Data

US 2024/0085796 A1 Mar. 14, 2024

Related U.S. Application Data

(63) Continuation of application No. 17/155,951, filed on Jan. 22, 2021, now Pat. No. 11,822,252, which is a (Continued)

(30) Foreign Application Priority Data

Feb. 28, 2017 (EP) .................................... 17158280

(51) Int. Cl.
*H05G 2/00* (2006.01)
*G03F 7/00* (2006.01)

(52) U.S. Cl.
CPC ......... *H05G 2/009* (2024.08); *G03F 7/70033* (2013.01); *G03F 7/70916* (2013.01); *H05G 2/0094* (2024.08)

(58) Field of Classification Search
CPC ............. G03F 7/70033; G03F 7/70916; G03F 7/70933; H05G 2/003; H05G 2/005; H05G 2/008
See application file for complete search history.

(56) References Cited

U.S. PATENT DOCUMENTS

| 6,972,421 B2 | 12/2005 | Melnychuk et al. |
| 7,812,329 B2 | 10/2010 | Bykanov et al. |
| (Continued) | | |

FOREIGN PATENT DOCUMENTS

| CN | 1797205 | 7/2006 |
| CN | 101802716 | 8/2010 |
| (Continued) | | |

OTHER PUBLICATIONS

International Search Report and Written Opinion issued in corresponding PCT Patent Application No. PCT/EP2018/050278, dated Aug. 7, 2018.

(Continued)

*Primary Examiner* — David E Smith

(74) *Attorney, Agent, or Firm* — Pillsbury Winthrop Shaw Pittman, LLP

(57) ABSTRACT

An extreme ultraviolet radiation (EUV) source, including: a vessel having an inner vessel wall and an intermediate focus (IF) region; an EUV collector disposed inside the vessel, the EUV collector including a reflective surface configured to reflect EUV radiation toward the intermediate focus region, the reflective surface configured to directionally face the IF region of the vessel; a showerhead disposed along at least a portion of the inner vessel wall, the showerhead including a plurality of nozzles configured to introduce gas into the vessel; and one or more exhausts configured to remove gas introduced into the vessel, the one or more exhausts being oriented along at least a portion of the inner vessel wall so that the gas is caused to flow away from the EUV collector.

20 Claims, 26 Drawing Sheets

Related U.S. Application Data continuation of application No. 16/469,689, filed as application No. PCT/EP2018/050278 on Jan. 5, 2018, now Pat. No. 10,955,749, which is a continuation-in-part of application No. 15/400,929, filed on Jan. 6, 2017, now abandoned.

(60) Provisional application No. 62/596,629, filed on Dec. 8, 2017.

(56) References Cited

U.S. PATENT DOCUMENTS

| | | | |
|---|---|---|---|
| 7,928,418 | B2 | 4/2011 | Soumagne et al. |
| 8,076,659 | B2 | 12/2011 | Shirai et al. |
| 8,519,366 | B2 | 8/2013 | Bykanov et al. |
| 8,669,542 | B2 | 3/2014 | Watanabe et al. |
| 10,268,118 | B2 | 4/2019 | Ueno |
| 2006/0138348 | A1* | 6/2006 | Bakker ............ G03F 7/70916 250/492.1 |
| 2006/0158126 | A1 | 7/2006 | Schuermann et al. |
| 2008/0099699 | A1 | 5/2008 | Yabuta et al. |
| 2009/0073396 | A1 | 3/2009 | Van De Vijver et al. |
| 2009/0154642 | A1 | 6/2009 | Bykanov et al. |
| 2009/0261277 | A1 | 10/2009 | Soumagne et al. |
| 2010/0085547 | A1 | 4/2010 | Labetski et al. |
| 2011/0164236 | A1 | 7/2011 | Yakunin et al. |
| 2012/0147348 | A1 | 6/2012 | Van De Vijver et al. |
| 2012/0327381 | A1* | 12/2012 | Labetski ............ G02B 19/0047 355/30 |
| 2013/0088697 | A1 | 4/2013 | Labetski et al. |
| 2014/0306115 | A1 | 10/2014 | Kuritsyn et al. |
| 2015/0008335 | A1* | 1/2015 | Bykanov ............ G03F 7/70916 250/428 |
| 2015/0338753 | A1 | 11/2015 | Riepen et al. |
| 2016/0128171 | A1 | 5/2016 | Kuritsyn et al. |
| 2016/0147160 | A1* | 5/2016 | Franken ............ G03F 7/70916 355/67 |
| 2016/0209753 | A1 | 7/2016 | Zhao et al. |
| 2016/0249442 | A1 | 8/2016 | Kuritsyn et al. |
| 2016/0252821 | A1 | 9/2016 | De Jong et al. |
| 2016/0255707 | A1 | 9/2016 | Ueda et al. |

FOREIGN PATENT DOCUMENTS

| | | |
|---|---|---|
| CN | 102119365 | 7/2011 |
| CN | 102782582 | 11/2012 |
| JP | 2006054270 | 2/2006 |
| JP | 2007220949 | 8/2007 |
| JP | 2008108945 | 5/2008 |
| JP | 2010093249 | 4/2010 |
| JP | 2010539700 | 12/2010 |
| JP | 2013522866 | 6/2013 |
| JP | 2013526026 | 6/2013 |
| JP | 2014523640 | 9/2014 |
| JP | 2015521785 | 7/2015 |
| WO | 2011/110383 | 9/2011 |
| WO | 2016/070189 | 5/2016 |
| WO | 2016/071175 | 5/2016 |
| WO | 2016/100393 | 6/2016 |
| WO | 2016/177519 | 11/2016 |

OTHER PUBLICATIONS

"Downstream." Merriam-Webster.com Dictionary, Merriam-Webster, https://www.merriam-webster.com/dictionary/downstream. Accessed Apr. 12, 2022. (Year: 2022).

Chinese Office Action issued in corresponding Chinese Patent Application No. 201880006126.6, dated Sep. 2, 2022.

Japanese Office Action issued in corresponding Japanese Patent Application No. 2019-531630, dated Sep. 27, 2021.

Office Action issued in corresponding Japanese Patent Application No. 2024-059164, dated Dec. 17, 2024.

\* cited by examiner

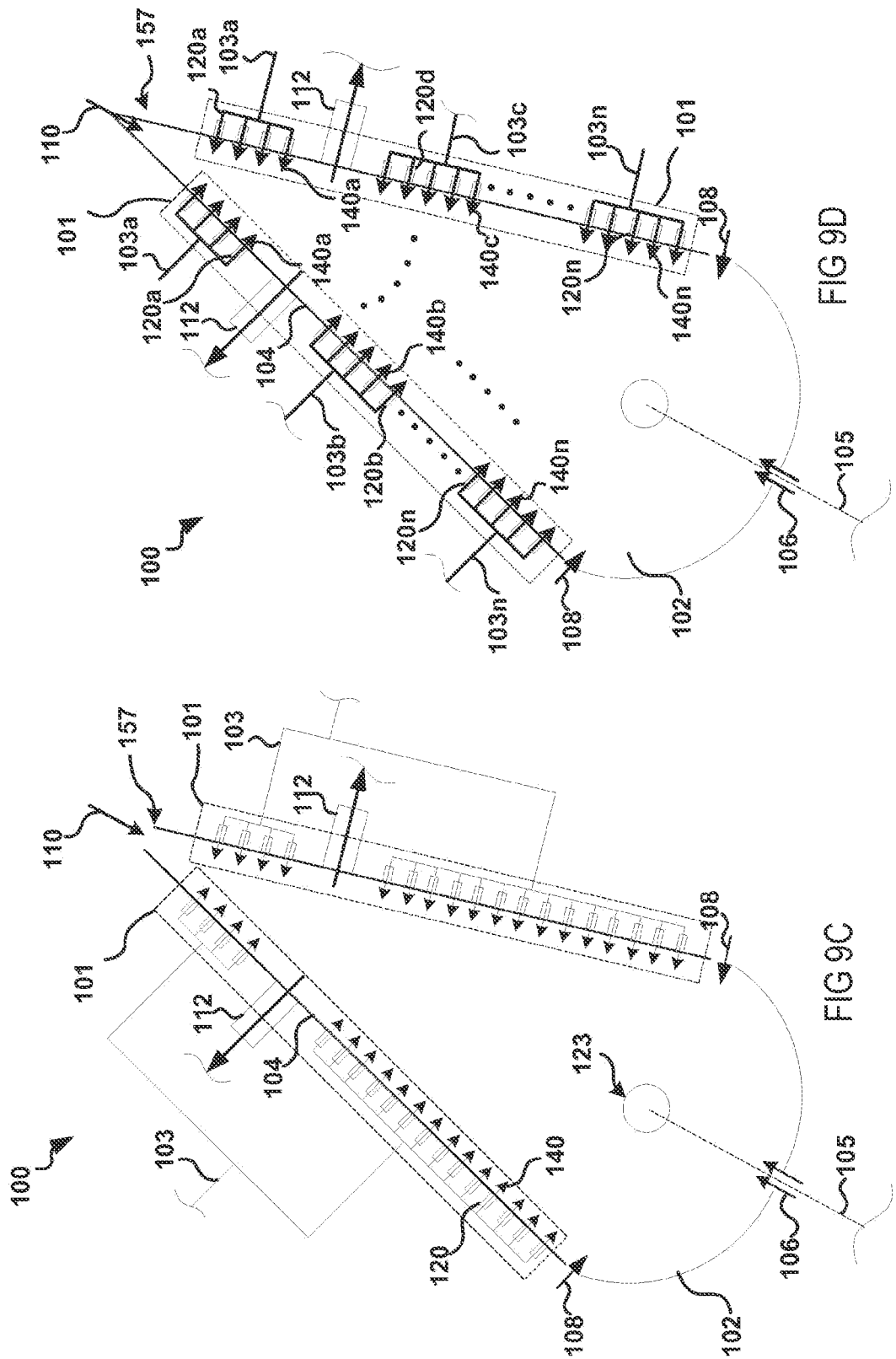

GUIDING DEVICE AND ASSOCIATED SYSTEM

This application is a continuation of U.S. patent application Ser. No. 17/155,951, filed Jan. 22, 2021, which is a continuation of U.S. patent application Ser. No. 16/469,689, filed Jun. 14, 2019, now U.S. Pat. No. 10,955,749, which is the U.S. national phase entry of PCT patent application no. PCT/EP2018/050278, filed Jan. 5, 2018, which is a continuation-in-part of U.S. patent application Ser. No. 15/400,929, filed on Jan. 6, 2017, and claims priority to European patent application no. 17158280.2, filed on Feb. 28, 2017, and to U.S. provisional application No. 62/596,629, filed on Dec. 8, 2017, each of the foregoing applications is incorporated herein in its entirety by reference.

FIELD

The present disclosure relates to a gas flow guiding device and to a radiation source, including such a guiding device. The present disclosure relates, for example, to a guiding device and radiation source for use with a lithographic system. The present disclosure also relates to a radiation source including an EUV vessel having an inner vessel wall that is protected from debris by inner vessel wall supplies of gas, and more specifically, methods and apparatuses for providing gas flow within EUV vessels for protecting inner vessel surfaces such as a portion of the inner vessel wall that is gravitationally above an EUV collector of the EUV vessel.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic system may comprise one or more radiation sources, a beam delivery system and one or more lithographic apparatuses. The beam delivery system may be arranged to deliver radiation from one or more of the radiation sources to each of the lithographic apparatuses.

Extreme ultraviolet (EUV) radiation is used in applications such as extreme ultraviolet lithography (EUVL). An EUV source may generate EUV radiation by illuminating target material such as tin (Sn) with radiation from a high-power laser radiation source. A result of illuminating target material with laser radiation is the generation of laser produced plasma (LPP), which may then emit EUV radiation.

SUMMARY

When target material such as tin is illuminated with laser radiation to produce plasma, a certain portion of the target material becomes debris. For example, target material debris may include Sn vapor, $SnH_4$ vapor, Sn atoms, Sn ions, Sn clusters, Sn microparticles, Sn nanoparticles, and Sn deposits. When Sn debris accumulates on an EUV collector or on one or more inner vessel walls of the EUV vessel, the EUV collector efficiency, lifetime, and availability may be reduced.

The EUV radiation may be produced using a plasma. The plasma may be created, for example, by directing a laser beam at a fuel in the radiation source. The resulting plasma may emit the EUV radiation. A portion of the fuel may become debris, which may accumulate on or more components of the radiation source.

This may result in contamination of the one or more components of the radiation source, which may be difficult to clean. The contamination of one or more components in the radiation source with debris may lead to a decrease in the performance of the radiation source, e.g. the quality of the produced EUV radiation, which in turn can lead to degradation of performance of an associated lithographic apparatus. Ultimately, this can lead to significant down-time of the lithographic apparatus while components of the radiation source are cleaned or replaced. It is within this context that embodiments of the invention arise.

Embodiments of the present disclosure provide systems and apparatuses related to EUV vessels that include inner vessel wall supplies of gas, and more particularly systems and apparatuses for providing flow geometries of gas flow within the EUV vessel that enable a reduction of contamination of debris onto one or more inner vessel walls. One embodiment includes introducing gas into the vessel via a showerhead or a curtain flow and exhausting gas from the vessel through an exhaust configuration. In one configuration, the vessel is designed to have an asymmetric exhaust configuration. In a further configuration, the vessel is designed to have a symmetric exhaust configuration. It should be appreciated that the present disclosure can be implemented in numerous ways, such as a process, an apparatus, a system, a device or instructions on a computer readable medium, the instructions configured to implement a method. Several inventive embodiments of the present disclosure are described below.

In one embodiment, an EUV source includes a vessel having an inner vessel wall and an intermediate focus (IF) region. The embodiment includes an EUV collector that is disposed inside the vessel and connected to the inner vessel wall. The EUV collector includes a reflective surface that is configured to directionally face the IF region of the vessel. The embodiment also includes a showerhead that is disposed along at least a portion of the inner vessel wall. The showerhead includes a plurality of nozzles that introduce gas into the vessel. One or more exhausts for removing gas introduced into the vessel are also included in the embodiment, the one or more exhausts being oriented proximate to the IF region so that the gas introduced into the vessel is caused to flow away from the EUV collector.

In a further embodiment, an EUV source includes a vessel having an inner vessel wall and an intermediate focus (IF) region. The embodiment includes an EUV collector disposed inside the vessel connected to the inner vessel wall, the EUV having a reflective surface that is configured to directionally face the IF region of the vessel. The embodiment includes a first gas source disposed proximate to the reflective surface of the EUV collector having a plurality of inlets for introducing gas into the vessel. The embodiment also includes a showerhead disposed along at least a portion of the inner vessel wall having a plurality of nozzles for introducing gas into the vessel. An exhaust disposed along the inner vessel wall at an azimuthally asymmetric position is also included for exhausting gas from the vessel. In certain embodiments, the asymmetric exhaust may be oriented at a downward leaning angle, for example, toward a direction of gravity. In these and other embodiments, the asymmetric exhaust may be oriented such that it generally opposes a region proximate to a ceiling area of the inner vessel wall that is gravitationally above the EUV collector.

In a further embodiment, an EUV source includes a vessel having an inner vessel wall and an intermediate focus (IF) region. The embodiment includes an EUV collector disposed inside the vessel connected to the inner vessel wall, the EUV collector having a reflective surface that is configured to directionally face the IF region of the vessel. The embodiment includes a vessel wall gas source disposed laterally at least partially along a portion of the inner vessel. According to this embodiment, the vessel wall gas source includes a plurality of nozzle assemblies. Each of the nozzle assemblies may include a first outlet and a second outlet for introducing gas into the vessel, wherein the first outlet is configured to introduce gas in a first direction that is away from a second direction in which the second outlet is configured for introducing gas. In these embodiments, both outlets are configured to introduce gas along a perimeter of the inner vessel wall.

According to an aspect, there is provided a radiation source comprising a chamber (i.e. a vessel) comprising a plasma formation region, a radiation collector arranged in the chamber, the radiation collector configured to collect radiation emitted at the plasma formation region and to direct the collected radiation to an intermediate focus region, a debris mitigation system configured to direct a first gas flow from the intermediate focus region towards the plasma formation region, and a guiding device arranged in the chamber such that the first gas flow is directed around the guiding device.

The guiding device may be arranged such that the first gas flow is symmetrically directed around and/or diffused by the guiding device.

The debris mitigation system may be configured to direct a second gas flow from the radiation collector towards the plasma generation region.

The guiding device may be configured to reduce interaction between the first gas flow and the second gas flow.

The guiding device may be configured to prevent interaction between the first gas flow and the second gas flow.

The guiding device may be configured to prevent formation of a jet of the first gas flow towards the radiation collector.

The guiding device may be arranged in the chamber to extend at least partially along an optical axis of the radiation collector.

The guiding device may be arranged at or in proximity of the intermediate focus region.

The guiding device may be arranged to taper from a first end of the guiding device towards a second end of the guiding device. The first end of the guiding device may comprise an enlarged portion. The second end of the guiding device may comprise a pointed portion or rounded portion.

The guiding device may be arranged in the chamber such that the first end of the guiding device is positioned distal from the intermediate focus region. The guiding device may be arranged in the chamber such that the second end of the guiding device is positioned at or proximal to the intermediate focus region.

The guiding device may comprise at least one opening or a plurality of openings. The at least one opening, the plurality of openings or each opening of the plurality of openings may be configured to direct a third gas flow towards the radiation collector.

The at least one opening, each opening of the plurality of openings or the plurality of openings may be arranged on the guiding device such that the third gas flow from the at least one opening, each opening of the plurality of openings or the plurality of openings interacts with the first gas flow, for example, to direct or push the first flow of gas into proximity with at least a portion of the chamber.

The guiding device may comprise a heating element. The heating element may be configured to increase a temperature of the guiding device.

The heating element may be configured to increase the temperature of the guiding device to a first temperature at which an increased amount of the first gas flow is directed around the guiding device. The heating element may be configured to maintain the temperature of the guiding device below a second temperature at or above which diffusion of debris that is present on the guiding device increases.

The guiding device may be configured for cooling by a coolant. The coolant may be suppliable or supplied by a coolant source.

The radiation source may comprise a debris receiving surface. The debris receiving surface may be arranged in the chamber to reduce or prevent debris from reaching the intermediate focus region.

The debris receiving surface may be arranged to intersect or extend across the optical axis of the radiation collector.

The guiding device may be arranged between the debris receiving surface and the intermediate focus region.

The debris receiving surface may be arranged to extend over or overlap with at least a portion or all of the guiding device so that debris generated at the plasma formation region is incident on the debris receiving surface.

The debris receiving surface may be comprised in, part of or provided by the guiding device.

According to an aspect, there is provided a method of reducing debris deposition in a radiation source, the method comprising directing a first gas flow from an intermediate focus region of the radiation source towards a plasma generation region of the radiation source, and directing the first gas flow around a guiding device arranged in a chamber of the radiation source.

According to an aspect, there is provided an extreme ultraviolet (EUV) source, comprising a vessel having an inner vessel wall and an intermediate focus (IF) region, an EUV collector disposed inside the vessel connected to the inner vessel wall, the EUV collector including a reflective surface, the reflective surface configured to directionally face the IF region of the vessel, a showerhead disposed along at least a portion of the inner vessel wall, the showerhead including a plurality of nozzles for introducing gas into the vessel, the showerhead having at least one inlet for supplying the gas into the showerhead, and one or more exhausts for removing gas introduced into the vessel, the one or more exhausts oriented along at least a portion of the inner vessel wall so that the gas is caused to flow away from the EUV collector.

The EUV source may further comprise a material target region disposed within the vessel for generating plasma radiation, the plasma radiation being collected by the reflective surface of the EUV collector and directed toward the IF region for entrance into at least part of a lithographic apparatus. Introducing the gas into the vessel via the plurality of nozzles may enable protection of the inner vessel wall from deposition of material.

The plurality of nozzles may be oriented along at least a portion of an inner surface of the inner vessel wall in a direction that faces away from the inner surface of the inner vessel wall.

The inner vessel wall may have a conical, cylindrical, or polyhedral shape.

The showerhead may extend perimetrically and laterally along at least a portion of the inner vessel wall.

The EUV source may further comprise an outer vessel wall surrounding the vessel, the outer vessel wall including one or more exhaust vents.

The showerhead may include one or more zones, each of the one or more zones including at least a portion of the plurality of nozzles, each of the one or more zones being separately supplied with gas for enabling separately controllable zones for introducing gas into the vessel.

The inner vessel wall may be defined by smooth surfaces, vane surfaces, or a combination of smooth surfaces and vane surfaces.

According to an aspect, there is provided an extreme ultraviolet (EUV) source, comprising a vessel having an inner vessel wall and an intermediate focus (IF) region, an EUV collector disposed inside the vessel connected to the inner vessel wall, the EUV collector including a reflective surface that is configured to directionally face the IF region of the vessel, a first gas source for introducing gas into the vessel, the first gas source including a first plurality of inlets, the first plurality of inlets disposed proximate to the reflective surface of the EUV collector, a showerhead disposed along at least a portion of the inner vessel wall, the showerhead including a plurality of nozzles for introducing gas into the vessel, the showerhead having at least one inlet for supplying gas into the showerhead, and an exhaust disposed along the inner vessel wall at an azimuthally asymmetric position for exhausting gas from the vessel.

The exhaust may be further oriented proximate to a first region of the inner vessel wall. The first region of the inner vessel wall may generally oppose a second region of the inner vessel wall that is located gravitationally above the EUV collector. The exhaust may enable gas introduced by the first gas source and the plurality of nozzles to flow away from the second region while the EUV source is operational.

The plurality of nozzles may be distributed at least partially along a region of the inner vessel wall that is located gravitationally above the EUV collector.

The plurality of nozzles may be oriented along an inner surface of the inner vessel wall in a direction that is away from the inner surface of the inner vessel wall. The orientation of the plurality of nozzles may enable a flow of gas that is at least partially directed away from at least a portion of the inner surface of the inner vessel wall.

The plurality of nozzles may be disposed at least partially along a ceiling region of the inner vessel wall that is located gravitationally above the EUV collector. The plurality of nozzles may be oriented in a direction that faces away from the ceiling region. Introducing the gas by the plurality of nozzles may provide a diffusion barrier adjacent the ceiling region for excluding debris.

The showerhead may include one or more zones. Each of the one or more zones may include at least a portion of the plurality of nozzles. Each of the one or more zones may be separately supplied with gas for enabling separately controllable zones for introducing gas into the vessel.

The inner vessel wall may have a conical, cylindrical, or polyhedral shape.

According to an aspect, there is provided an extreme ultraviolet (EUV) source, comprising a vessel having an inner vessel wall and an intermediate focus (IF) region, an EUV collector disposed inside the vessel connected to the inner vessel wall, the EUV collector including a reflective surface, the reflective surface configured to directionally face the IF region of the vessel, and a vessel wall gas source disposed laterally at least partially along the inner vessel wall, the vessel wall gas source including a plurality of nozzle assemblies, each of the plurality of nozzle assemblies having at least a first outlet and a second outlet for introducing gas into the vessel, the first outlet configured to introduce gas in a first direction that is away from a second direction in which the second outlet is configured to introduce gas, and an exhaust for exhausting gas introduced into the vessel, the exhaust being proximate to the IF region for enabling gas introduced by the vessel wall gas source to flow away from the EUV collector.

The first direction and the second direction in which gas may be introduced by the first outlet and the second outlet, respectively, of each the plurality of nozzle assemblies may be oriented at least partially along a perimeter of the inner vessel wall for enabling curtain flows of gas along the perimeter of the inner vessel wall.

At least a portion of the plurality of nozzle assemblies may further include a third outlet for introducing gas into the vessel. The third outlet may be configured to introduce gas away from the inner vessel wall.

The plurality of nozzle assemblies may be distributed at least partially along a first region of the inner vessel wall that is located gravitationally above the EUV collector while the EUV source is operational. The exhaust may be further oriented proximate to a second region of the inner vessel wall that may oppose the first region of the inner vessel wall for enabling gas that is introduced into the vessel to flow away from the first region of the inner vessel wall.

The inner vessel wall may have a conical, cylindrical, or polyhedral shape.

According to an aspect, there is provided a radiation source comprising a chamber comprising an inner wall and a material target region, a radiation collector arranged in the chamber, the radiation collector configured to collect radiation emitted at the material target region and to direct the collected radiation to an intermediate focus region, a debris mitigation system configured to direct a first gas flow from the intermediate focus region towards the material target region, the debris mitigation system configured to direct a second gas flow from a portion of the inner wall of the chamber into the chamber, a guiding device arranged in the chamber such that the first gas flow is directed around the guiding device, and an exhaust for removing gas supplied by the debris mitigation system from the chamber.

The exhaust may be arranged to extend from a portion of the inner wall of the chamber at an azimuthally asymmetric position.

The debris mitigation system may comprise a showerhead. The showerhead may be arranged along at least a portion of the inner wall of the chamber. The showerhead may include a plurality of nozzles for introducing the second gas flow into the chamber.

The guiding device may be configured to reduce interaction between the first gas flow and the second gas flow.

The debris mitigation system may be configured to direct a third gas flow from a position at or proximate to the guiding device in the chamber towards the material target region.

The guiding device may be configured to reduce interaction between the first gas flow and the third gas flow.

The debris mitigation system may be configured to direct a fourth gas flow from the radiation collector towards the material target region.

The guiding device may be configured to reduce interaction between the first gas flow and the fourth gas flow.

The guiding device may be arranged to taper from a first end of the guiding device towards a second end of the guiding device. The first end of the guiding device may comprise an enlarged portion. The second end of the guiding device may comprise a pointed portion or rounded portion.

The guiding device may be arranged in the chamber such that the first end of the guiding device is positioned distal from the intermediate focus region and the second end of the guiding device is positioned at or proximal to the intermediate focus region.

The guiding device may be arranged in the chamber to extend at least partially along an optical axis of the radiation collector.

The guiding device may comprise at least one opening or a plurality of openings. The at least one opening, each opening of the plurality of openings or the plurality of openings may be configured to direct a fifth gas flow towards the radiation collector.

The at least one opening, each opening of the plurality of openings or the plurality of openings may be arranged on the guiding device such that the fifth gas flow from the at least one opening, each opening of the plurality of openings or the plurality of openings interacts with the first gas flow to direct or push the first flow of gas into proximity with at least a portion of the inner wall of the chamber.

The guiding device may comprise a heating element. The heating element may be configured to increase a temperature of the guiding device.

The heating element may be configured to increase the temperature of the guiding device to a first temperature at which an increased amount of the first gas flow is directed around the guiding device. The heating element may be configured to maintain the temperature of the guiding device below a second temperature at which diffusion of debris that is present on the guiding device increases.

The guiding device may be configured for cooling by a coolant. The coolant may be suppliable or supplied by a coolant source.

The radiation source may comprise a debris receiving surface. The debris receiving surface may be arranged in the chamber to reduce or prevent debris from reaching the intermediate focus region.

The debris receiving surface may be comprised in, part of or provided by the guiding device.

According to an aspect, there is provided a method of reducing debris deposition in a radiation source, the method comprising directing a first gas flow from an intermediate focus region of the radiation source towards a material target region of the radiation source, directing a second gas flow from a portion of an inner wall of a chamber of the radiation source into the chamber, directing the first gas flow around a guiding device arranged in the chamber of the radiation source, and removing gas from the chamber.

According to an aspect, there is provided a radiation system comprising a laser and (i) a radiation source as described herein or (ii) an extreme ultraviolet (EUV) source as described herein.

According to an aspect, there is provided a lithographic system comprising a lithographic apparatus arranged to project a pattern from a patterning device onto a substrate, and a radiation system as described herein arranged to provide at least some of the radiation to the lithographic apparatus.

According to an aspect, there is provided a radiation source comprising a chamber comprising an inner wall and a material target region; a radiation collector arranged in the chamber, the radiation collector configured to collect radiation emitted at the material target region and to direct the radiation beam of the collected radiation to an intermediate focus region; a debris mitigation system comprising a first gas supply system and a second gas supply system; an exhaust configured to remove gas supplied by the debris mitigation system from the chamber; wherein the first gas supply system is configured to direct a first gas flow from the intermediate focus region towards the material target region or the plasma formation region, the first gas supply system comprising one or more openings arranged to direct the first gas flow in a direction substantially opposite to a propagation direction of the radiation beam into the chamber; and wherein the second gas supply system comprises one or more openings arranged to direct the second gas flow in a direction substantially perpendicular or tilted under an angle to the propagation direction of the first gas flow.

Other aspects of the method and apparatus for vessel wall protection by one or more gas flow inlets and exhaust asymmetry to improve collector lifetime in LPP EUV source will be made apparent from the following detailed description, taken in conjunction with accompanying drawings, illustrating by way of example principles of the method and apparatus.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which:

FIG. 9C is a simplified schematic view of an embodiment for an EUV vessel having a showerhead with a plurality of nozzles that are controlled by a common gas delivery system;

FIG. 9D is a simplified schematic view of an embodiment for an EUV vessel having a showerhead that includes a plurality of zones, wherein each zone may be separately controlled by a respective gas delivery system;

DETAILED DESCRIPTION

Figure 1:
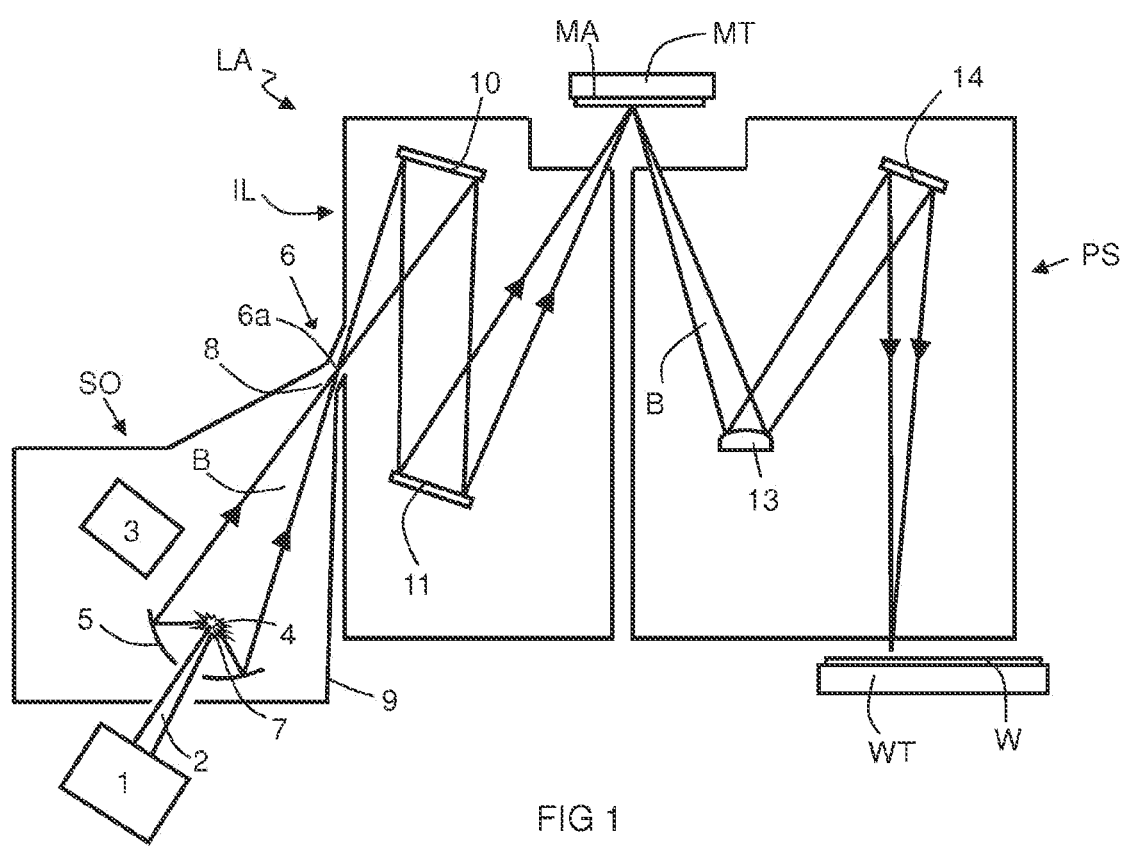
FIG. 1 depicts a lithographic system comprising a lithographic apparatus and a radiation source according to an embodiment.

FIG. 1 shows a lithographic system including a radiation source according to an embodiment. The lithographic system comprises the radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a CO 2 laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an ellipsoidal configuration, having two ellipse focal points. A first focal point may be at the plasma formation region 4, and a second focal point 6a. The second focal point 6a may be located at or near an intermediate focus region 6.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6a to form an image of the plasma formation region 4, which acts as a virtual radiation source for the illumination system IL. The point 6a at which the radiation beam B is focused may be referred to as the intermediate focus 6a. The radiation source SO is arranged such that the intermediate focus 6a is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
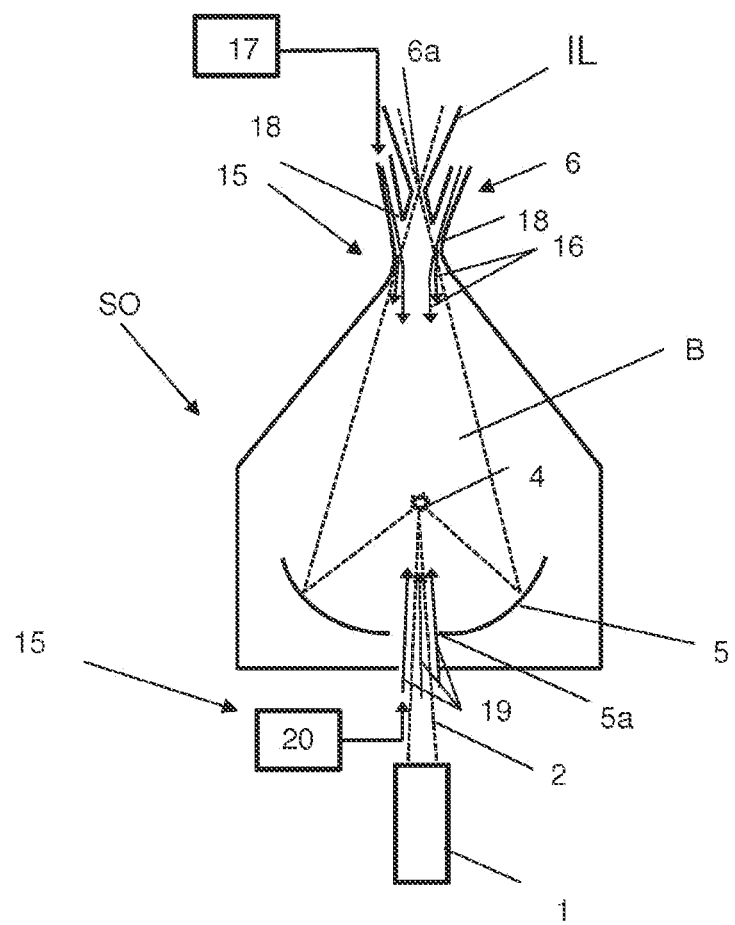
FIG. 2 depicts a radiation source including a debris mitigation system of the lithographic system of FIG. 1.

FIG. 2 schematically depicts an exemplary radiation source SO including a debris mitigation system 15. For clarity purposes the laser beam 2 and the radiation beam B are indicted by dashed lines in FIG. 2. The debris mitigation system 15 is configured to direct a first gas flow 16 from the intermediate focus region 6 towards the plasma formation region 4. For example, the debris mitigation system 15 may include a first gas supply system 17. The first gas supply system 17 may be configured to supply the first gas flow 16 towards the plasma formation region 4. The first gas supply system 17 may include one or more openings 18, e.g. one or more nozzles or slits, which are provided at the intermediate focus region 6, e.g. at or near the intermediate focus 6. The one or more openings 18 may be arranged such that the first gas flow 16 towards the collector 5 can be created. For example, the one or more openings 18 may be arranged to direct the first gas flow 16 in a direction opposite (e.g. substantially opposite) to a propagation direction of the radiation beam B. The first gas flow 16 may have a flow rate that is sufficient to reduce or prevent debris from travelling towards the intermediate focus 6a. The first gas supply system 17 may be considered to be or comprised in a dynamic gas lock (DGL) system. When fuel is illuminated with laser beam 2 to produce the plasma 7 a portion of the fuel may become debris. Debris may include particulate debris, such as for example Sn clusters, Sn microparticles, Sn nanoparticles, and/or Sn deposits, molecular and/or atomic debris, such as for example Sn vapor, $SnH_x$ vapor, Sn atoms, Sn ions.

The debris mitigation system 15 may be configured to direct a second gas flow 19 from the collector 5 towards the plasma formation region 4. For example, the debris mitigation system 15 may include a second gas supply system 20. The second gas supply system 20 may be configured to supply the second gas flow 19 from the collector 5 towards the plasma formation region 4. The second gas flow 19 may be directed towards the plasma formation region 4 to reduce or prevent debris generated by the plasma 7 from reaching the collector 5. For example, the second gas supply system 20 may be arranged to supply the second gas flow 19 through a central aperture 5a in the collector 5. It will be appreciated that in other examples, the second gas supply system or a portion thereof may be provided in the collector. For example, the second gas supply system may comprise one or more outlets, which may be arranged within the collector. Additionally or alternatively, the second gas supply system may be configured to supply the second gas flow from a perimeter portion of the collector.

The second gas flow 19 may have a flow rate that is sufficient to prevent debris from being deposited on the collector 5. For example, the second gas flow 19 may have a flow rate in the range of about 30 to 200 slm (standard liter per minute), desirably between about 50 to 150 slm. The flow rate of the second gas flow 19 may be selected dependent on an arrangement or geometry of the second gas supply system 20.

The first gas flow 16 may be selected such as to prevent debris from entering the illumination system IL. A flow rate of the first gas flow 16 may be selected depending on a gas used in the first gas flow 16, a velocity of the gas used in the first gas flow 16, a density or pressure of the gas used in the first gas flow 16, a size of debris, e.g. particulate debris, a velocity of debris and/or a direction of debris diffusion in the radiation source SO. Additionally or alternatively, the flow rate of the first gas flow 16 may be selected depending on the arrangement or geometry of the first gas supply system 17. For example, the flow rate of the first gas flow 16 may be selected dependent on a number of the openings 18, a width (e.g., diameter) of each opening 18 of the first gas supply system 17 and/or a width (e.g., diameter), periphery or dimension of the intermediate focus region 6. For example, a maximum velocity of the gas used in the first gas flow 16 may be in the range of about 1000 to 3000 m/s.

The first gas flow 16 may have a flow rate in the range of about 5 to 30 slm. A flow rate of about 7 slm may be sufficient to prevent molecular and/or atomic debris generated in the radiation source SO from entering the illumination system IL. To suppress particulate debris from reaching the illumination system IL, flow rates of the first gas flow larger than 7 slm may be required. For example, to suppress particulate debris from reaching the illumination system, a flow rate of larger than 15 slm of the first gas flow 16 may be required. At a flow rate of larger than 15 slm, an asymmetric flow of the first gas flow 16 may be observed. In other words, the first gas flow 16 may be pushed towards an internal wall of the radiation source SO, as will be described below.

Figure 3:
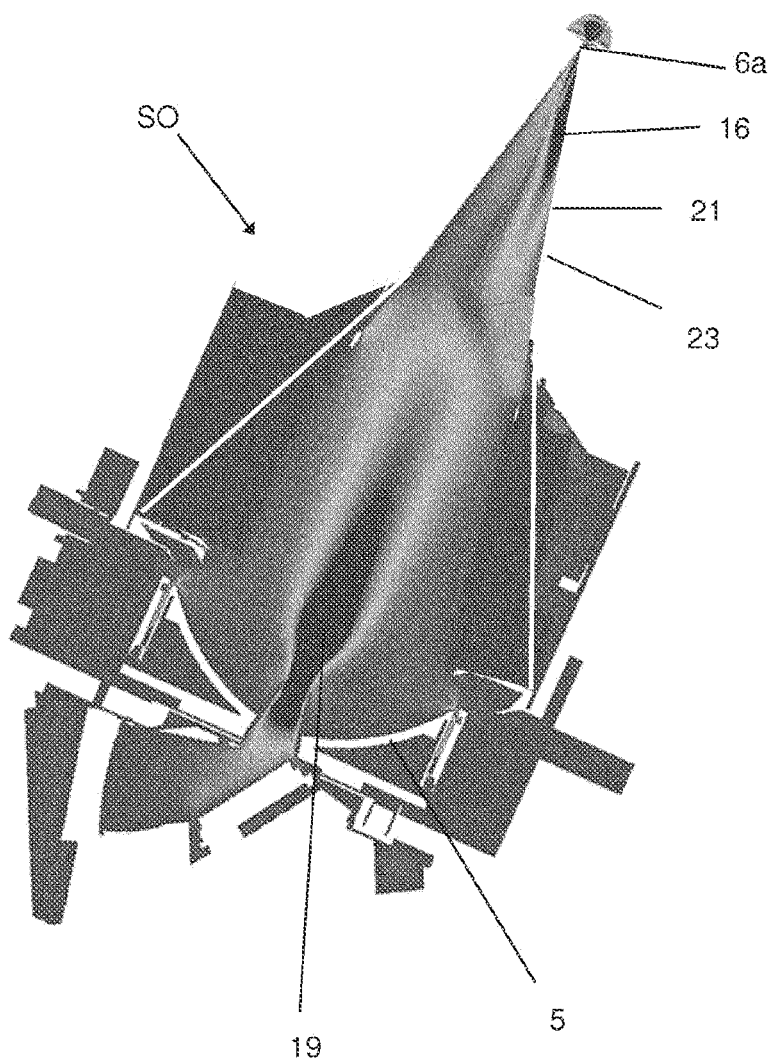
FIG. 3 depicts a simulation of a first gas flow and a second gas flow in the radiation source of FIG. 2.

FIG. 3 depicts simulated first and second gas flows 16, 19 in the radiation source SO, for the example, in which the flow rate of the first gas flow 16 is equal to or larger than 15 slm. From FIG. 3, it can be seen the first gas flow 16 is pushed against an internal wall 21 (e.g., of a chamber 23) of the radiation source SO. This may be due to an interaction between the first gas flow 16 and the second gas flow 19. The interaction between the first and second gas flows 16, 19 may cause the formation of a jet of the first gas flow 16 towards a portion of collector 5. The formation of the jet of the first gas flow 16 may result in debris, e.g. particulate debris, being deposited on the collector 5. This may lead to an increased contamination of the collector 5 and/or the radiation source SO.

Figure 4A:
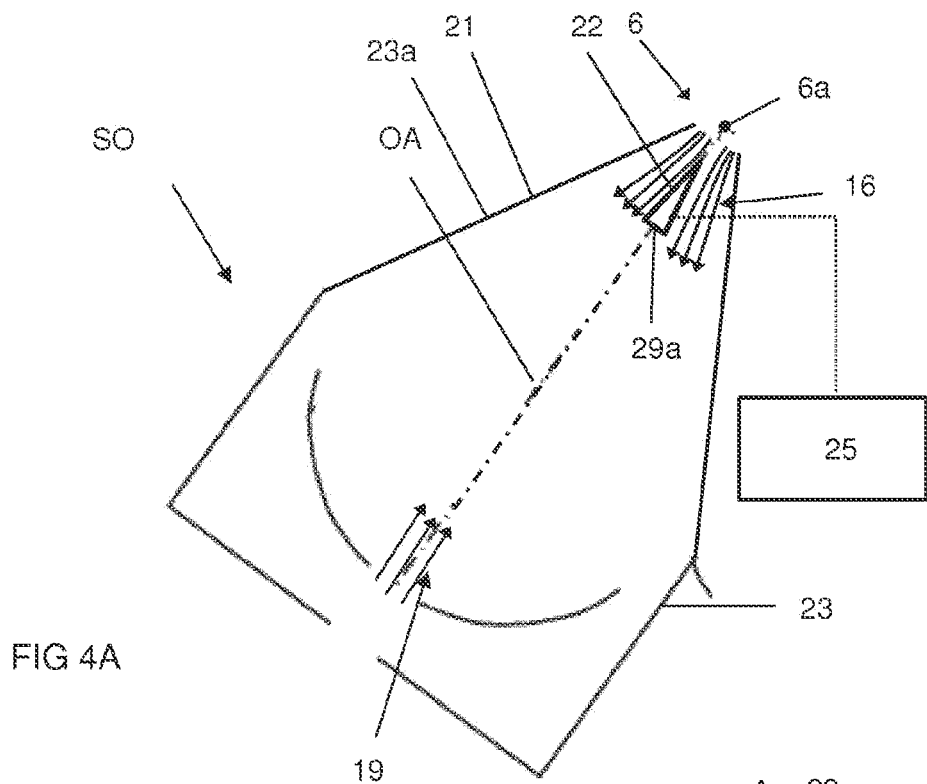
FIG. 4A depicts a portion of the radiation source of FIG. 2 including a guiding device.

FIG. 4A schematically depicts a radiation source SO according to an embodiment. The radiation source SO depicted in FIG. 4A is similar to that depicted in FIG. 2, but additionally includes a guiding device. The guiding device may be provided in the form of a flow splitter 22. The first and second gas supply systems 17, 20, the one or more openings 18, the laser 1, the laser beam 2 and the radiation beam B have been omitted from FIG. 4A for clarity purposes. However, it will be appreciated that the exemplary radiation source SO depicted in FIG. 4A may include any of the features of the radiation source SO described above in relation to FIGS. 1-3. The radiation source may include a chamber 23. The flow splitter 22 is arranged in the chamber 23 such that the first gas flow 16 is directed around the flow splitter 22. For example, the flow splitter 22 may be arranged such that the first gas flow is symmetrically directed around the flow splitter 22. The flow splitter 22 may be configured to diffuse or spread, e.g. symmetrically diffuse or spread, the first gas flow 16. By arranging the flow splitter 22 in the chamber 23, recirculation of at least some of the first gas flow 16 in the chamber 23 may be reduced. This may lead to less debris being deposited on the internal wall 21 of the of the radiation source SO. Additionally or alternatively, by arranging the flow splitter 22 in the chamber 23 such that the first gas flow 16 is directed around the flow splitter 22, contamination of the flow splitter 22, e.g. with debris, may be reduced or prevented.

The flow splitter 22 may be arranged in the chamber 23 of the radiation source SO to maintain the maximum velocity of the gas used in the first gas flow 16 at a first location in the radiation source SO. At the first location the velocity of the gas used in the first gas flow 16 may correspond (or substantially correspond) to a maximum velocity of the gas used in the first gas flow 16, for example when no flow splitter is arranged in the chamber 23 of the radiation source SO. The flow splitter 22 may be arranged in the radiation source SO to diffuse or spread the first gas flow 16 to prevent or reduce recirculation of some of the first gas flow 16, for example in a direction towards the intermediate focus 6a. The flow splitter 22 may be arranged in chamber 23 of the radiation source SO to diffuse or spread the first gas flow 16 at a second location, which may be spaced or remote from the intermediate focus point 6a. The flow splitter 22 may be arranged in the chamber 23 of the radiation source so that the maximum velocity of the gas used in the first gas flow 16 is reduced at the second location and/or a minimum velocity of the gas of the first gas flow 16 that may be directed in a direction away from the intermediate focus 6a is increased.

The flow splitter 22 may be configured to reduce or prevent the interaction between the first gas flow 16 and the second gas flow 19. The flow splitter 22 may be configured to prevent formation of a jet of the first gas flow 16, e.g. towards the portion of the collector 5. This may allow for the use of flow rates larger than 7 slm of the first gas flow 16.

Referring to FIG. 4A, the flow splitter 22 is arranged in the chamber 23 to extend across a portion of the chamber 23. For example, the flow splitter 22 may be arranged to extend at least partially along an optical axis OA of the collector 5. In other words, the flow splitter 22 may be arranged in the chamber 23 such that a central or longitudinal axis A of the flow splitter 22 coincides with at least a part of the optical axis OA of the collector 5. The radiation source SO may comprise a conical portion 23a, which may be part of the chamber 23. The conical portion 23a may be arranged to extend from the intermediate focus 6a towards or near the collector 5. The flow splitter 22 may be arranged in the conical portion 23a, for example to extend at least partially along a central or longitudinal axis of the conical portion 23a, which in this example corresponds to at least a part of the optical axis OA of the collector 5. This may result in a symmetrical arrangement of the flow splitter 22 in the chamber 23, e.g. the conical portion 23a. It will be understood that the exemplary chamber described herein is not limited to comprising a conical portion. For example, the chamber or a portion thereof may have any suitable shape, for example, to reduce the volume of the chamber or the portion thereof, without obstructing the radiation beam.

Referring to FIG. 4A, the flow splitter 22 is arranged at or in proximity of the intermediate focus region 6. For example, the flow splitter 22 is arranged at or in proximity of the intermediate focus region 6 to enable the flow splitter 22 to act on the first gas flow 16. The flow splitter 22 may be arranged at a distance from the intermediate focus point 6a. The distance of the flow splitter 22 from the intermediate focus point 6a may be in the region of 5 to 15 cm. However, it should be understood that the arrangement of the flow splitter 22 in the radiation source SO is not limited to such a distance and other values for the distance may be selected. For example, the distance may be selected dependent on space available at or in proximity of the intermediate focus region and/or thermal loads that may act on the flow splitter 22, e.g. due to the radiation at the intermediate focus region. In other words, the distance may be selected such that any thermal effects on the flow splitter 22, such as for example melting of the flow splitter 22, are minimized or prevented. As discussed above, the flow splitter 22 may be arranged to extend at least partially along the central or longitudinal axis of the conical portion 23a, which in this example corresponds to at least a part of the optical axis OA of the collector 5. This arrangement may allow the flow splitter 22 to symmetrically direct the first gas flow 16 around the flow splitter 22, for example, to reduce or prevent the interaction between the first and second gas flows 16, 19 and/or may prevent the formation of a jet of the first gas flow 16.

Figures 4B, 4C:
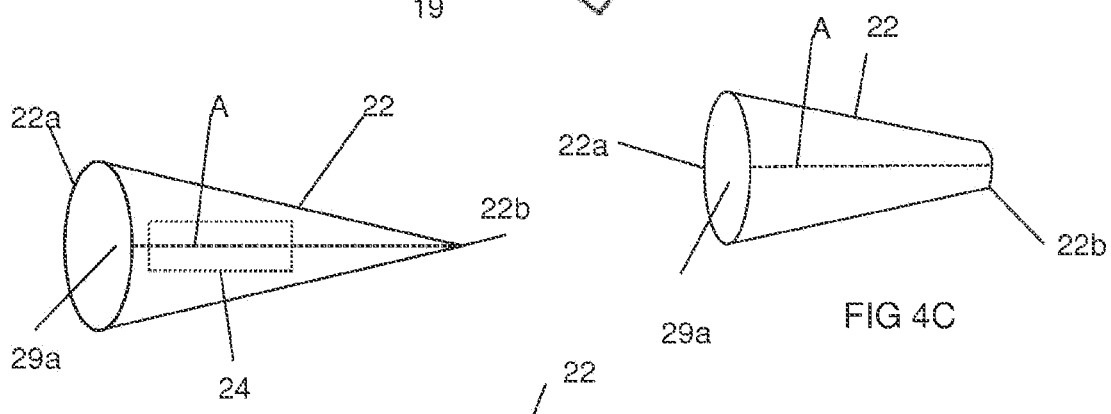
FIG. 4B depicts a further embodiment of the guiding device of FIG. 4A.
FIG. 4C depicts a further embodiment of the guiding device of FIG. 4A.

The exemplary flow splitter 22 depicted in FIG. 4B is arranged to taper from a first 22a end towards a second end 22b. The first end 22a of the flow splitter 22 may comprise or define an enlarged portion. The flow splitter 22 may be arranged in the chamber 23, e.g. the conical portion 23a thereof, such that the first end 22a, e.g. the enlarged portion, of the flow splitter is positioned distal from the intermediate focus region 6. The second end 22b of the flow splitter 22 may define or comprise a pointed portion. The flow splitter 22 may be arranged in the chamber 23, e.g. the conical portion 23a thereof, such that the second end 22b, e.g. the pointed portion, of the flow splitter 22 is positioned at or proximal to the intermediate focus region 6. The exemplary flow splitter 22 depicted in FIG. 4B comprises a conical shape.

FIG. 4C depicts a further exemplary arrangement of the flow splitter 22. The flow splitter 22 depicted in FIG. 4C is similar to that depicted in FIG. 4B. The first end 22a of the flow splitter 22 defines or comprises the enlarged portion. The second end 22b of the flow splitter 22 comprises or defines a rounded portion. The exemplary flow splitter depicted in FIG. 4C may be considered as comprising a substantially truncated conical shape. It should be understood that the flow splitter disclosed herein is not limited to a conical or truncated conical shape. In other examples, the flow splitter may comprise a conical or truncated conical shape having one or more flat portions. Alternatively, the flow splitter may comprise a spiral or helical shape.

Referring to FIGS. 4B and 4C, an extension or dimension of the flow splitter 22, for example along the longitudinal or central axis A of the flow splitter 22, may be selected depending on a dimension, volume and/or shape of the chamber 23 of the radiation source SO. The extension or dimension of the flow splitter 22 may be selected such that the flow splitter 22 interacts with the first gas flow 16 and/or the flow splitter directs the first gas flow around the flow splitter 22, as described above, e.g. when the flow splitter 22 is arranged in the chamber 23 of the radiation source SO. An exemplary extension or dimension of the flow splitter 22 along the longitudinal or central axis A of the flow splitter 22 may comprise about 3 to 30 cm, e.g. 10 to 20 cm. However, it should be understood that the exemplary flow splitter disclosed herein is not limited to such an extension or dimension.

The radiation source SO may include a heating element 24, which may be part or comprised in the flow splitter 22. The heating element 24 may be configured to increase a temperature of the flow splitter 22, for example to increase an amount of the first gas flow 16 that is directed around the flow splitter 22.

The heating element 24 may be configured to increase the temperature of the flow splitter 22 to or above a first temperature at which an increased amount of the first gas flow is directed around the flow splitter 22. For example, an increase of the temperature of the flow splitter 22 to or above the first temperature may result in an increase of the velocity of at least some of the atoms of the first gas flow 16, e.g. when at least a portion of the first gas flow 16 comes into contact with the flow splitter 22. An increase of the temperature of the flow splitter 22 to or above the first temperature may cause heat to be transferred to a portion of the first gas flow 16 that comes into contact with the flow splitter 22. The transfer of heat to the portion of the first gas flow 16 may cause the gas of the portion of the first gas flow to expand and/or a viscosity of the gas of the portion of the first gas flow to increase. In other words, the gas of the portion of the first gas flow that comes into contact with the flow splitter 22 may comprise an increased viscosity. The gas of the portion of the first gas flow 16 comprising the increased viscosity may act on another portion of the first gas flow, which is incident on the flow splitter 22 and/or cause the other portion of the first gas flow 16 to be directed around the flow splitter 22. In other words, due to the increased viscosity of the gas of the portion of the first gas flow 16, the effective dimension of the flow splitter 22 may be considered as being increased relative to the actual dimension of the flow splitter 22.

The first temperature may be equal to or larger than the melting temperature of the fuel used to create the plasma 7. In other words, the first temperature may be selected dependent on the fuel used to create the plasma 7. For example, when tin is used as a fuel, the heating element 24 may be configured to increase the temperature of the flow splitter to a temperature of about or larger than 230° C. (which largely corresponds to the melting temperature of tin). For temperatures below 200° C., any fuel, e.g. tin, deposited on the flow splitter 22 may be solid. The solid fuel may cause diffraction or block at least a portion of the radiation beam B directed towards the intermediate focus 6a.

The heating element 24 may be configured to maintain the temperature of the flow splitter 22 below a second temperature. At or above the second temperature diffusion of debris that may be present on the flow splitter occurs or increases. At the second temperature or above the second temperature, diffusion of debris that may be present on the flow splitter 22 may be increased. For example, the diffusion coefficient of tin vapor in a hydrogen atmosphere may increase with increasing temperature. By maintaining the temperature of the flow splitter 22 below the second temperature, diffusion of debris in the chamber 23 may be reduced. The amount of debris that may be present on the flow splitter 22 is considered to be small, for example, due to the flow splitter 22 being arranged in the chamber 23 to direct the first gas flow 16 around the flow splitter 22 and/or due to the use of flow rates larger than 7 slm of the first gas flow 16, as described above.

The heating element 24 may be embedded in the flow splitter 22. It will be appreciated that in other embodiments, the heating element may be provided separately. In such embodiments, the heating element may be arranged to increase the temperature of the flow splitter. The heating element 24 may be provided in the form of a resistive heating element. It will be appreciated that in other embodiments, the flow splitter 22 may be inductively heated and/or the heating element may be provided in the form of an electromagnetic element, e.g. a coil or the like. An electronic oscillator, e.g. a radio frequency generator, may be provided to generate electric currents in the electromagnetic element, which may result in heat being generated in the electromagnetic element.

Figure 4D:
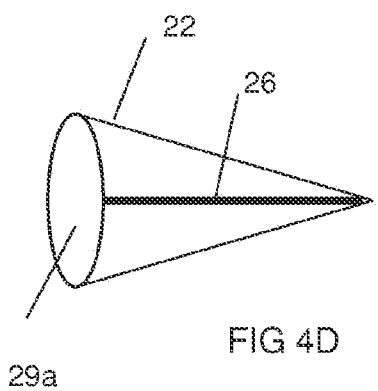
FIG. 4D depicts a further embodiment of the guiding device of FIG. 4A.

Referring to FIGS. 4A and 4D, in some embodiments, the flow splitter 22 may be configured for cooling by a coolant. The flow splitter 22 may be cooled, for example to reduce the thermal loads that may act on the flow splitter 22, e.g. due to the radiation at the intermediate focus region. The flow splitter 22 may be cooled to maintain a temperature of the flow splitter 22 below a melting temperature of the fuel used to create the plasma 7. This may prevent distribution/diffusion of liquid fuel that may be present on the flow splitter 22 onto the internal wall 21 or any other component of the radiation source SO. As described above, the amount of debris that may be present on the flow splitter 22 is considered to be small, for example, due to the flow splitter 22 being arranged in the chamber 23 to direct the first gas flow 16 around the flow splitter 22 and/or due to the use of flow rates larger than 7 slm of the first gas flow 16, as described above.

The coolant may be supplied by a coolant source 25. For example, the flow splitter 22 may comprise a channel 26 to receive the coolant from the coolant source 25 and/or to flow the coolant through the flow splitter 22. The flow splitter 22 may be configured for connection to the coolant source 25. The coolant source 25 may be configured to supply the flow splitter 22 with a coolant. For example, the coolant source 25 may be configured to supply the flow splitter 22 with a coolant to decrease a temperature of the flow splitter 22, e.g. below a melting temperature of the fuel used to create the plasma 7 and/or the second temperature, as described above. The coolant may be provided in the form of a coolant fluid, e.g. a coolant liquid or a coolant/cold gas etc. It will be appreciated that the flow splitter may be configured for being cooled by the coolant instead to or addition to comprising the heating element 24.

Figure 5:
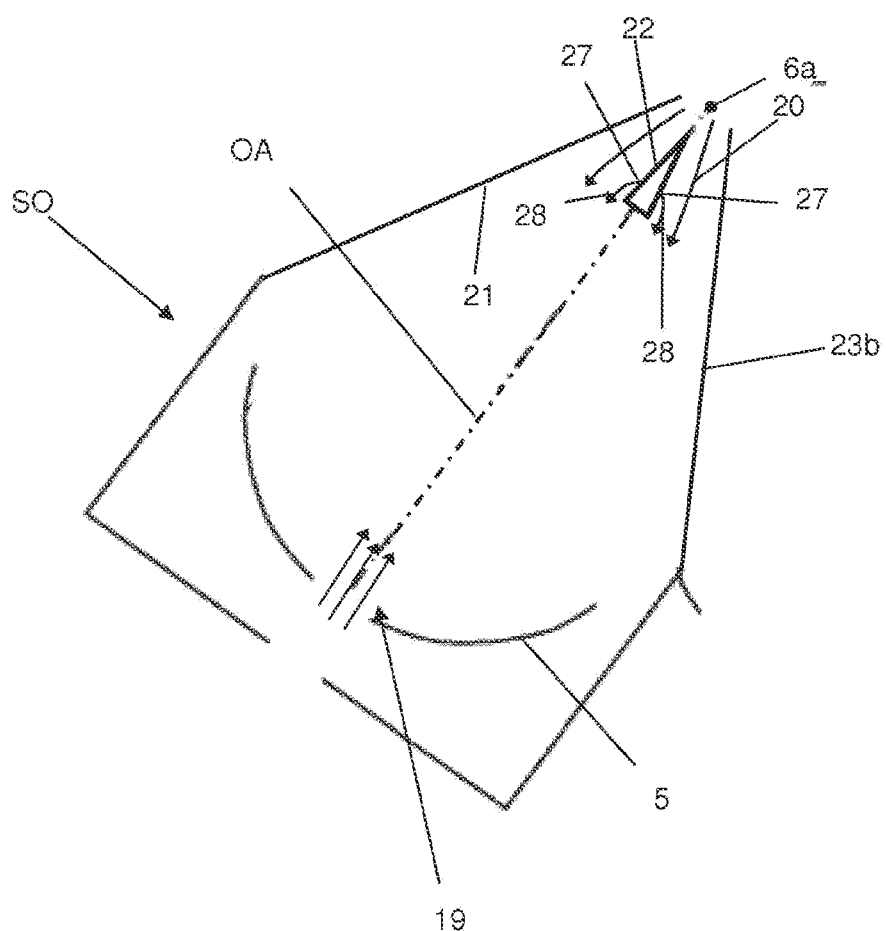
FIG. 5 depicts a portion of the radiation source of FIG. 2 including a further embodiment of the guiding device.

FIG. 5 schematically depicts a further embodiment of the radiation source SO. The radiation source SO depicted in FIG. 5 is similar to that depicted in FIG. 4A. The first and second gas supply systems 17, 20, the one or more openings 18, laser 1, laser beam 2 and the radiation beam B have been omitted from FIG. 5 for clarity purposes. However, it will be appreciated that the exemplary radiation source SO depicted in FIG. 5 may include any of the features of the radiation source SO described above in relation to FIGS. 1-4.

The exemplary flow splitter 22 of the radiation source SO depicted in FIG. 5 includes a plurality of further openings 27, which may be provided in the form of nozzles or slits. The plurality of further openings 27 (or each further opening of the plurality of further openings 27) may be configured to direct a third gas flow 28 towards the collector 5. The third gas flow may comprise a flow rate in the range of about 1 to 50 slm. The plurality of further openings 27 may be arranged on the flow splitter 22 such that the third gas flow 28 from the plurality of further openings 27 interacts with the first gas flow 16. The interaction between the first gas flow 16 and the third gas flow 28 may direct or push the first gas flow 16 into proximity with the internal wall 21 of the chamber 23, e.g. the conical portion 23a. The provision of the plurality of further openings 27 for directing the third gas flow 28 towards the collector 5 may lead to an increased spreading of the first gas flow 16. The increased spreading of the first gas flow 16 may result in a reduced or suppressed interaction between the first and second gas flows 16, 19.

The plurality of further openings 27 may be circumferentially, peripherally and/or axially arranged on the flow splitter 22. In other words, the plurality of further openings 27 may be arranged to extend around the flow splitter 22 and/or in a direction of the central or longitudinal axis A of the flow splitter 22. The plurality of further openings 27 may be symmetrically arranged on the flow splitter 22, for example to cause a symmetric flow of the first gas flow 16 and/or the third gas flow 28 around the flow splitter 22.

The exemplary first gas supply system 17 depicted in FIG. 2 may be configured to supply the third gas flow 28 to the flow splitter 22. For example, the flow splitter 22 may be connected or connectable to the first gas supply system 17 e.g. to enable supply of the third gas flow 28 to the flow splitter 22. It will be appreciated that in a further example, the debris mitigation system may comprise a further gas supply system, which may be configured to supply the third gas flow to the flow splitter. The flow splitter may be connected or connectable to the further gas supply system, e.g. to enable supply of the third gas flow to the flow splitter. Although the flow splitter 22 depicted in FIG. 5 comprises a plurality of further openings 27, it will be appreciated that in other embodiments the flow splitter may comprise a single further opening, which may be configured to direct the third gas flow towards the collector.

Figure 6:
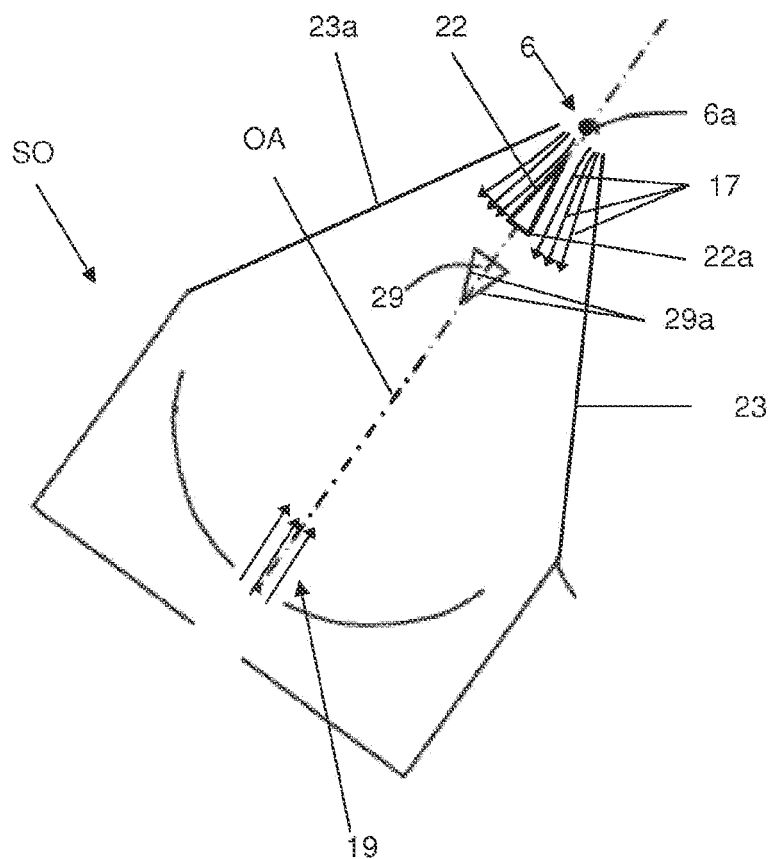
FIG. 6 depicts the portion of the radiation source of FIG. 4A including a debris receiving surface.

FIG. 6 schematically depicts a further embodiment of the radiation source SO. The radiation source SO depicted in FIG. 6 is similar to that depicted in FIG. 4A. The first and second gas supply systems 17, 20, the one or more openings 18, the laser 1, the laser beam 2 and the radiation beam B have been omitted from FIG. 4A for clarity purposes. However, it will be appreciated that the exemplary radiation source SO depicted in FIG. 6 may include any of the features of the radiation source described above in relation to FIGS. 1-5.

The exemplary radiation source SO depicted in FIG. 6 comprises a debris receiving surface 29a, which may be part of or provided by a bar or obscuration bar 29. The bar 29 may be arranged in the chamber 23, e.g. the conical portion 23a, to prevent debris from reaching the intermediate focus region 6. The bar 29 may be arranged to intersect or extend across the optical axis OA of the collector 5. In this arrangement, the bar 29 can be considered to obscure the direct line of sight of debris, which may include ballistic particulate debris, and/or of a portion of the laser beam 2, e.g. the portion of the laser beam 2 that passes through the plasma formation region 4. In other words, the bar 29 may be configured to reflect the portion of the laser beam 2 away from the intermediate focus region 6 of the radiation source SO.

In the exemplary radiation source depicted in FIG. 6, the flow splitter 22 is arranged between the bar 29 and the intermediate focus region 6. In this arrangement, the bar 29 is arranged to extend over or overlap with at least a portion or all of the flow splitter 22. For example, the bar 29 may be arranged to extend over or overlap with the enlarged portion of the first end 22a of the flow splitter 22 so that debris generated by the plasma 7 is incident on the debris receiving surface 29a of the bar 29. In other words, flow splitter 22 may be arranged in the shadow of the bar 29.

Although in the exemplary radiation source SO depicted in FIG. 6, the debris receiving surface 29a was described as being part of the bar 29, it will be appreciated that in other embodiments of the radiation source, such as for example any of those described in relation to FIGS. 4A, 4B, 4C and 5, the debris receiving surface 29a may be provided by or be part of the flow splitter 22. In such embodiments, the flow splitter 22 may comprise any of the features of the bar 29, described herein. Additionally, the flow splitter 22 may be configured such that the flow splitter 22 is able to withstand the heat or heat/thermal load created by the plasma 7 or that of the radiation at the intermediate focus region 6. The flow splitter 22 may be configured to reflect the portion of the laser beam 2 that passes through the plasma formation region 4, away from the intermediate focus region 6. For example, when the debris receiving surface 29a is provided by the flow splitter 22, the extension or dimension of the flow splitter 22, e.g. in a direction perpendicular and/or parallel to the central or longitudinal axis A, of the flow splitter 22, may be increased relative to the extension or dimension, e.g. in a direction perpendicular and/or parallel to the central or longitudinal axis A, of a flow splitter 22 that is used in combination with the bar 29.

Figure 7A:
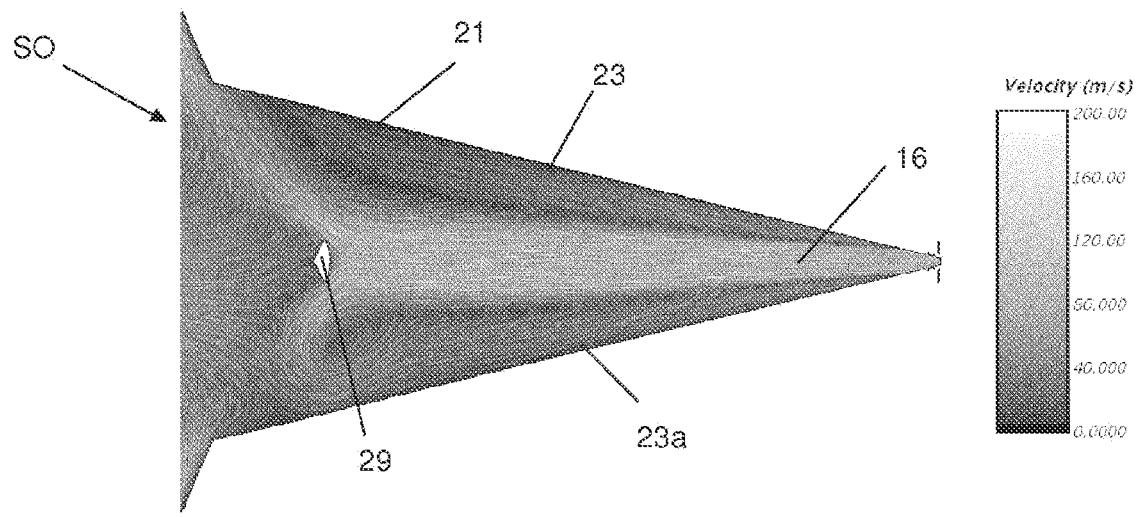
FIG. 7A depicts a simulation of a first gas flow in a portion of the radiation source of FIG. 2 including the debris receiving surface of FIG. 6.

FIG. 7A depicts a simulation of the first gas flow 16 in a radiation source SO with no flow splitter present. The radiation source SO depicted in FIG. 7A comprises the bar or obscuration bar 29 described above in relation to FIG. 6, which is arranged in the chamber 23, e.g. the conical portion 23a. The first gas flow 16 may be considered to be substantially laminar in the radiation source SO. However, it can be seen in FIG. 7A that some of the first gas flow 16 recirculates. The recirculation of some of the first gas flow 16 may be, for example, due to a jet being formed from some of the gas of the first gas flow 16, which may interact with adjacent gas, e.g. to pull the adjacent gas along with the same velocity or speed. Fresh gas of the first gas flow 16 may flow with a lower velocity or speed along the internal wall 21 to prevent gas depletion or the formation of an under pressure. The recirculation of some of the first gas flow 16 may result in debris being deposited on the internal wall 21 of the radiation source SO, e.g. the chamber 23.

Figure 7B:
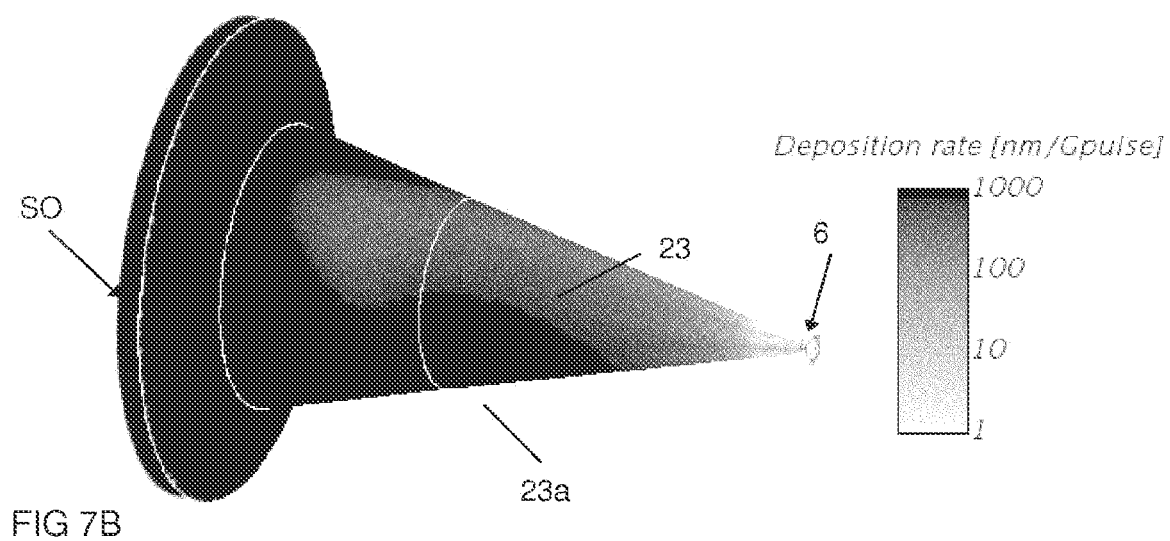
FIG. 7B depicts a simulation of debris deposition in the portion of the radiation source of FIG. 7A.

FIG. 7B depicts a simulation of surface deposition of debris, e.g. atomic tin debris, in a radiation source with no flow splitter present. It can be seen that debris is distributed in the chamber 23, e.g. the conical portion 23a, and extends in a direction towards the intermediate focus region 6.

Figure 8A:
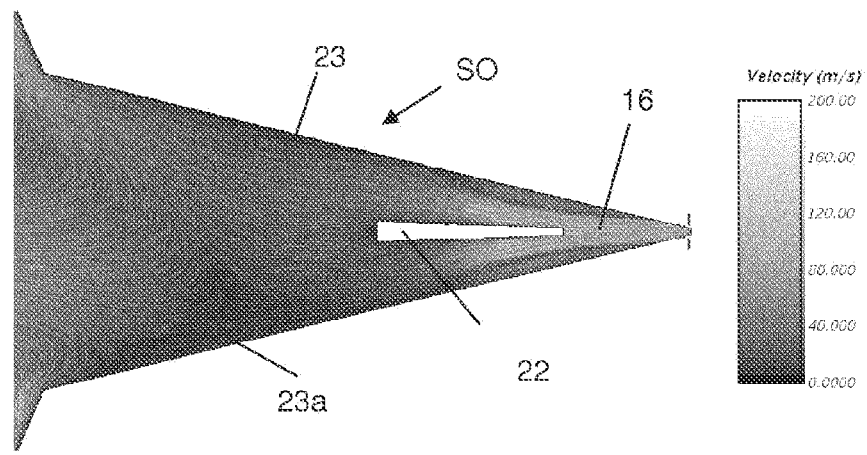
FIG. 8A depicts a simulation of a first gas flow in a portion of the radiation source of FIG. 2 including the guiding device of FIG. 4A.
Figure 8B:
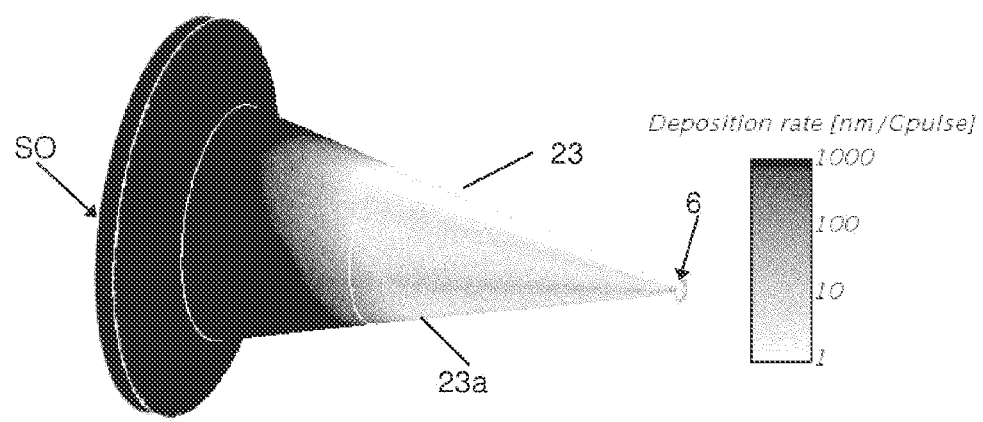
FIG. 8B depicts a simulation of debris deposition in the portion of the radiation source of FIG. 8A.

FIG. 8A depicts a simulation of the first gas flow 16 in a radiation source SO comprising the flow splitter 22 described above. It can be seen from FIG. 8B that by arranging the flow splitter 22 in the chamber 23, e.g. the conical portion 23a, recirculation of the first gas flow 16 is reduced. This results in a reduced debris deposition in the chamber 23, e.g. the conical portion 23a, as depicted in FIG. 8B, which depicts a simulation of surface deposition of debris, e.g. atomic tin debris, in a radiation source comprising the flow splitter 22. In other words, by arranging the flow splitter 22 in the chamber 23, e.g. the conical portion 23a, the extension of debris towards the intermediate focus region 6 is reduced.

The first, second and/or third gas flow may comprise hydrogen gas. It will be appreciated that in other embodiments another gas or a mixture of gases may be used. For example, in other embodiments, the first, second and/or third gas flow may comprise argon or helium gas.

The material of the flow splitter 22 may be selected to be corrosion resistant, e.g. to be resistant against corrosion by the fuel in the environment in the radiation source SO, e.g. the hydrogen environment in the radiation source SO. The material of the flow splitter 22 may be selected to be resistant to the thermal loads acting on the flow splitter, e.g. due to the radiation in the radiation source SO and/or the plasma 7, and/or the increase of the temperature of the flow splitter 22 to or above the first temperature, as described above. The exemplary flow splitter 22 may comprise or be made of a metal or metal alloy. For example, the material of flow splitter may be or comprise molybdenum, tungsten, aluminum, stainless steel, copper or an alloy thereof. The flow splitter 22 may comprise a metal or metal alloy surface. The metal or metal alloy surface of the flow splitter may lead to an improved recombination of hydrogen radials, which may be present in the radiation source SO. For example, hydrogen (H 2) molecules may split into hydrogen radicals due to their absorption of heat and/or radiation or ion collisions. The hydrogen radicals may be beneficial for removing debris, e.g. tin, from the internal wall 21 of the radiation source. The presence of hydrogen radicals may cause contamination in the chamber 23, such as spitting of fuel, for example, when the hydrogen radicals diffuse into layers of fuel in the chamber 23 that are liquid. By providing the flow splitter with a metal or metal alloy surface, the recombination of hydrogen radicals may be improved and/or the contamination, e.g. spitting of fuel, in the chamber 23 reduced. It will be appreciated that in other embodiments the flow splitter may comprise another material, such as for example a ceramic material. The ceramic material may comprise a silicon dioxide, zirconium nitride, or zirconium oxide material.

As described above, a debris mitigation system is configured to direct a first gas flow from the intermediate focus region towards the plasma formation region. For example, the debris mitigation system may include a first gas supply system. The first gas supply system may be configured to supply the first gas flow towards the plasma formation region. The first gas supply system may include one or more openings, e.g. one or more nozzles or slits, which are provided at the intermediate focus region, e.g. at or near the intermediate focus. The one or more openings may be arranged such that the first gas flows towards the collector. For example, the one or more openings may be arranged to direct the first gas flow in a direction opposite (e.g. substantially opposite) to a propagation direction of the EUV radiation beam. The first gas flow may have a flow rate that is sufficient to reduce or prevent debris from travelling towards the intermediate focus point 127a. The first gas supply system may be considered to be or comprised in a dynamic gas lock (DGL) system.

Figure 22C:
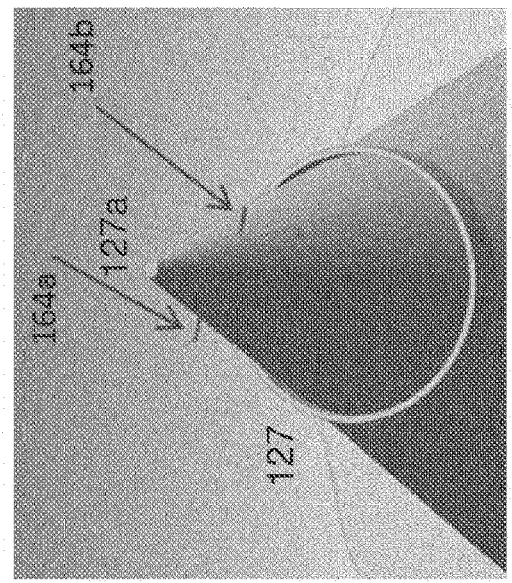
FIG. 22C is a simplified schematic view of an embodiment of an EUV vessel having two side jet flow inlets (nozzles) that introduce gas into the EUV vessel.
Figure 22B:
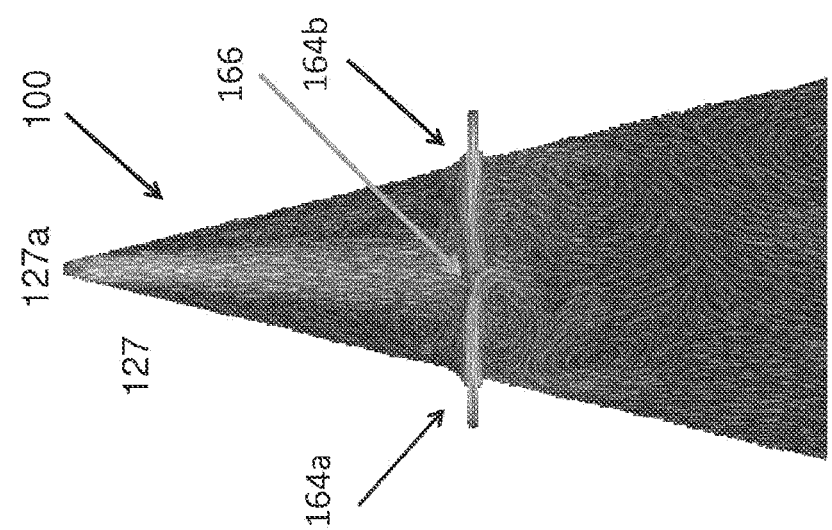
FIG. 22B depicts a simulation of a dynamic gas flow (DGL flow) and two side jet flows in the EUV vessel.
Figure 22A:
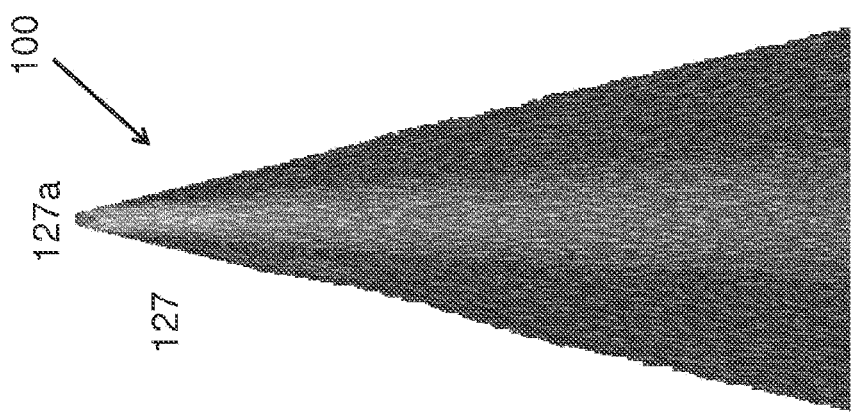
FIG. 22A depicts a simulation of a dynamic gas flow (DGL flow) in the EUV vessel.

As shown in FIG. 22A, to protect at least part of the EUV lithographic apparatus from fuel contamination from the EUV source, a first gas flow is introduced at the intermediate focus (IF) region 127 to push debris particles created at plasma formation back into the source vessel (the first gas flow depicted in FIG. 22A is similar to the first gas flow 16 in FIG. 7A). The first gas flow, herein referred to as a dynamic gas flow or dynamic gas lock (DGL) flow, can be created by one or more converging gas inlets. High velocity gas jets may be provided for example from two arrays of several gas inlets which converge towards the optical axis of the EUV collector (as shown for example in FIGS. 9 and 10), forming a single high speed first gas flow in the EUV vessel 100. The high speed first gas flow creates a drag force to drag the debris particles away from the IF region 127 and at the same time provides a Peclet type protection of at least part of the lithographic apparatus against fuel vapor and/or derivatives of the fuel (e.g., tin hydride). Experimental results show however that with a dynamic gas flow (e.g. first gas flow) having a gas flow rate of less than 10 slm, the amount of debris particles passing through the IF point 127a may be an order of magnitude higher than the desired cleanliness specification for an EUV source.

To solve this problem, a higher speed first gas flow could be used to protect at least part of the lithographic apparatus from fuel contamination. However, at higher speed of the first gas flow, the collector contamination and fuel droplet stability (when emitted by the fuel generator) may get worse. It is assumed that the high speed, narrow dynamic gas flow may interact with a collector cone flow provided from an opposite direction and thereby still reach the collector, causing fuel droplet instability and/or additional collector contamination. The high speed first gas flow may introduce recirculation and also bring the debris particles closer to the IF region 127 such that they can pass into the lithographic apparatus through the intermediate focus point 127a, thereby at least partially contradicting the debris mitigation function of the dynamic (first) gas flow. The gas recirculation may occur especially in the vessel top, thereby acting as a "transport belt" for debris towards the IF region 127.

In an embodiment it is proposed to use a second gas supply system arranged to provide a second gas flow which confines the first gas flow recirculation to the top of the EUV vessel 100 in the intermediate focus region 127. The second gas supply system comprises one or more openings arranged to direct the second gas flow preferably in a direction substantially perpendicular to the propagation direction of the first gas flow (i.e. substantially perpendicular to the optical axis of the EUV collector). In an embodiment shown in FIG. 22B, a pair of inlets 164a, 164b to provide two counter gas flow jets (i.e. a second gas flow) are arranged in the proximity of the intermediate focus region 127, downstream of the first gas flow. Preferably the second gas flow is supplied with a gas flow rate of at least 2 slm per inlet (i.e. at least 4 slm per pair), even more preferably at least 5 slm per jet. The second gas flow may have substantially similar or even higher speed than the first gas flow.

The squeeze jets work best with a straight DGL flow (i.e. aligned with the optical axis of the EUV vessel). The gas jet inlets 164a, 164b may be aligned to provide a centered flow (as shown in FIG. 22B). The gas jet inlets may also be slightly offset. An offset between the squeeze jets may improve robustness towards tilt (as it creates a larger interaction region at the interception of the gas flows), as long as the DGL flow still remains substantially straight. Alternatively, the gas jet inlets 164a, 164b are arranged to provide a tilted second gas flow which forms an angle with the direction of the first gas flow (not represented).

The pair of counter gas jet inlets 164a, 164b may be arranged in the IF region 127 close to the first gas inlet at the IF point 127a for better performance (as shown in FIG. 22C), provided there is no mechanical design constraint. A function of the pair of counter gas jets 164a, 164b is to squeeze and diffuse the dynamic gas flow by means of momentum exchange. A similar principle is used in liquid atomizers, where two high velocity side gas jets break a liquid stream into micro droplets. The side gas jets 164a, 164b slow down and diffuse the narrow but high velocity dynamic gas flow jet. The large scale recirculation close to a vessel wall is thereby eliminated or reduced, and instead a substantially unidirectional gas flow field is established towards the exhaust, thereby helping to protect the EUV vessel 100 from fuel contamination.

The squeeze jet inlets 164a, 164b are arranged such that the gas jet flows are substantially orthogonal to the main direction of the dynamic gas flow, whereas the dynamic gas flow nozzles are arranged substantially aligned with the resulting dynamic gas flow jet. The velocity of the squeeze jets may be tuned such that is substantially similar to the velocity of the dynamic gas flow jet near their interception point 166. Without being bound to a theory, it is expected that the momentum of the squeeze jets preferably is substantially comparable in value to the momentum of the dynamic gas flow jet at their interception point 166. The inlets and nozzles size, shape (round, racetrack, square, etc.) and the spacing of the squeeze jet inlets 164a, 164b to the IF point 127a may be varied to enhance the debris mitigation of the EUV vessel 100.

One or more benefits of introducing side jets are: it allows a high DGL flow for protection of at least part of a lithographic apparatus protection; it may reduce or even eliminate recirculation from exhaust to lower cone; it may provide a positive Peclet protection in the IF cone; and it can significantly reduce the dynamic gas flow speed to eliminate the negative impact on collector and fuel droplets stability without sacrificing the function of dynamic gas flow.

Although FIGS. 22B and 22C depict a pair of squeeze jets, it is also possible to use a single squeeze jet or multiple squeeze jets (i.e. 2 or more squeeze jets). Simulations show that two squeeze jets or multiple pairs of gas flow squeeze jets provide advantageous results; however, depending on the specific conditions of the total gas flow in the EUV vessel also asymmetric second gas flow arrangements may be useful. In an asymmetric flow design, the momentum of the squeeze jets is still substantially similar in value to the momentum of the dynamic gas flow at their interception point.

Figure 18A:
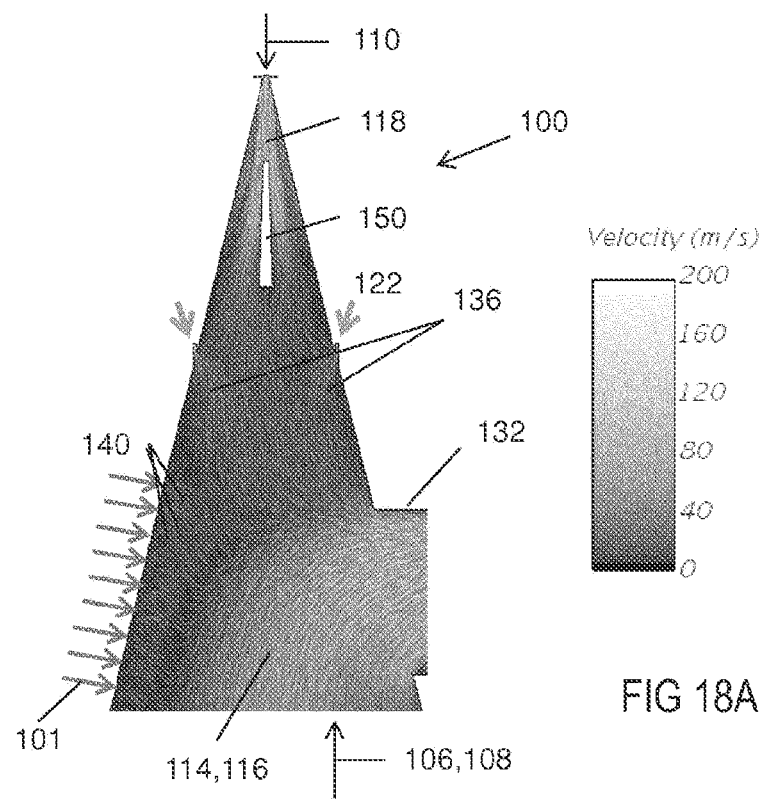
FIG. 18A show simulated gas flow paths in the EUV vessel of FIG. 17.

According to an aspect of the invention, combinations of the above embodiment with other gas flow supplies are also possible. For example, the EUV vessel may also comprise (i.e. in addition to the first and second gas flows) a third gas flow in the form of a showerhead disposed along at least a portion of the inner vessel wall. The showerhead includes a single or a plurality of nozzles configured to introduce gas into the vessel. The showerhead has at least one inlet configured to supply the gas into the showerhead. One or more exhausts may be configured to remove gas introduced into the vessel, the one or more exhausts being oriented along at least a portion of the inner vessel wall so that the gas is caused to flow away from the EUV collector. At least one exhaust may be disposed along the inner vessel wall at an azimuthally asymmetric position and configured to exhaust gas from the vessel. The squeeze jets or a guiding device can also work well together with a curtain flow (for example with a curtain flow 122 as depicted in FIG. 18A). Combining a DGL flow with a second gas flow (squeeze jets), a curtain flow and a showerhead flow in the lower part of the EUV vessel is also possible. Another embodiment is a curtain flow substantially perpendicular to the first gas flow which is provided by the guiding device (as depicted for example in FIG. 20). It is possible to use this in combination with the squeeze jets or stand-alone (no jets).

Furthermore, a guiding device may be added in the EUV chamber such that the first gas flow is directed around the guiding device. The guiding device may be introduced in the path of the first gas flow before or after the interception point with the second gas flow.

A radiation source for use in a lithographic system may be provided in the form of a laser produced plasma (LPP) source (or simply, "source") The radiation source generates extreme ultraviolet radiation (EUV) radiation by producing a plasma from a fuel such as tin (Sn) in a plasma vessel. The radiation source may comprise a EUV vessel. In some cases, tin plasma is produced by illuminating droplets of liquid fuel with a high energy laser radiation. Although tin is referred to in the following description, any suitable fuel may be used. EUV photons emitted from the plasma are collected by a near normal incidence radiation collector (sometimes referred to more generally as a normal incidence radiation collector), which may be provided in the form of a EUV collector, within the vessel and transmitted to an intermediate focus point where they enter at least part of a lithographic apparatus. In many cases, tin debris will be generated and remain inside the vessel as a result of illuminating tin matter with laser radiation.

Tin debris may include any tin matter or tin product that remains in the vessel after having been illuminated or intended to be illuminated by laser radiation. Tin debris can include, for example, ionic tin, tin vapor, tin microparticles, tin products ($SnH_4$ gas), or tin deposition. In many cases, tin debris becomes deposited on inner vessel walls of the EUV vessel as well as on the EUV collector. Once deposited, tin debris can spit, drip, and drop onto other surfaces within the vessel. As a result, tin debris can accumulate to an extent that it reduces the EUV collector's reflectivity or otherwise blocks EUV optical paths. This ultimately leads to reduced collector lifetime and source availability.

In some cases, certain surfaces (e.g., vessel walls, vanes, and scrubbers) are kept cold during operation of the source. This may eliminate a portion of tin dripping and spitting by keeping the tin debris in a solid state. However, in certain circumstances, tin may still accumulate to an extent that it drops due to gravitational forces and gas pressure on the EUV collector while the EUV vessel is operational. Further, Sn accumulation on these cold surfaces may lead to EUV path blockage as well as disturbances to gas flows for source operation.

In other cases, certain surfaces are kept at a temperature above a melting point of Sn. While this may reduce Sn accumulation and EUV path blockage as a result of maintaining tin debris in a liquid state, liquid state tin is prone to spitting and dripping as mentioned previously.

Certain sources address Sn debris and deposition on vessel surfaces by providing gas supplies at locations within the vessel to flush tin debris out of the vessel. One of these is a center supply that introduces gas into the vessel near a center of the EUV collector. In addition, certain sources may have a perimeter supply that introduces gas into the vessel at locations proximate to a perimeter of the EUV collector. The center supply and the perimeter supply provide gas flow paths that help protect the EUV collector from Sn debris to some extent by providing barriers to diffusion against Sn debris, as well as energetically favourable flow directions away from the EUV collector.

While embodiments that have a center supply and a perimeter supply enable a level of protection of the EUV collector, Sn debris may still accumulate on the inner vessel walls to an extent that it blocks EUV optical paths. Additionally, if Sn debris accumulates on a region of the inner vessel wall that is gravitationally above the EUV collector, the Sn debris may drop down onto the EUV collector. As a result, it would be beneficial to have gas sources for introducing gas into the vessel in addition to the center supply and the perimeter supply to allow for protection of one or more inner vessel walls.

In certain embodiments, an EUV vessel may include a vessel wall supply to introduce gas into the vessel. According to some embodiments, the vessel wall supply may include a showerhead disposed along at least a portion of the inner vessel wall, the showerhead having a plurality of nozzles to introduce gas into the vessel. According to these embodiments, the showerhead may be of a similar shape as the inner vessel wall. Thus, if, for example, the inner vessel wall has a conical shape, the showerhead may be of a conical shape as well. Likewise, if the inner vessel happens to have a cylindrical, rectangular, or other polyhedral shape, the showerhead that is included with the EUV vessel may similarly have a cylindrical, rectangular, or other polyhedral shape, respectively. According to further embodiments, the showerhead may have a shape that is different from the inner vessel wall. In some embodiments, gas that is supplied into the vessel via the vessel wall supply, the perimeter supply, or the center supply may include hydrogen gas.

Figure 9A:
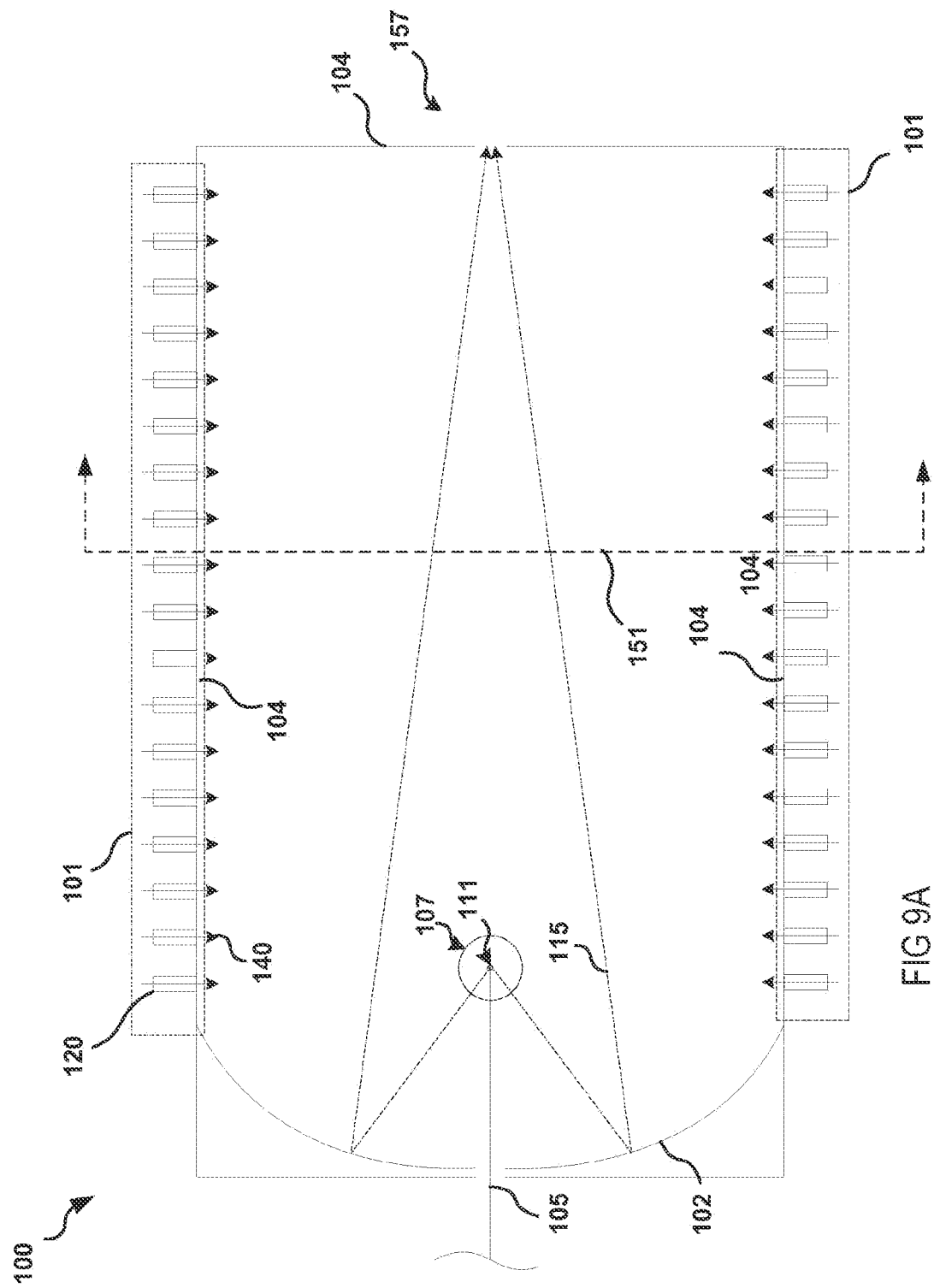
FIG. 9A is a simplified schematic view of an embodiment of an EUV vessel having a showerhead that is disposed along at least a portion of an inner vessel wall of the EUV vessel.

FIG. 9A is a simplified schematic view of an embodiment of an EUV vessel 100 having a showerhead 101 that is disposed along at least a portion of an inner vessel wall 104 of the EUV vessel 100. According to the embodiment, a laser radiation pulse 105 is shown to illuminate a target material 111 within a material target region (not shown). Plasma 107 is shown to result, which, for example, may produce EUV radiation 115. The EUV radiation 115 is shown to be reflected by an EUV collector 102 toward an intermediate focus (IF) region 157.

According to the embodiment of FIG. 9A, the showerhead 101 is shown to include a plurality of nozzles 120 that are disposed along at least a portion of the inner vessel wall 104. Each of the plurality of nozzles 120 are shown to enable a flow 140 of gas into the vessel in a direction that is away from the inner vessel wall 104 along which they are disposed. Although not shown, it is to be understood that nozzles 120 may also be included on the right-most portion of the inner vessel wall 104. That is, the showerhead 101 may extend along the right side of the inner vessel wall 104, including the portions of the inner vessel wall 104 that are proximate to the IF region 157.

FIG. 9A shows that the inner vessel wall 104 can be defined by a rectangular cross-section 151. The inner vessel wall 104 may have other cross-sectional shapes, which can be, for example, circular, ellipsoidal, a non-rectangular polygonal cross section, or different cross-sectional shapes at different distances along a length of the inner vessel wall 104. It is to be understood that any number of inner vessel wall 104 shapes may be implemented without departing from the scope and spirit of the embodiments described herein. Thus, by way of example, various non-limiting examples of conical shaped inner vessel walls 104 will be described below.

Figure 9B:
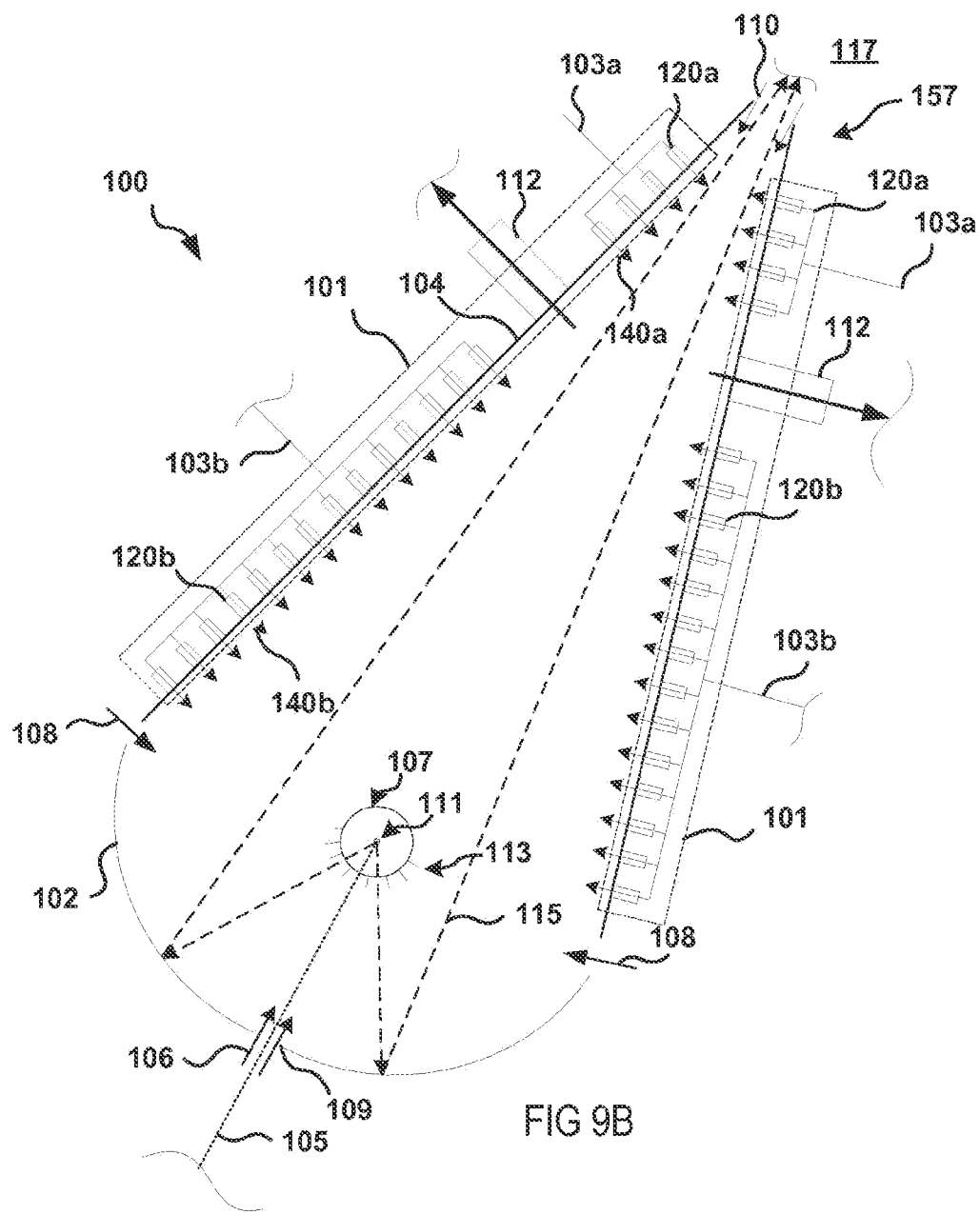
FIG. 9B is a simplified schematic view of an embodiment of an EUV vessel having a showerhead that introduces gas into the vessel via a first plurality of nozzles and a second plurality of nozzles.

FIG. 9B is a simplified schematic view of an embodiment of an EUV vessel 100 (or simply 'vessel') having a showerhead 101 that introduces gas into the vessel 100 via a first and second plurality of nozzles 120a and 120b. In the embodiment shown, the EUV vessel 100 is shown to include an inner vessel wall 104 having a conical shape. The showerhead 101 is shown to take on a similar shape as a result of being disposed along at least a portion of the inner vessel wall 104. The EUV vessel 100 is further shown to be able to receive a laser radiation pulse 105 that enters the vessel via a center region 109. The laser radiation pulse 105 is shown to become incident on a target material 111 within a target material region (not shown). Plasma 107 is shown to result, which gives off plasma emission 113. Some of the plasma emission, which includes EUV radiation 115, is shown to reflect off of the EUV collector 102, travel through the vessel 100, and enter at least part of a lithographic apparatus 117.

Also shown in FIG. 9B are a center supply 106 and a perimeter supply 108, both of which introduce gas into the vessel 100 at locations proximate to the EUV collector 102. Both of the center supply 106 and the perimeter supply 108 may each include a plurality of gas inlets to introduce gas into the vessel 100. The center supply 106 and the perimeter supply 108 introduce gas in a way that lowers Sn debris contact instances with the EUV collector 102. For example, the center supply 106 and perimeter supply 108 provide diffusion barriers against Sn vapor or microparticles and energetically favorable flow paths that are in a direction away from the EUV collector 102 for the same. As a result, the EUV collector 102 is provided with some degree of protection from Sn debris.

FIG. 9B also shows a showerhead 101 that introduces gas into the vessel 100 away from an inner vessel wall 104. In the embodiment shown, the showerhead 101 includes a first supply 103a and a second supply 103b. The first supply 103a is shown to supply a first plurality of nozzles 120a that introduces gas into the vessel 100 as a first plurality of flows 140a. The second supply 103b is shown to supply a second plurality of nozzles 120b that introduces gas into the vessel 100 as a second plurality of flows 140b. The first supply 103a and the second supply 103b of the showerhead 101 are shown to be able to separately control the supply of gas to the first plurality of nozzles 120a and the second plurality of nozzles 120b, respectively. Additionally, the second plurality of nozzles 120b is shown to be more proximal to the EUV collector 102, whereas the first plurality of nozzles 120a is shown to be more proximal to an IF region 157 of the vessel that is proximate to the at least part of the lithographic apparatus 117.

In certain embodiments, the first plurality of nozzles 120a and the second plurality of nozzles 120b may be separately supplied with separately controlled gas delivery systems (not shown). In these embodiments, having separately controlled gas delivery systems for the first plurality of nozzles 120a and the second plurality of nozzles 120b may enable control over flow geometries or flow paths that occur within the vessel 100 that result from introducing gas in the vessel 100 via the showerhead 101. More on controlling flow geometries within the vessel 100 will be discussed herein. In certain embodiments, the first plurality of nozzles 120a and the second plurality of nozzles 120b may be considered individual zones for introducing gas into the vessel 100.

The first plurality of flows 140a and the second plurality of flows 140b are shown to be in a direction that is away from the inner vessel wall 104. As a result of the directionality of the first and second plurality of flows 140a and 140b, flow geometries may be produced within the vessel 100 that prevent deposit of Sn debris onto surfaces of inner vessel wall 104. For example, gas that is introduced via the first and second plurality of nozzles 120a and 120b may provide a diffusion barrier that may suppress Sn vapor flux, $SnH_4$ flux, and other Sn debris flux onto the inner vessel wall 104.

In certain embodiments, there may be a hydrogen radical flux onto the inner vessel wall 104. Generally speaking, hydrogen radicals may be present within the vessel 100 as a result of the plasma 107, as well as EUV radiation 115 absorption by hydrogen gas. Hydrogen radicals may be beneficial in certain circumstances involving 'cold' walls (portions of the inner vessel wall 104 that are conditioned to be below a melting point of Sn), for example, in which they may remove solid Sn deposits from the inner vessel wall 104 by forming $SnH_4$ gas. Under these circumstances and according to certain embodiments, hydrogen radicals may be additionally supplied to help a removal of solid Sn deposits from the inner vessel wall 104, for example, by supplying hydrogen radicals through the showerhead 101, the center supply 106, the perimeter supply 108, or the dynamic gas lock (DGL) supply 110. In other embodiments involving warm regions of the inner vessel wall 104 that may include liquid Sn, hydrogen radical flux onto the warm regions may be reduced.

In the various embodiments, the inner vessel wall 104 may be defined by a separate wall interface which enables the first and second plurality of nozzles 120a and 120b to direct gas flows into the EUV vessel 100. In these configurations, the showerhead 101 is primarily behind the inner vessel wall 104. In other embodiments, the showerhead 101 itself has an inner surface that will define the inner vessel wall 104. In certain other embodiments, each nozzle of the first and second plurality of nozzles 120a and 120b may be provided with an individual gas line for introducing gas into the vessel 100. In still other embodiments, the showerhead 101 may be integrated into the inner vessel wall 104 such that lines that supply each of the nozzles of the first and second plurality of nozzles 120a and 120b are hogged out from a first piece that is then mated with a second piece, the first or second piece defining the inner vessel wall 104.

Although the first and second plurality of flows 140a and 140b are shown to introduce gas in a direction that is orthogonal to the inner vessel wall 104, it should be appreciated that there are many ways in which to introduce gas into the vessel 100 that may not be orthogonal to the inner vessel wall 104 but which still fall within the spirit and scope of the embodiments. Moreover, while each of the first and second plurality of nozzles 120a and 120b are shown to have a similar directionality, there may any number of variations to the individual directionalities of individual nozzles that may be implemented without departing from the substance and scope of the embodiments described. For example, certain embodiments may implement the plurality of nozzles at similar directions or angles relative to inner vessel wall 104, while other embodiments may implement nozzles having angles that are different from one another relative to the inner vessel wall 104 to suit the needs of different embodiments of EUV sources or EUV vessels.

It is also to be understood that the showerhead 101 in FIG. 9B extends along a perimeter (e.g., a circumference) of the of the inner vessel wall 104 such that the first and second plurality of nozzles 120a and 120b may be configured to introduce gas into the vessel 100 along the entire perimeter of the inner vessel wall 104. In other embodiments, the showerhead 101 may not necessarily extend the entire perimeter of the inner vessel wall 104, or may do so but only for a certain length along the inner vessel wall 104, laterally. In other words, embodiments may have any one of a number of patterns for distributing the first and second plurality of nozzles 120a and 120b along the inner vessel wall 104 of the vessel 100 to suit the needs of different embodiments. For example, in certain embodiments, a first or second plurality of nozzles 120a or 120b may be located in a region that is gravitationally above the EUV collector 102 to prevent Sn debris from depositing on the vessel wall in the region and subsequently dropping down onto the EUV collector 102 while the EUV source is operational.

While inner vessel wall 104 is shown to include smooth surfaces, it should be understood that inner vessel wall 104 may include vaned surfaces (e.g., surface with vanes or surfaces defined by vanes). For example, in certain embodiments having one or more inner vessel walls 104 that include vanes, gas may be introduced via the back of the vanes and released into the vessel 100 through openings in a plasma-facing surface of the vanes. Thus, appropriate channels (not shown) inside the vanes may be used to deliver gas to nozzles that are integrated into the vanes in a pattern desired. As a result, the showerhead 101 may be integrated into vane surfaces of vessel 100 to achieve flow geometries of gas that reduce contamination of the one or more inner vessel walls 104. In other embodiments having one or more inner vessel walls 104 that include vanes, gas may be introduced from valleys between adjacent vanes.

Also shown in FIG. 9B is symmetric exhaust 112, which exhausts gas out of the vessel 100. The symmetric exhaust 112 may be arranged symmetrically around a perimeter of the inner vessel wall or asymmetrically. In one embodiment, the symmetric exhaust 112 may include a single exhaust that extends around a full perimeter of the inner vessel wall 104. In a further embodiment, the symmetric exhaust 112 may include a number of individual exhaust lines that are arranged symmetrically around the inner vessel wall 104. Additionally shown in FIG. 9B is dynamic gas lock (DGL) supply 110 that introduces gas into the vessel from a location that is proximate to the IF region 157.

FIG. 9C is a simplified schematic view of an embodiment for an EUV vessel 100 having a showerhead 101 with a plurality of nozzles 120 that are supplied by a gas supply 103. The gas supply 103 may be controlled by a common gas delivery system (not shown). In the embodiment show, the plurality of nozzles 120 are shown to enable a plurality of gas flows 140, which introduce gas into the vessel 100 in a direction that is away from the inner vessel wall 104. Also shown in FIG. 9C is a laser radiation pulse 105 that enters a material target region 123, as well as a center supply 106, a perimeter supply 108, and a DGL supply 110.

In a further embodiment shown in FIG. 9D, the showerhead 101 is shown to include a number of separately supplied pluralities of nozzles 120a-120n. The first plurality of nozzles 120a is shown to be supplied by a first supply 103a and is shown to introduce gas into the vessel 100 as a first plurality of gas flows 140a. The first plurality of nozzles 120 is understood to extend along a perimeter of the inner vessel wall 104, according to some embodiments.

The second plurality of nozzles 120b and the third plurality of nozzles 120c are shown to be configured to be along a similar lateral distance on the inner vessel wall 104 relative to the IF region 157. However, the second and third pluralities of nozzles 120b and 120c are shown to have different perimeter and/or azimuthal positions along the inner vessel wall 104. Furthermore, the second plurality of nozzles 120b is shown to be supplied by a second supply 103b, whereas the third plurality of nozzles 120c is shown to be supplied by a third supply 103c. As a result, the second and third plurality of nozzles 120b and 120c may enable control over flow geometries of gas within the vessel 100.

According to some embodiments, each of the pluralities of nozzles 120a-120n may be supplied by separately controlled gas delivery systems (not shown). As a result, precise control over flow geometries within the vessel 100 may be obtained via individual control over the pluralities of nozzles 120a-120n. The second, third, and nth plurality of nozzles, 120b, 120c, and 120n, are shown to enable a second, third and nth plurality of flows, 140b, 140c, and 140n, respectively. Each of the flows 140a-140n are shown to be generally in a direction that is away from the inner vessel 140 through which the flows 140a-140n are introduced through.

By way of example and limitation, a flow of gas in the range of 50-500 slm may be used for delivery to the supply 103 to enable protection of inner vessel wall 104. In embodiments having more than one supply, for example the embodiment shown in FIG. 9D, a flow of the range may be distributed among the supplies 103a-103n. In one embodiment, the supply 103 may be supplied with about 200 slm of gas. Of course, other ranges of mass flow rates for introducing gas into the vessel 100 may be used to fit the needs of various embodiments, and the example given is not meant to be limiting.

As previously discussed, protection of inner vessel wall 104 or other exposed surfaces of the showerhead 101 involves providing flow geometries of gas within the vessel to suppress Sn vapor flux, $SnH_4$ vapor flux, and other Sn debris flux onto the one or more inner vessel walls 104. As an example, as a result of the flow geometries produced by each of the center supply 106, the perimeter supply 108, and the showerhead 101, there may be a several hundred-fold reduction of Sn Vapor and $SnH_4$ debris onto the inner vessel walls 104, according to some embodiments. In other embodiments, for example, further reduction of Sn debris flux may be achieved by using asymmetric vanes/liner structure that will not have pumping in the area above the EUV collector 102.

According to some embodiments, a range of 10-1,000 nozzles of about 1-10 mm in diameter may be used. Depending on the number and sizing of nozzles, each of the nozzles may be spaced approximately 1-10 cm apart, according to certain embodiments. A gas supply (not shown) and showerhead body or manifold or plurality of gas lines (not shown) that provide uniform and stable mass flux through the plurality of nozzles may be used with the embodiments described. Of course, embodiments with more or less nozzles of differing cross-sectional widths (e.g., diameters) and spacing may be used without departing from the scope and spirit of the disclosure.

Additionally, according to some embodiments, the plurality of nozzles 120 may interface the inner vessel wall 104 such that openings of the nozzles 120 are flush with a plasma-facing surface of the inner vessel wall 104. In other embodiments, the nozzles 120 may protrude into the vessel 100 from the inner vessel wall 104 for example, for a few millimetres (not shown). Nozzles 120 that protrude into the inner vessel wall 104 or liner may offer a degree of protection from clogging as a result of Sn debris during source operation, or during periodic liquid run-off.

To ensure that a nozzle outflow area does not become contaminated, certain embodiments may include nozzle tips with ceramic (e.g. ZrN) material. In these and other embodiments, hydrogen radicals may be supplied proximate to the nozzle openings and/or tips for cleaning. In addition, these embodiments may use EUV induced self-cleaning. In these and other embodiments, the nozzles 120 may also include a hollow plug of different material that is placed in a larger opening of the inner vessel wall 104.

To prevent or reduce Sn debris from entering the plurality of nozzles 120, certain embodiments may include nozzles 120 that are made of a porous medium. As a result, the outflow of gas may be less sensitive to particles that become deposited on the nozzle opening (not shown). In other embodiments, a mesh grid that is placed near the nozzle opening could be included with each nozzle to prevent Sn debris from entering into the nozzles 120. In certain embodiments, the mesh grid could be heated for local generation of hydrogen radicals. In yet other embodiments, nozzles 120 may include a capped showerhead hole from which gas is introduced sideways along a perimeter of the inner vessel wall 104. In these embodiments, a leak flow on the top of the cap may be implemented to avoid deposition of Sn debris on the cap itself.

Figure 10:
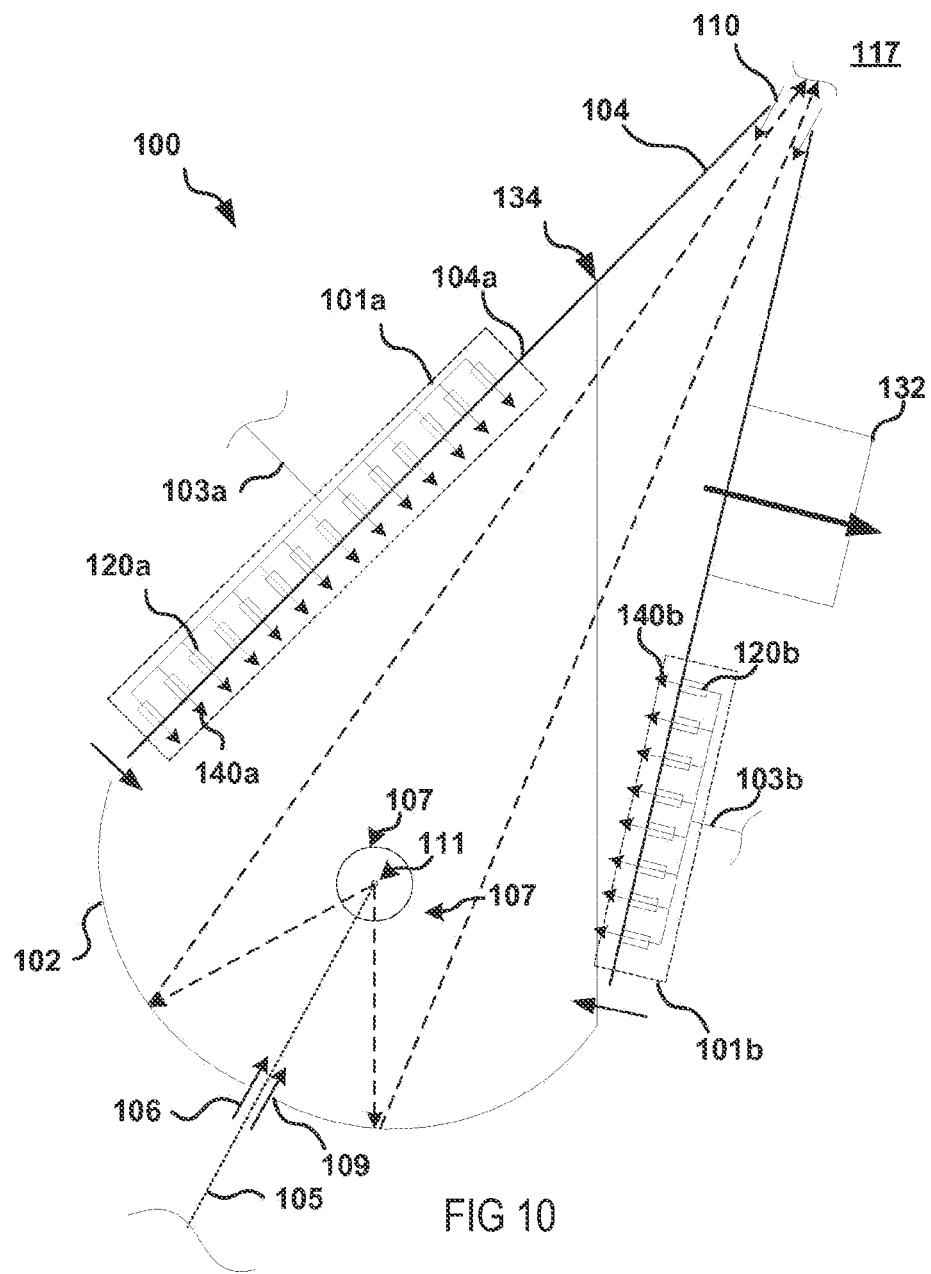
FIG. 10 is a simplified schematic view of an embodiment for an EUV vessel having a showerhead and an asymmetric exhaust.

FIG. 10 is a simplified schematic view of an embodiment for an EUV vessel 100 having a first showerhead 101a, a second showerhead 101b and an asymmetric exhaust 132. The inner vessel wall 104 is shown to have a ceiling region 104a that is defined as the portion of the inner vessel wall 104 (or portion of the first showerhead 101a that defines portions of the inner vessel wall 104) that lies gravitationally above the EUV collector 102. The ceiling region 104a is shown to include a boundary 134 that defines portions of the inner vessel wall 104 that lie gravitationally above the EUV collector 102 and portions that do not. It should be appreciated that a shape of boundary 134 will depend upon the shape of the inner vessel wall 104. The boundary 134 is meant to be exemplary and not limiting. For example, boundary 134 may be located more proximal to the IF region 157 or to the EUV collector 102, depending on a shape of the inner vessel wall 104, and an orientation of the EUV vessel 100 while the EUV source is being operated.

The asymmetric exhaust 132 is shown to be oriented along the inner vessel wall 104 at a location that is generally opposite of the ceiling region 104a to promote flow geometries of gas within the vessel 104 that are away from the EUV collector 102 and away from the ceiling region 104a. In certain embodiments, the asymmetric exhaust 132 may be configured to be in a downward leaning direction. Of course, many different orientations for the asymmetric exhaust may be implemented without departing from the spirit and scope of the embodiments. The configuration of the asymmetric exhaust 132 shown in FIG. 10 is intended to be exemplary and not limiting.

For example, the direction in the asymmetric exhaust 132 may be in an upward leaning angle while still being able to promote flow geometries within the vessel 100 that are away from the ceiling region 104a and away from the EUV collector 102. Furthermore, in certain other embodiments, the asymmetric exhaust 132 may be configured to be more or less proximal to the EUV collector 120 than in the embodiment shown. In addition, to avoid spitting inside the inner vessel wall 104, a scrubber that is located remotely downstream towards a pump may be included in certain embodiments (not shown).

The showerhead 101a is shown to include a first plurality of nozzles 120a that may be separately supplied with gas than a second plurality of nozzles 120b of showerhead 101b. For example, the first plurality of nozzles 120a is shown to be supplied by a first supply 103a, whereas the second plurality of nozzles 102b is shown to be supplied by a second supply 103b. The first plurality of nozzles 120a is also shown to extend along a larger lateral length of the inner vessel wall 104 than the second plurality of nozzles 120b. However, in other embodiments, the opposite may be true. Moreover, the first plurality of nozzles 120a is shown to provide a first plurality of flows 140a that is greater in number than the second plurality of flows 140b provided by the second plurality of nozzles 120b. Again, in other embodiments, the opposite may be true. In certain other embodiments, the first and second plurality of nozzles 120a and 120b may be supplied by a common gas supply.

Although not shown, the first plurality of nozzles 120a and the second plurality of nozzles 120b may extend circumferentially or perimetrically along the inner vessel wall 104 a certain distance. In certain embodiments, the first plurality of nozzles 120a may extend farther along the perimeter than the second plurality of nozzles 120b, whereas in other embodiments, the second plurality of nozzles 120b may extend farther along the perimeter than the first plurality of nozzles 120a. In other embodiments, the first and second pluralities of nozzles 120a and 120b may extend a similar distance along the perimeter, or may extend more or less than the other along given perimeters depending on the lateral position of the first or second plurality of nozzles 120a and 120b.

In certain embodiments, the first and second plurality of nozzles 120a and 120b may be supplied by a common gas delivery system. In still other embodiments, each of the nozzles of the first and second plurality of nozzles 120a and 120b may be individually supplied with gas and controlled to enable precise control over flow geometries within the vessel 100.

Again, it should be understood that although the inner vessel wall 104 of FIG. 10 is shown to include a generally conical shape, there are any number of shapes that the inner vessel wall 104 (or the showerhead 101 that defines at least a portion of the inner vessel wall 104) may include that do not depart from the scope and spirit of the embodiments. For example, certain embodiments may have inner vessel walls with elliptical, rectangular, or polygonal cross sections. Moreover, these and other embodiments may include a combination of different types of surfaces (e.g., smooth or vane-defined surfaces) that correspond to inner vessel wall shapes that have the aforementioned types of cross sections. Further still, the inner vessel wall may include smooth surfaces, or surfaces defined by vanes, or have a combination of both. As a result, any number of inner vessel wall 104 shapes may be implemented in accordance with embodiments having an asymmetric exhaust 132 configuration and one or more showerheads 101.

Figure 11:
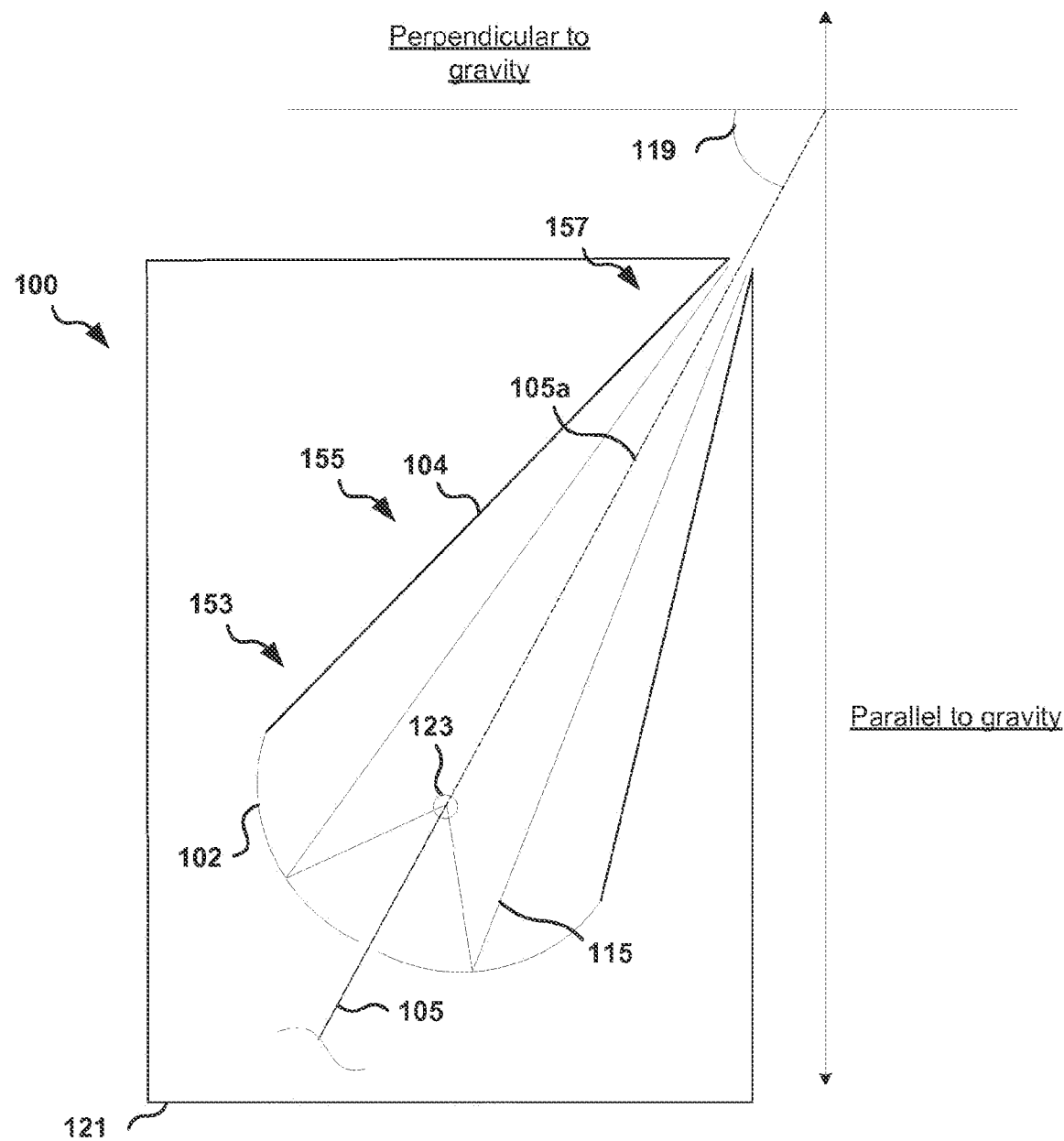
FIG. 11 is a simplified schematic view of an embodiment of an EUV vessel that is oriented at an upward leaning angle while operational.

FIG. 11 is a simplified schematic view of an embodiment of an EUV vessel 100 that is oriented at angle 119 for operation. Laser radiation pulse 105 from a radiation source is shown to enter a material target region 123 from which EUV radiation 115 is produced. Virtual laser radiation path 105a is shown in the Figure is shown to be a path the laser radiation pulse 105 might take relative to a direction of gravity. As a non-delimiting example, certain embodiments may have the EUV vessel 100 oriented such that virtual laser radiation path 105a has an angle 119 of between about 45° and about 80°, depending on the designed construction. Nevertheless, it will be understood that the angle 119 may vary anywhere between 0° and 90°, depending on the particulars of each application.

Also shown in FIG. 11 an inner vessel wall 104 that is connected to an EUV collector 102. The inner vessel wall 104 is shown to extend from the EUV collector 102 to an IF region 157, an upper region 153 that includes portions of the inner vessel wall 104 proximal to the EUV collector 102, as well as a medial region 155, which includes portions of the inner vessel wall disposed in between the IF region 157 and the upper region 153. An outer vessel wall 121 is shown to surround the inner vessel wall 104.

Figure 12B:
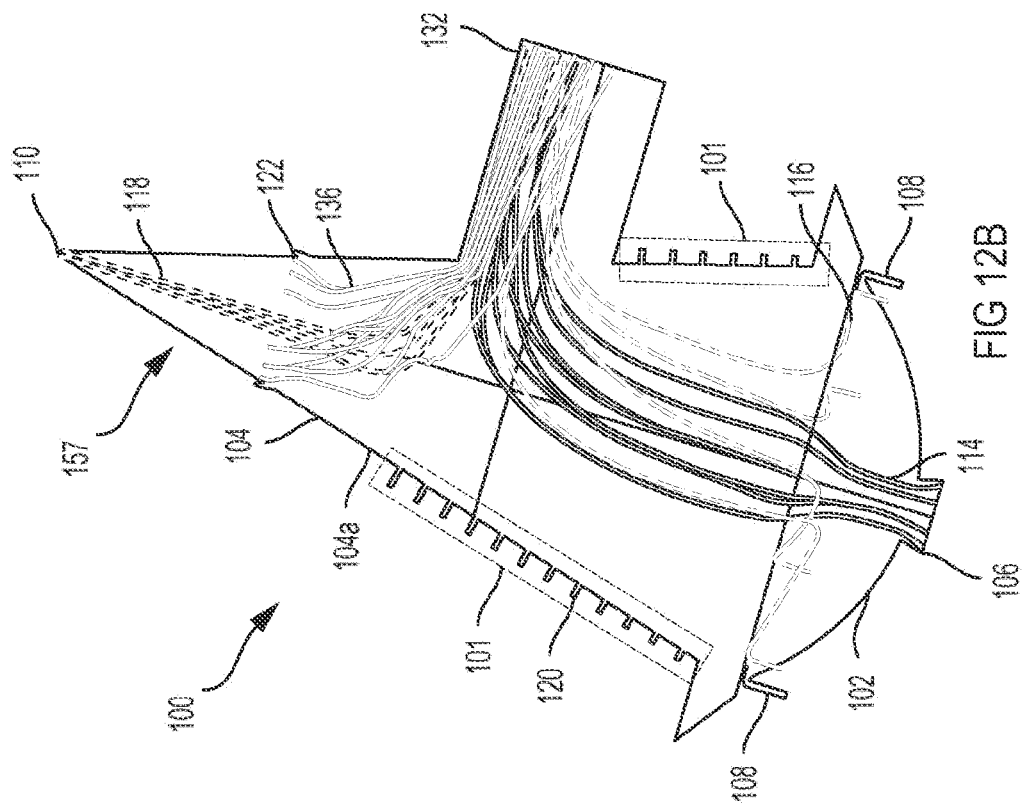
FIG. 12B is a cross-sectional view of an embodiment for an EUV vessel showing a plurality of flow paths for gas being introduced into to the vessel from various supplies and being exhausted by an asymmetrical exhaust.
Figure 12A:
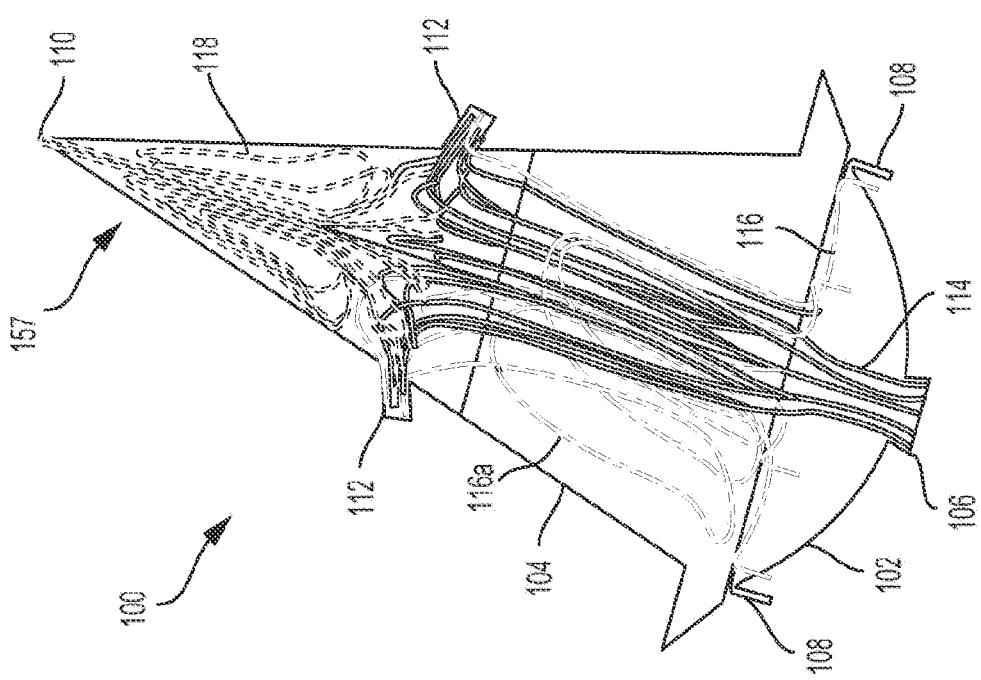
FIG. 12A is a cross-sectional view of an embodiment for an EUV vessel that shows a plurality of flow paths for gas being introduced into the vessel from different supplies and being exhausted by a symmetrical exhaust configuration.

FIG. 12A is a cross-sectional view of an embodiment for an EUV vessel 100 that shows a plurality of flow paths for gas being introduced into the vessel 100 from different supplies and being exhausted by a symmetric exhaust 112 that extends around the perimeter of the inner vessel wall 104. In the embodiment shown, the EUV vessel 100 is shown to include a center supply 106, a perimeter supply 108, and a DGL supply 110. The center supply 106 introduces gas that follows center supply flow paths 114, which are shown to travel around a material target region (not shown) toward symmetric exhaust 112.

Also shown in FIG. 12A is a perimeter supply 108 that introduces gas adjacent a perimeter of the EUV collector 102 that follows perimeter supply flow paths 116. The perimeter supply flow paths 116 are shown generally to travel inward toward an axis or center of the vessel 100 before traveling toward the symmetric exhaust 112. Certain perimeter supply flow paths 116a are shown to take more circuitous routes within the vessel 100, and for example, increase contact instances with the inner vessel wall 104. In particular, perimeter supply flow path 116a is shown to travel back towards perimeter supply 108 along a path that is proximate to the ceiling region 104a of the inner vessel wall 104, which may increase contact of Sn debris with the inner vessel wall 104.

The third gas supply shown in FIG. 12A is a DGL supply 110 that introduces gas into the vessel from a region near an IF region 157. Gas introduced by the DGL supply 110 follows DGL supply flow paths 118. As indicated in FIG. 12A, the DGL supply flow paths 118 may follow a circuitous route that includes a looping path along the inner vessel wall 104 laterally for some distance. As a result, the DGL supply flow paths 118 may result in increased contact instances or flux of Sn debris onto the inner vessel wall 104. For example, since the gas supplies (e.g., center supply 106, perimeter supply 108, and DGL supply 110) shown in FIG. 12A introduce gas that may act as diffusion barriers and carrier mediums for by-products produced by the laser produced plasma, each representative flow path may at any given time include Sn debris. As a result, while the EUV collector 102 is shown to be protected from Sn debris to a certain extent due to the center supply 106 and perimeter supply 108 that have flow paths 114 and 116, respectively, which are in a general direction that is away from the EUV collector 102, the same may not be as true for all regions of the inner vessel wall 104.

FIG. 12B is a cross-sectional view of an embodiment for an EUV vessel 100 showing a plurality of flow paths 114, 116, 118, and 136 for gas being introduced into the vessel from various supplies and being exhausted by an asymmetrical exhaust 132. The flow paths 114, 116, 118, and 136 are based on computational fluid dynamics (CFD) simulations while taking into account plasma gas interactions (PGI). The embodiment is shown to be equipped with a showerhead 101 having a plurality of nozzles 120. While flows that emanate from the plurality of nozzles 120 of the showerhead 101 are present in simulation shown in FIG. 12B, they have been omitted from view for clarity.

As shown in FIG. 12B, the EUV vessel 100 includes a center supply 106, a perimeter supply 108, a curtain supply 122, and a DGL supply 110. Also shown in FIG. 12B is an asymmetric exhaust 132 that is oriented along the vessel 100 at a location that is generally opposite of a ceiling region 104a of the inner vessel wall 104 that is gravitationally above the EUV collector 102. In general, the asymmetric exhaust 132 is shown to exhaust gas that is introduced via the various supplies in a direction that is both away from the EUV collector 102 and the ceiling region 104a of the inner vessel wall 104.

For example, each of the center cone supply flow paths 114 and the perimeter supply flow paths 116 are shown to emanate from proximate the EUV collector 102 and subsequently enter the asymmetric exhaust 132. Unlike the embodiment shown in FIG. 12A, the asymmetric exhaust 132 of the embodiment shown in FIG. 12B enables flow geometries that do not substantially cycle backwards or loop back along the inner vessel wall 104. As a result, the perimeter supply flow paths 116 are able to reduce contact instances of Sn debris being carried by the gas with the inner vessel wall 104.

Also shown in FIG. 12B are DGL supply flow paths 118 for gas being introduced into the vessel 100 via the DGL supply 110. Each of the DGL supply flow paths 118 enter and exit the vessel 100 with reduced instances of looping or cycling back. Again, as a result of the reduction of instances of looping or cycling back, contact instances of the gas introduced by the DGL supply 110 and the by-product that it may carry with the inner vessel wall 104 is reduced.

In the embodiment shown in FIG. 12B, a curtain supply 122 is shown to also introduce gas into the vessel 100 at a location that is proximate to an IF region 157 of the vessel 100. Gas that is introduced via the curtain supply 122 is shown to follow curtain supply flow paths 136 that enters into the vessel 100 as a curtain flow in a lateral direction away from the IF region 157. Gas that is introduced via the curtain supply 122 is also shown to subsequently exit the vessel 100 via asymmetric exhaust 132. Much like the other flow paths of the embodiment shown in FIG. 12B, each of the curtain supply flow paths 136 enter and exit the vessel in a manner that reduces contact instances with the inner vessel wall 104. In certain embodiments, the curtain supply 122 may consist of slit nozzles or an array of nozzles introducing gas flow that is substantially parallel to the inner vessel wall 104. Although not shown, flow paths that result from gas being introduced by the plurality of nozzles 120 of the showerhead 101 also enter and exit the vessel without substantially looping or cycling back toward the inner vessel wall 104.

While the representative flow paths of certain supplies are shown, it should be appreciated that certain supplies may be excluded from the embodiment shown in FIG. 12B while still retaining the overall directionality and flow geometries of gas flowing away from the EUV collector 102 as well as flowing away from the ceiling region 104a of the inner vessel wall 104. For example, if the curtain supply 122 were to be excluded from the embodiment shown in FIG. 12B, the remaining center supply flow path 114, the perimeter supply flow path 116, and the DGL supply flow path 118 would retain similar overall geometries that are in a direction that is towards the asymmetric exhaust 132 and away from the EUV collector 102 and the inner vessel wall 104. However, it is noted that a greater reduction in flow path looping or cycling back is achievable when an asymmetric exhaust 132 is practiced with flows of gas emanating from the inner vessel wall 104 such as that provided by the showerhead 101.

It should be noted that each of the individual flow paths of 114, 116, 118, and 136 are representative and should not be interpreted as limiting the number of inlets used for each of the center supply 106, the perimeter supply 108, the DGL supply 110, or the curtain supply 122. For example, each of the supplies may include any number of inlets for introducing gas at their respective locations.

Figure 13:
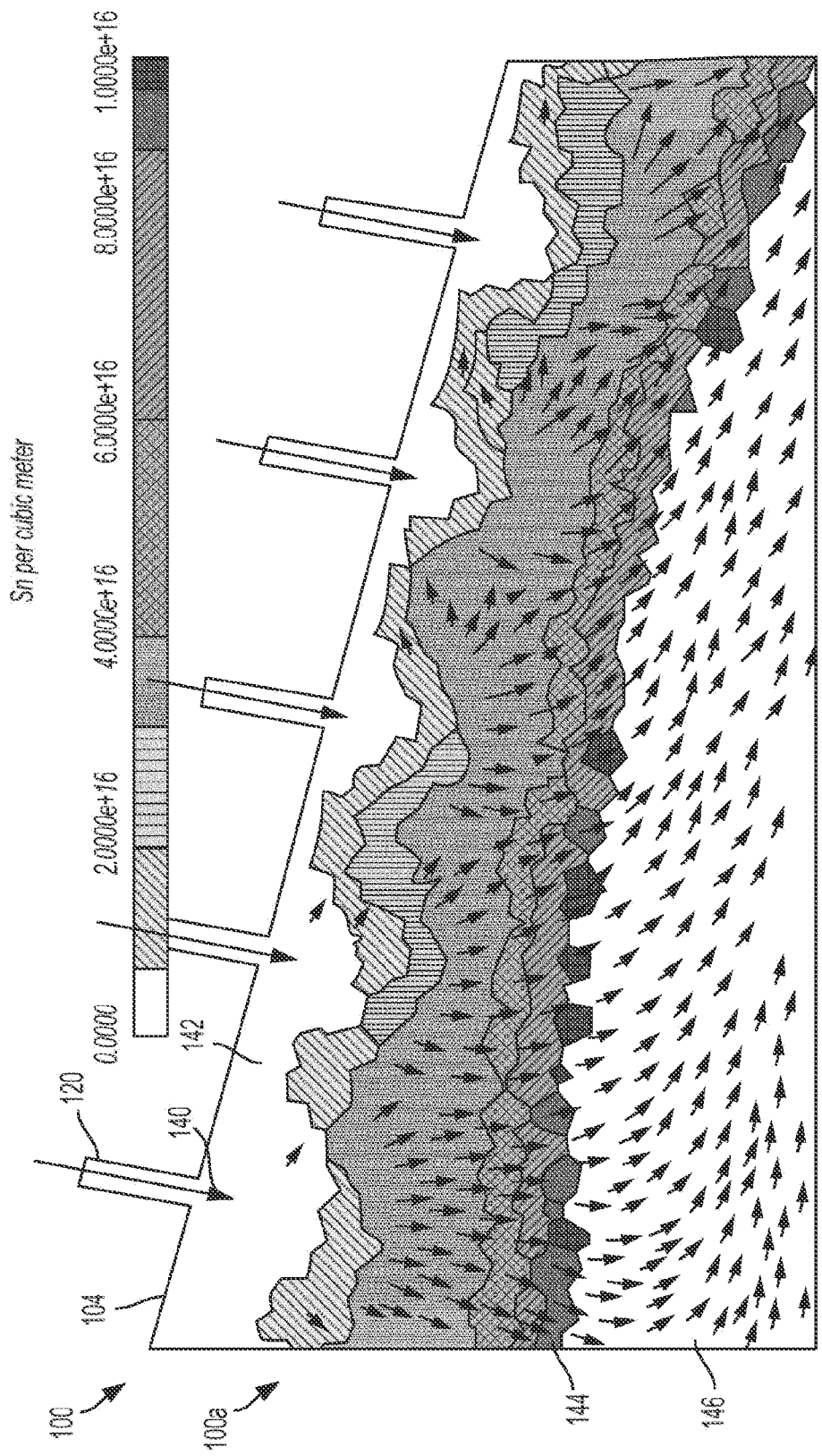
FIG. 13 is a cross-sectional view of an EUV vessel having nozzles of a showerhead distributed laterally that introduce gas into an inner vessel space.

FIG. 13 is a cross-sectional view of Sn concentration gradients calculated based on CFD simulations of an EUV vessel 100 having a plurality of nozzles 120 (e.g., of a showerhead) distributed laterally along an inner vessel wall 104 that introduce gas flows 140 into the vessel 100, according to one simulated embodiment. Each of the showerhead nozzles 120 are shown to introduce gas flows 140 in a direction that is away from the inner vessel wall 104. As a result, there is a first region 142 of the inner vessel space 100a immediately adjacent to the inner vessel wall 104 that has a Sn concentration about an order of magnitude less than that of a second region 144 that extends further into the inner vessel space 100a. Although not shown on the gradient scale, regions that are further away from the inner vessel wall 104, such as a third region 146, are shown to have Sn concentration levels that are at least an order of magnitude higher than that of the first region 142. Thus, in certain embodiments having nozzles 140 that introduce gas flows 140 in a direction that is away from the inner vessel wall 104, a level of protection from Sn debris may be obtained.

Figure 14:
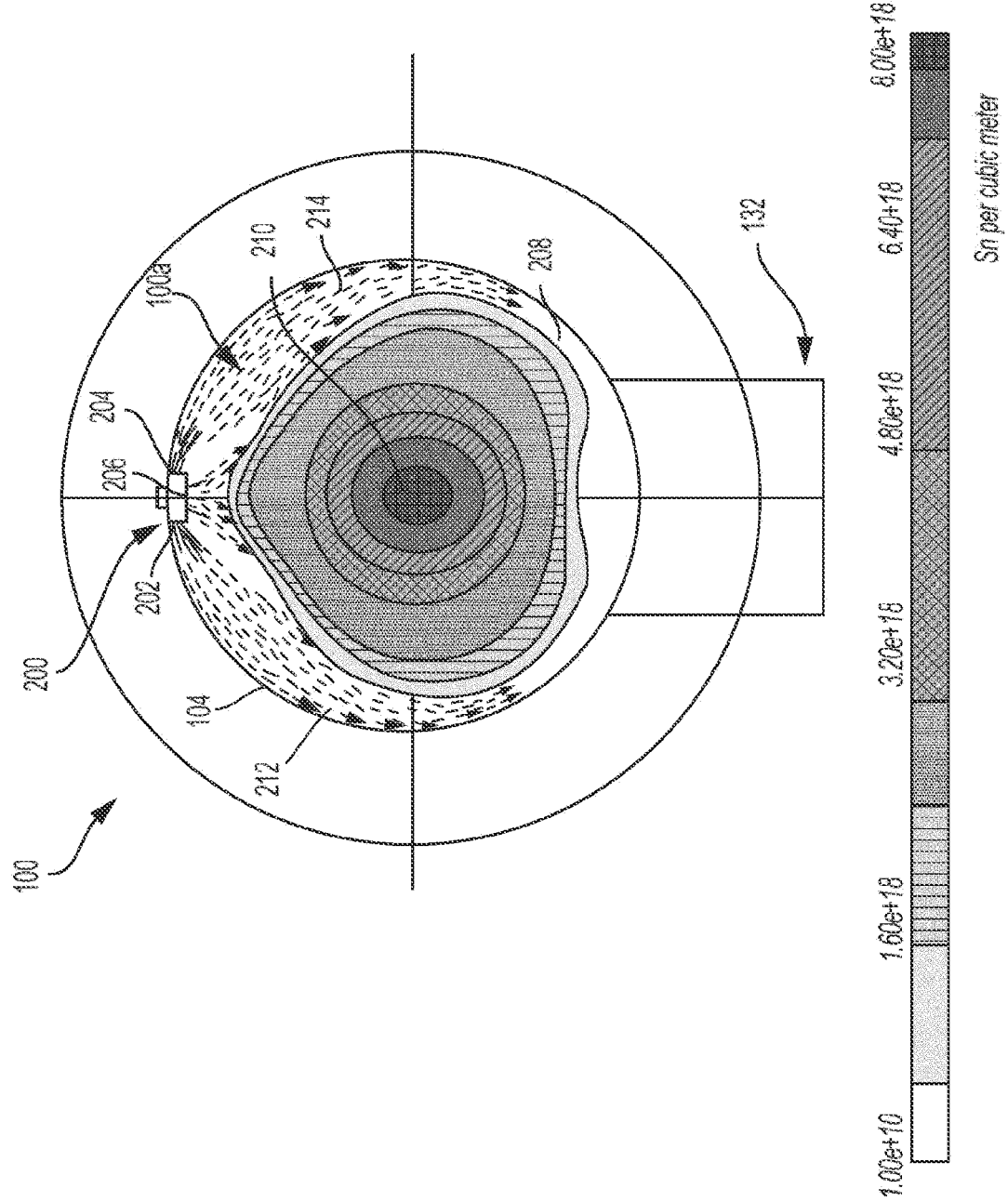
FIG. 14 is a cross-sectional view of an EUV vessel having a curtain flow nozzle assembly for introducing gas into the vessel as curtain flows.

FIG. 14 is a cross-sectional view of an EUV vessel 100 having a curtain flow nozzle assembly 200 to introduce gas into the vessel 100 as curtain flows, according to one simulated embodiment. The EUV vessel 100 is shown to have a curtain flow nozzle assembly 200 that is located adjacent to an inner (plasma-facing) wall of the inner vessel wall 104. The curtain flow nozzle assembly 200 is shown to include a first outlet 202, a second outlet 204, and a third outlet 206, each for introducing gas into the vessel. The first outlet 202 is shown in the Figure to introduce gas in a counterclockwise direction that is along a perimeter (e.g., circumference in this example) of the inner vessel wall 104, while the second outlet 204 is shown in the Figure to introduce gas in a clockwise direction along the same perimeter. The third outlet 206 is shown to introduce gas in a direction that is generally away from the inner vessel wall 104.

Gas that is introduced by the first outlet 202 of the curtain flow nozzle assembly 200 is shown to result in a first curtain flow 212 that extends from the first outlet 202. Gas that is introduced by the second outlet 204 is shown to result in a second curtain flow 214 that extends from the second outlet 204. In certain embodiments such as the one shown in FIG. 14, an asymmetric exhaust 132 may be oriented along a region of the vessel 100 that is opposite of a region of the vessel 100 where the curtain flow nozzle assembly 200 may be located.

According to the embodiment shown in FIG. 14, regions within the inner vessel space 100a that are adjacent to the inner vessel wall 104, such as a first region 208, demonstrate Sn concentration gradients that are many orders of magnitude lower than that of regions of the inner vessel space 100a that further away from the inner vessel wall 104 such as a second region 210. According to certain embodiments, the first and second curtain flows 212 and 214 provide flow geometries within the inner vessel space 100*a* that protect the inner vessel wall 104 from Sn debris contamination. In these embodiments, the first and second curtain flows 212 and 214 act as diffusion barriers along the respective wall portions that they travel along. As a result of lowered Sn concentration gradients proximate to the inner vessel wall 104, contact instances of Sn debris with the inner vessel wall 104 are reduced.

In certain embodiments, a third outlet 206 is also included within the curtain flow nozzle assembly 200 to provide flow geometries of gas within the inner vessel space 100*a* that is away from the curtain flow nozzle assembly 200 itself. As a result, the curtain flow nozzle assembly 200 is protected from Sn debris contamination. In certain other embodiments, the third outlet 206 may be excluded from the curtain flow nozzle assembly 200.

In some embodiments, the EUV vessel 100 may include a plurality of curtain flow nozzle assemblies 200 that are arranged laterally along at least a portion of the inner vessel wall 104. For example, in certain embodiments, the plurality of curtain flow nozzle assemblies 200 may be arranged laterally within a ceiling region of the inner vessel wall that is located gravitationally above the EUV collector (not shown). In these embodiments, the plurality of curtain flow nozzle assemblies may be arranged along a line segment that travels from a region near the EUV collector to an IF region (e.g., a generatrix, if the vessel is conical).

Although the curtain flow nozzle assembly 200 is shown to be located within an inner vessel space 100*a* (e.g., protruding past the inner vessel wall 104), other embodiments may have the curtain flow nozzle assembly 200 configured such that openings of the first, second, and third outlets 202, 204, and 206 are more flush with the inner vessel wall 104. Additionally, although the embodiment shown includes an asymmetric exhaust 132, it should be understood that other embodiments may have a curtain flow nozzle assembly 200 that is practiced without the asymmetric exhaust 132. Moreover, while the embodiment shown includes smooth surfaces as the inner vessel wall 104, it should be understood that certain other embodiments may include inner vessel walls 104 that include vanes or surfaces defined by vanes. For example, the vanes may be a separate structure that line the inside of the inner vessel wall 104 and project into a volume defined by the inner vessel space 100*a*. In these embodiments, the curtain flow nozzle assembly 200 may be integrated into the vane structure, or may be separate from the vane structure.

Figure 15A:
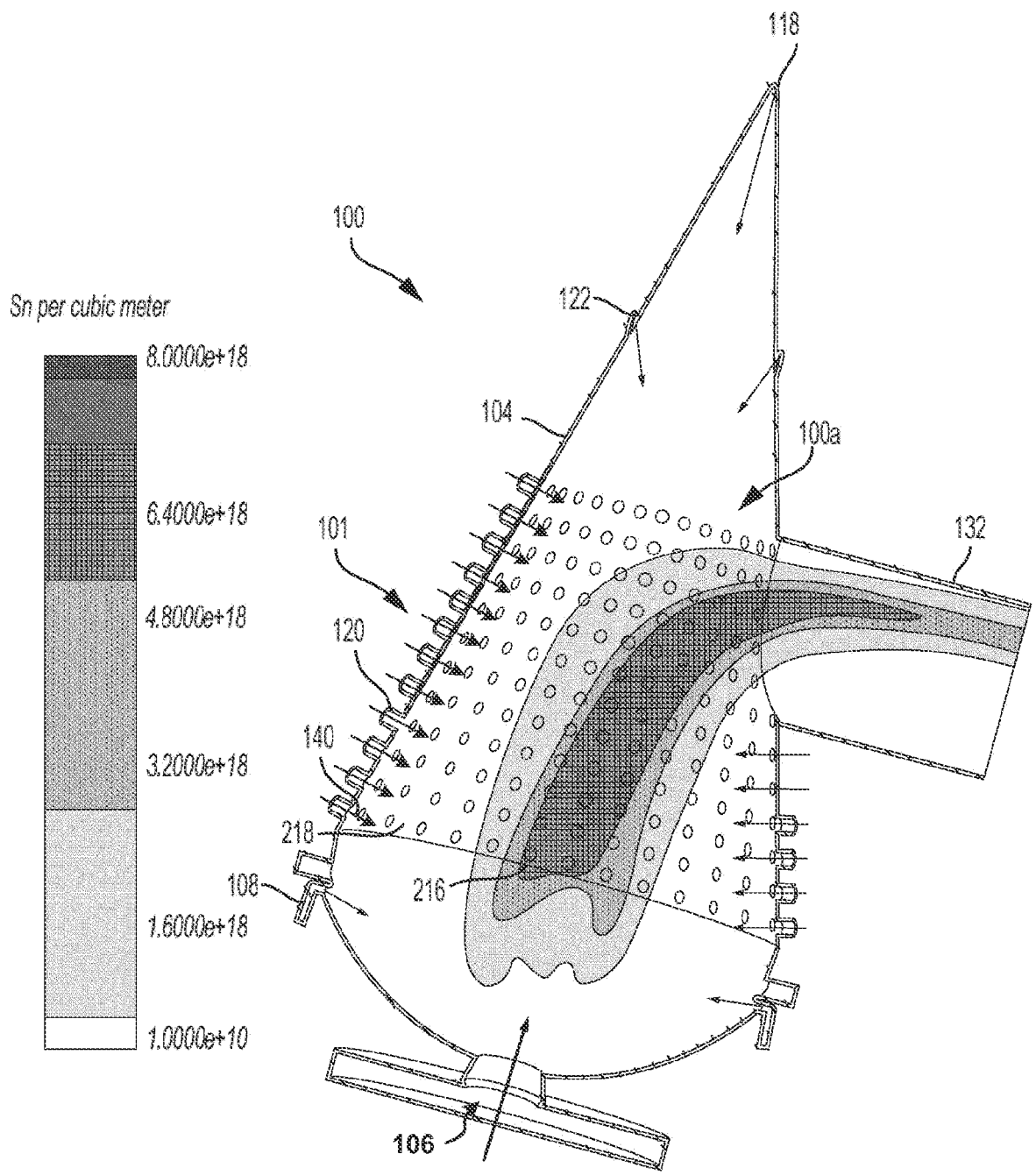
FIG. 15A is a cross-sectional view of an EUV vessel having a showerhead and an asymmetric exhaust that shows debris concentration within the inner vessel space, according to one simulated embodiment.

FIG. 15A is a cross-sectional view of an EUV vessel 100 having a showerhead 101 and an asymmetric exhaust 132 that shows Sn concentration within the inner vessel space, according to one simulated embodiment. The showerhead 101 is shown to be integrated into the inner vessel wall 104 such that it shares a portion of the inner vessel wall 104 as part of its structure. The showerhead 101 is shown to include a plurality of nozzles 120 that extend around a perimeter of the vessel 100. Each of the plurality of nozzles 120 is shown to introduce a gas flow 140 that is in a direction away from the inner vessel wall 104.

The vessel 100 is also shown to include a center supply 106, a perimeter supply 108, a DGL supply 110, and a curtain supply 122. Sn concentrations in regions of the inner vessel space that are adjacent to the inner vessel wall 104 are shown to be less than that of regions further away from the inner vessel wall 104 and toward a center region of the inner vessel space 100*a*. For example, a first region 218 that is adjacent to the inner vessel wall 104 is shown to have an Sn concentration that is several orders of magnitude lower than that of a second region 216 that is further away from the inner vessel wall 104.

Figure 15B:
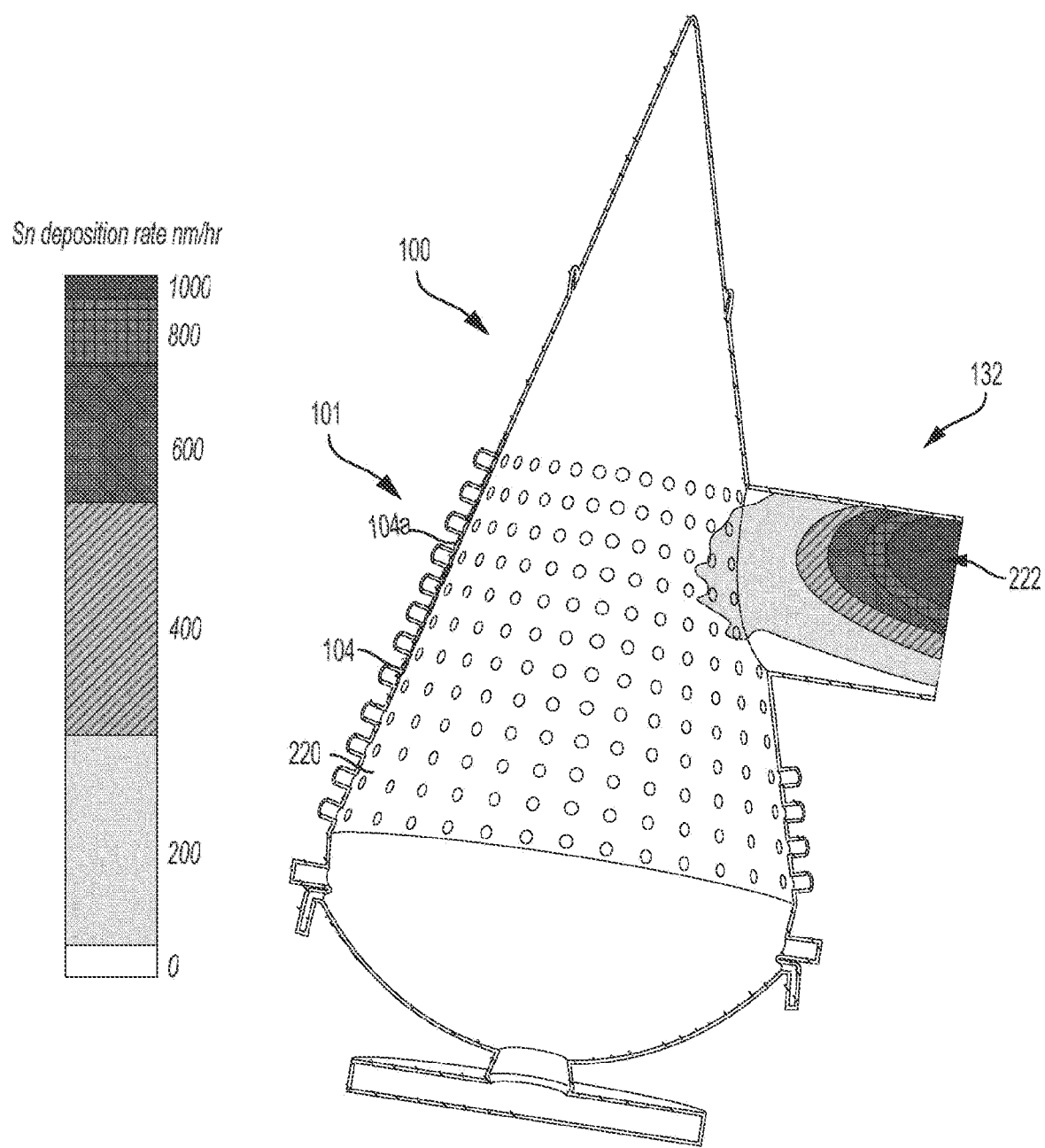
FIG. 15B is a cross-sectional view of an EUV vessel having a showerhead and an asymmetric exhaust that shows debris deposition rates on inner vessel walls based on simulations, according to one simulated embodiment.

FIG. 15B is a cross-sectional view of an EUV vessel 100 having a showerhead 101 and an asymmetric exhaust 132 that shows Sn deposition rates on an inner vessel wall 104, according to one embodiment and according to simulations. According to the embodiment shown, regions of the inner vessel wall 104 that are protected by a showerhead 101 are shown to have deposition rates that are orders of magnitude lower than that of one or more walls included by the asymmetric exhaust 132. For example, there is a region 220 of the ceiling region 104*a* of the inner vessel wall 104 that is gravitationally above the EUV collector 102 that is shown to have a minimal deposition rate of Sn debris. In contrast, there is a region 222 of the asymmetric exhaust 132 wall not located gravitationally above the EUV collector 102 that is shown to have a Sn deposition rate of about 200-1000 nm/hr or higher (the color bar cuts off at 1000 nm/hr).

Although embodiments are shown that include a showerhead 101 that have nozzles 140 arranged to encompass a perimeter of the inner vessel wall 104, it should be noted that there are other embodiments in which a showerhead 101 having nozzles 120 that do not cover the entire perimeter of the inner vessel wall that may be implemented without departing from the scope and spirit of the embodiments. For example, certain embodiments may include a nozzle arrangement that do not cover the entire perimeter of the inner vessel wall 104, and others that may cover the entire perimeter, but only for a certain lateral distance along the inner vessel wall 104. Furthermore, although a pattern of nozzle 120 arrangement is shown for illustrative purposes, it should be understood that any number of nozzle 120 arrangements may be used to provide protection of the inner vessel walls 104. For example, a greater or lesser number of nozzles 120 may be used than what is shown. Further, the pattern in which the nozzles 120 are arranged may vary in terms of spacing, uniformity, nozzle diameter, etc., in order to meet the needs of various embodiments.

Figure 16A:
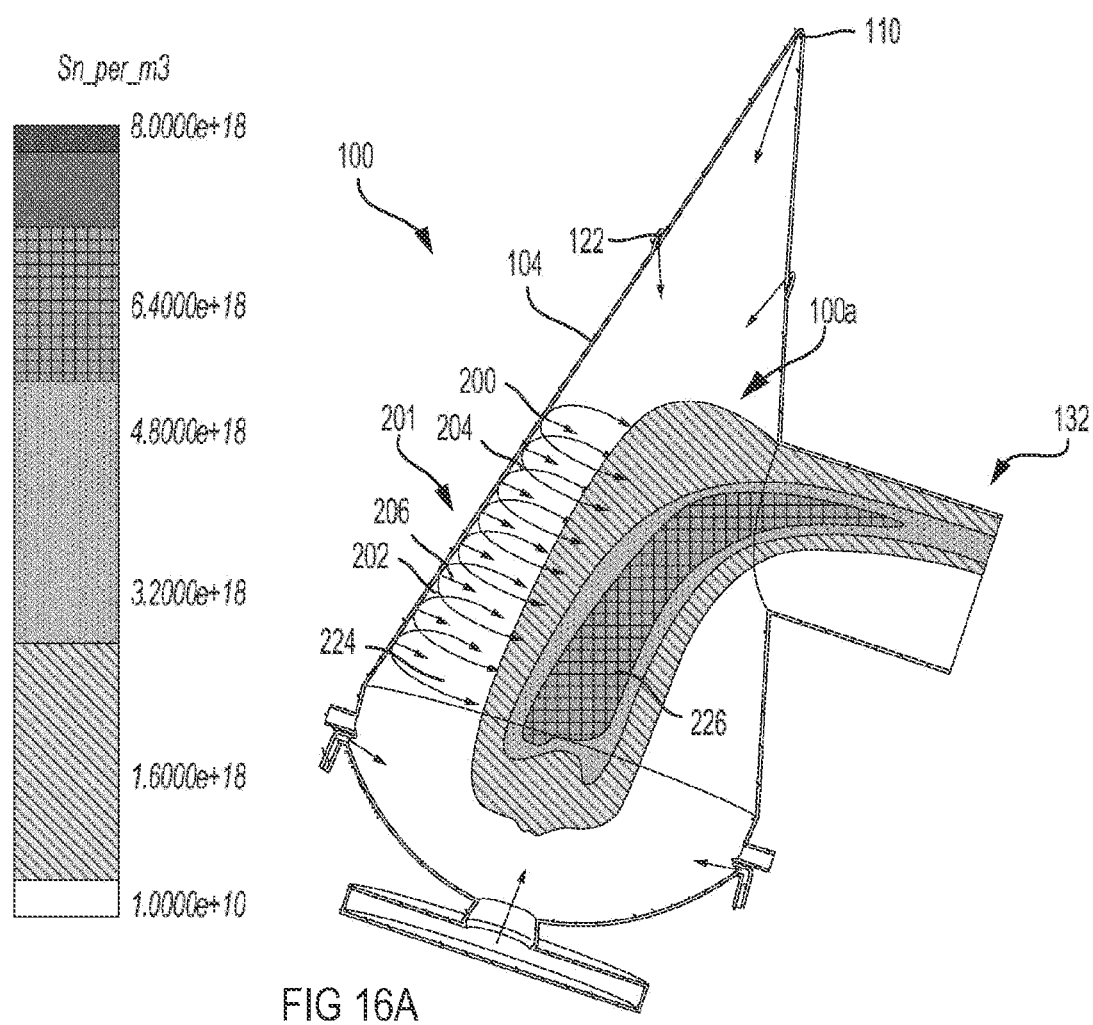
FIG. 16A is a cross-sectional view of an EUV vessel having a curtain flow supply and an asymmetric exhaust that shows debris concentration within the inner vessel space, according to one simulated embodiment.

FIG. 16A is a cross-sectional view of an EUV vessel 100 having a curtain flow supply 201 and an asymmetric exhaust 132 that shows Sn concentration within the inner vessel space, according to an embodiment. The vessel 100 is shown to include a plurality of curtain flow nozzle assemblies 200 that are arranged laterally along the inner vessel wall 104. Each curtain flow nozzle assembly 200 is shown to include a first outlet 202 of gas, a second outlet 204 of gas, and a third outlet 206 of gas. The first outlet 202 of gas is shown to be curtain flow that travels along a perimeter of the inner vessel wall 104. The second outlet 204 of gas is shown to also be a curtain flow that travels along the perimeter of the inner vessel wall 104 counter-directionally to the first outlet 202 of gas. The curtain flow nozzle assembly 200 is also shown to include a third outlet 206 of gas that introduces gas into the vessel 100 in a direction that is away from the inner vessel wall 104. Additionally, the vessel 100 is shown to include a center supply 106, a perimeter supply 108, a DGL supply 110, and a curtain supply 122. As a result of the curtain flow supply 201, Sn concentrations in regions of the inner vessel space 100*a* that are adjacent to the inner vessel wall 104 are shown to be less than that of regions further away from the inner vessel wall 104 and toward a center region of the inner vessel space 100*a*. For example, a first region 224 that is adjacent to the inner vessel wall 104 is shown to have a Sn concentration that is several orders of magnitude lower than that of a second region 226 that is further away from the inner vessel wall 104.

Figure 16B:
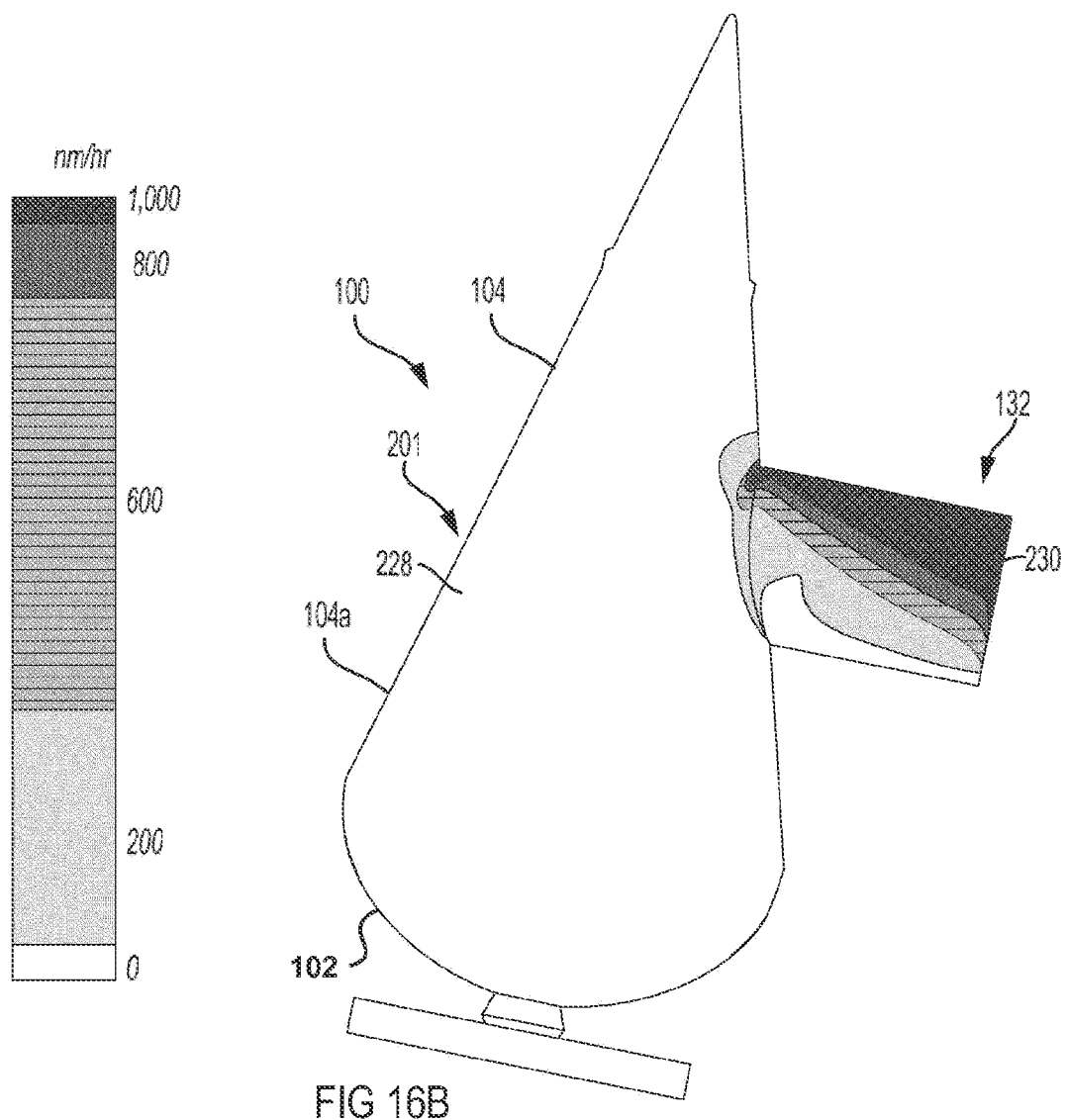
FIG. 16B is a cross-sectional view of an EUV vessel having a curtain flow supply and an asymmetric exhaust that shows debris deposition rates on inner vessel walls, according to one simulated embodiment.

FIG. 16B is a cross-sectional view of an EUV vessel 100 having a curtain flow supply and an asymmetric exhaust 132 that shows Sn deposition rates on an inner vessel wall 104, according to one embodiment and according to simulations. According to the embodiment shown, regions of the inner vessel wall 104 that are protected by a curtain flow supply 201 are shown to have deposition rates that are orders of magnitude lower than that of one or more walls included by the asymmetric exhaust 132. For example, there is a region 228 of the ceiling region 104a of the inner vessel wall 104 that is gravitationally above the EUV collector 102 that is shown to have a minimal deposition rate of Sn debris. In contrast, there is a region 230 of the asymmetric exhaust 132 wall not located gravitationally above the EUV collector 102 that is shown to have a Sn deposition rate that is several orders of magnitude higher than that of the region 228.

Although certain embodiments of EUV vessel that include a showerhead of a conical shape have been illustrated, it should be understood that there are many ways to implement a showerhead with an EUV vessel that fall within the scope and spirit of the embodiments. For example, certain embodiments may have a showerhead having a separate body or manifold or a plurality of gas lines that supplies each of the plurality of nozzles. The body or manifold or plurality of gas lines supplying the showerhead may be located behind an inner vessel wall (e.g., on the non-plasma facing side of the inner vessel wall). In certain other embodiments, the body or manifold of the showerhead may be located on the plasma-facing side such that the body or manifold of the showerhead may itself define at least a portion of the inner vessel wall that is exposed to plasma and Sn debris. In still other embodiments, the body or manifold may be one with the inner vessel wall such that the inner vessel wall makes up a portion of showerhead. In these and other embodiments, the inner vessel wall may include embedded paths or channels that include the body or manifold or plurality of gas lines that supply the showerhead. Furthermore, in these embodiments, the showerhead may be integrated into the inner vessel wall. In certain other embodiments, the showerhead may have a distributed body or manifold or may be without a body or manifold. As mentioned previously, for example, the plurality of nozzles of the showerhead may be supplied by gas lines that interface with each of the nozzles. In this manner, the showerhead may simply be defined as the plurality of nozzles configured in a showerhead-like manner.

In one embodiment having a generally conical shape, an EUV source includes a vessel having an upper cone region, a focal cone region, and a medial cone region disposed between the upper cone region and the focal cone region, wherein the upper cone region and the focal cone region are disposed at opposite ends of the vessel. The embodiment includes an EUV collector having a reflective surface that is disposed inside the vessel where the reflective surface is directionally configured to face the focal cone region of the vessel. The embodiment also includes a conical showerhead that is disposed along at least a portion of the inner vessel wall. The conical showerhead includes a plurality of nozzles that introduce gas into the vessel. A plurality of exhausts oriented proximate to the focal cone region for removing gas introduced into the vessel is also included in the embodiment such that gas introduced into the vessel is caused to flow away from the EUV collector.

In a further embodiment having a generally conical shape, an EUV source includes a vessel having an upper cone region, a focal cone region, and a medial cone region disposed between the upper cone region and the focal cone region, wherein the upper cone region and the focal cone region are disposed at opposite ends of the vessel. The embodiment includes an EUV collector having a reflective surface that is disposed inside the vessel with the reflective surface being directionally configured to face the focal cone region of the vessel. The embodiment includes a first gas source disposed proximate to the reflective surface of the EUV collector having a plurality of inlets for introducing gas into the vessel. The embodiment also includes a conical showerhead disposed along at least a portion of the inner vessel wall having a plurality of nozzles for introducing gas into the vessel. An exhaust that is oriented at an asymmetric position between the upper cone region and the focal cone region is also included by the embodiment for exhausting gas from the vessel. In certain embodiments, the asymmetric exhaust may be oriented at a downward leaning angle, for example, toward a direction of gravity. In these and other embodiments, the asymmetric exhaust may be oriented such that it opposes a region proximate to a ceiling area of the inner vessel wall that is gravitationally above the EUV collector.

In a further embodiment having a generally conical shape, an EUV source includes a vessel having an upper cone region, a focal cone region, and a medial cone region disposed between the upper cone region and the focal cone region, wherein the upper cone region and the focal cone region are disposed at opposite ends of the vessel. The embodiment includes an EUV collector having a reflective surface that is disposed inside the vessel with the reflective surface being directionally configured to face the focal cone region of the vessel. The embodiment includes a first gas source disposed proximate to the reflective surface of the EUV collector having a plurality of inlets for introducing gas into the vessel. A second gas source disposed laterally at least partially along a portion of the inner vessel wall having a plurality of nozzle assemblies is also included in the embodiment. According to this embodiment, each of the nozzle assemblies include a first outlet and a second outlet for introducing gas into the vessel with the first outlet configured to introduce gas in a first direction that is away from a second direction in which the second outlet is configured for introducing gas.

Figure 17:
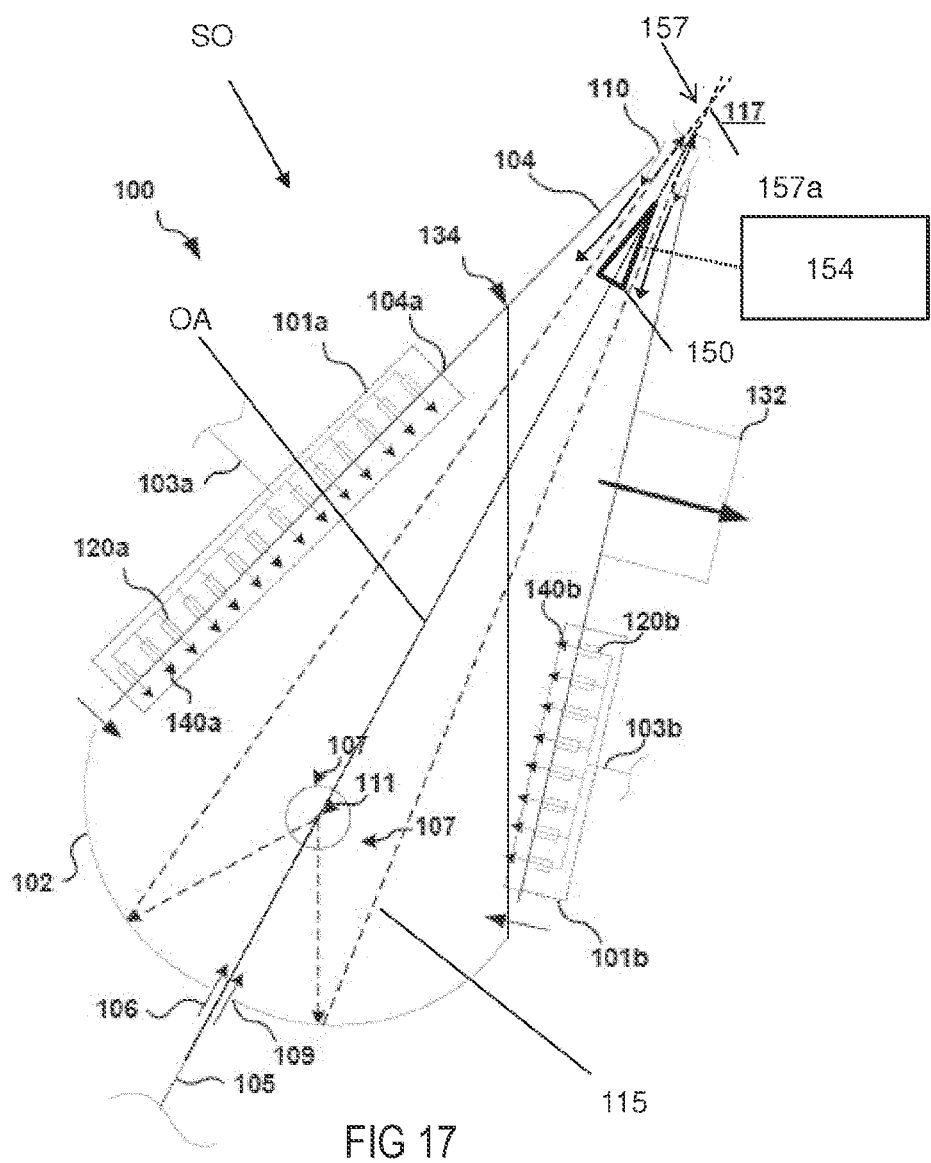
FIG. 17 is a cross-sectional view of the EUV vessel of FIG. 10 comprising a guiding device.

FIG. 17 depicts a further embodiment of a radiation source, which may be provided in the form of an EUV source SO. The EUV source SO comprises a chamber, which may be provided in the form of an EUV vessel 100. The EUV vessel 100 comprises an inner wall 104 and a material target plasma region 111. The EUV source SO comprises a radiation collector, which may be provided in the form of EUV collector 102, arranged in the EUV vessel 100. The EUV collector 102 is configured to collect radiation e.g. EUV radiation 115, emitted at the material target region 111 and to direct the collected EUV radiation 115 to an intermediate focus (IF) region 157. A focal point 157a of the EUV collector (which may be referred to as intermediate focus 157a) is located at or near the intermediate focus region 157, as described herein. The EUV source SO, e.g. the EUV vessel 100, comprises a debris mitigation system. The debris mitigation system may comprise or be provided in the form of the center supply 106, the perimeter supply 108, and/or the DGL supply 110, as described above. The debris mitigation system, e.g. the DGL supply, is configured to direct a first gas flow from the intermediate focus region 157 towards the material target region 111. The first gas flow may be or comprise gas supplied by the DGL supply 110. It will be appreciated that the term "first gas flow" and "gas supplied by the DGL supply" may be interchangeably used.

The debris mitigation system is configured to direct a second gas flow from a portion of the inner vessel wall 104 into the EUV vessel 100. For example, the debris mitigation system comprises the showerhead 101, which includes a plurality of nozzles 120 for introducing the second gas flow or gas into the EUV vessel 100. The second gas flow may be or comprise gas supplied by the showerhead 101. It will be appreciated that the term "second gas flow" and "gas supplied by the showerhead" may be interchangeably used.

In the example depicted in FIG. 17, the showerhead 101 is provided in the form of the first showerhead 101a and the second showerhead 101b, as described above. The first showerhead 101a comprises the first plurality of nozzles 120a and the second showerhead 101b comprises the second plurality of nozzles 120b. The first and second plurality of nozzles 120a, 120b may be provided for directing the gas supplied by the showerhead 101, e.g. the first and second showerheads 101a, 101b, into the EUV vessel 100. It will be appreciated that in other embodiments the second flow of gas may be supplied by the curtain flow supply, as described above.

The EUV vessel 100 comprises a guiding device, which may be provided in the form of a flow splitter 150. The flow splitter 150 is arranged in the EUV vessel 100 such that the gas supplied by the DGL supply 110 is directed around the flow splitter 150. The EUV vessel 100 comprises an exhaust 132 for removing gas supplied by the debris mitigation system from the EUV vessel. The exhaust 132 may be configured for removing debris that is carried by the gas from the EUV vessel 100. The exhaust 132 is arranged to extend from a portion of the inner wall 104 of the EUV vessel 100, for example at an azimuthally asymmetric position, as described above. The EUV vessel 100 depicted in FIG. 17 is similar to those depicted in FIGS. 10, 12B, 15A and 15B and may comprise any of the features described above in relation to FIGS. 10, 12B, 15A and 15B.

FIG. 18A depicts simulated flow paths of the gas supplied by the DGL supply 110, the showerhead 101, the center supply 106 and/or the perimeter supply 108. As described above, the center supply 106 introduces gas that follows center supply flow paths 114. The perimeter supply 108 introduces gas that follows perimeter supply flow paths 116 (depicted together with the center supply flow paths 114 in FIG. 18A). Gas introduced by the DGL supply 110 follows DGL supply flow paths 118. Each of the showerhead nozzles 120 (e.g. each of the first and second plurality of nozzles 120a, 120b) introduces gas that follows flow paths 140, as indicated in FIG. 18A.

The debris mitigation system may be configured to direct a third gas flow or gas from a position at or proximate to the flow splitter 150 (or the intermediate focus region 157) in the EUV vessel to the material target region 111. The debris mitigation system may be configured to direct the third gas flow from a position on the internal wall 104 to the material target region 111. The debris mitigation system may comprise the curtain supply 122, as described above. Gas that is introduced via the curtain supply 122 follows curtain supply flow paths 136. It will be appreciated that the term "third gas flow" and "gas supplied by the curtain supply" may be interchangeably used.

The gas supplied by the center supply 106 and/or the perimeter supply 108 may be or be comprised in a fourth gas flow. It will be appreciated that the term "fourth gas flow" and "gas supplied by the center supply and/or perimeter supply" may be interchangeably used. The debris mitigation system, e.g. the center supply 106, the perimeter supply 108, may be configured to direct the fourth flow of gas from the EUV collector 102 towards the target material region 111. The flow splitter 150 may be configured to reduce or prevent the interaction between the gas supplied by the DGL supply 110 and the gas supplied by the center supply 106 and/or the perimeter supply 108. The flow splitter 150 may be configured to prevent formation of a jet of the gas supplied by the DGL supply 110, e.g. towards EUV collector 102.

A flow rate of the gas supplied by the DGL supply 110 may be selected to prevent debris from entering the intermediate focus region 157. A flow rate of the gas supplied by the DGL supply 110 may be selected depending on a gas supplied by the DGL supply 110, a density or pressure of the gas supplied by the DGL supply 110, a size of debris, e.g. particulate debris, or a velocity of debris and/or a direction of debris diffusion in the EUV vessel of the radiation source SO. Additionally or alternatively, the flow rate of the gas supplied by the DGL supply 110 may be selected depending on the arrangement or geometry of the DGL supply. For example, the flow rate of the gas supplied by the DGL supply 110 may be selected dependent on a number of the openings of the DGL supply 110, a cross-sectional width (e.g., diameter) of each opening of the DGL supply 110 and/or a cross-sectional width (e.g., diameter), periphery or dimension of the intermediate focus region 157. For example, a maximum velocity of the gas supplied by the DGL supply 110 may be in the range of about 1000 to 3000 m/s.

The gas supplied by the DGL supply 110 may have a flow rate in the range of about 5 to 30 slm. Debris may include particulate debris, such as for example Sn clusters, Sn microparticles, Sn nanoparticles, and/or Sn deposits, molecular and/or atomic debris, such as for example Sn vapor, $SnH_x$ vapor, Sn atoms, Sn ions, as described above. A flow rate of about 7 slm may be sufficient to prevent molecular and/or atomic debris generated in the EUV vessel 100 from entering the intermediate focus region 157. To suppress particulate debris from reaching the intermediate focus region 157, flow rates of the gas supplied by the DGL supply 110 larger than 7 slm may be required. For example, to suppress particulate debris from reaching the intermediate focus region 157, a flow rate of larger than 15 slm of the gas supplied by the DGL supply 110 may be required. At a flow rate of larger than 15 slm, such as for example 20 slm, an interaction between the gas supplied by the showerhead 101 and/or the curtain supply 122 may be observed. This interaction may lead to debris in the EUV vessel 100 to be spread before it is removed from the EUV vessel 100, with some of the gas, by the exhaust 132 and/or may result in contamination of the internal wall 104 of the EUV vessel 100.

The flow splitter 150 is configured to reduce interaction between the gas supplied by the DGL supplied 110 and the gas supplied by the showerhead 101 and/or between the gas supplied by the DGL supply 110 and the gas supplied by the curtain supply 122. By reducing the interaction between the gas supplied by the DGL supply 110 and the gas supplied by the showerhead 101 and/or between the gas supplied by the DGL supply 110 and the gas supplied by the curtain supply 122, spreading of the debris before removal from the EUV vessel by the exhaust 132 may be reduced. This may further reduce contamination in the EUV vessel, e.g. the internal wall of the EUV vessel. The debris mitigation system, e.g. the showerhead 101 and/or the curtain supply 122, may be configured or arranged such that the gas supplied by showerhead 101 and/or the curtain supply 122 directs the debris towards the exhaust 132.

Figure 18B:
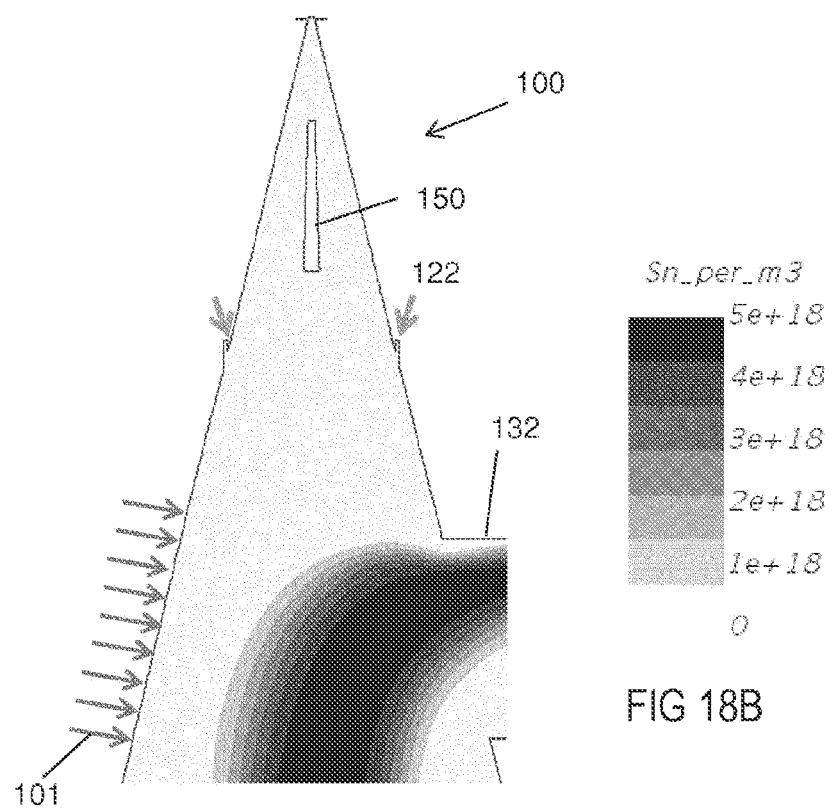
FIG. 18B shows a simulated debris concentration in the EUV vessel of FIG. 17.

FIG. 18B depicts a simulated debris concentration in the EUV vessel 100. It can be seen from FIG. 18B that the provision of the flow splitter 150, the showerhead 101 and/or the curtain supply 122 allows the debris to be directed towards the exhaust 132, while reducing contamination in the EUV vessel 100, e.g. the inner wall 104 of the EUV vessel.

Referring to FIG. 17, the flow splitter 150 is arranged such that the gas supplied by the DGL supply 110 is symmetrically directed around the flow splitter 150. The flow splitter 150 may be configured to diffuse or spread, e.g. symmetrically diffuse or spread, the gas supplied by the DGL supply 110. By arranging the flow splitter 150 in the EUV vessel 100, recirculation of at least some of the gas supplied by the DGL supply 110, for example due to the interaction of the gas supplied by the DGL supply 110 with gas supplied by the showerhead 101, curtain supply 122, center supply 106 and/or perimeter supply 108, in the EUV vessel 100 may be reduced. This may lead to less debris being deposited on the inner wall 104 of the of the radiation source SO. Additionally or alternatively, by arranging the flow splitter 150 in the EUV vessel 100 such that the gas supplied by the DGL supply 110 is directed around the flow splitter 150, contamination of the flow splitter 150, e.g. with debris, may be reduced or prevented.

The flow splitter 150 may be arranged in the EUV vessel 100 of the radiation source SO to maintain the maximum velocity of the gas supplied by the DGL supply 110 at a first location in the radiation source SO. At the first location the velocity of the gas supplied by the DGL supply 110 may correspond (or substantially correspond) to a maximum velocity of the gas supplied by the DGL supply 110, for example when no flow splitter is arranged in the EUV vessel 100 of the radiation source SO. The flow splitter 150 may be arranged in the EUV vessel 100 of the radiation source SO to diffuse or spread the gas supplied by the DGL supply 110 to prevent or reduce recirculation of at least some gas supplied by the DGL supply 110, for example in a direction towards the intermediate focus 157a. The flow splitter 150 may be arranged in the radiation source SO to diffuse or spread the gas supplied by the DGL supply 110 at a second location, which may be spaced or remote from the intermediate focus point 157a. The flow splitter 150 may be arranged in the EUV vessel 100 of the radiation source SO so that the maximum velocity of the gas supplied by the DGL supply 110 is reduced at the second location and/or a minimum velocity of gas supplied by the DGL supply 110 that may be directed in a direction away from the intermediate focus 157a is increased.

Referring to FIG. 17, the flow splitter 150 is arranged in the EUV vessel 100 to extend across a portion of the EUV vessel 100. For example, the flow splitter 150 may be arranged to extend at least partially along an optical axis OA of the EUV collector 102. In other words, the flow splitter 150 may be arranged in the EUV vessel 100 such that a central or longitudinal axis A of the flow splitter 150 (depicted in FIG. 19A) coincides with at least a part of the optical axis OA of the EUV collector 102. The EUV vessel 100 may comprise a conical shape, which extends from the intermediate focus region 157 towards or near the EUV collector 102. The conical shape of the EUV vessel 100 may allow a symmetrical arrangement of the flow splitter 150 in the EUV vessel 100. It will be understood that the exemplary EUV vessel described herein is not limited to comprising a conical portion. For example, the EUV vessel or a portion thereof may have any suitable shape, for example, to reduce the volume of the EUV vessel, without obstructing the EUV radiation 115.

The flow splitter 150 is arranged at or in proximity of the intermediate focus region 157. For example, the flow splitter 150 is arranged at or in proximity of the intermediate focus region 157 to enable the flow splitter 150 to act on the gas supplied by the DGL supply 110.

The flow splitter 150 may be arranged at a distance from the intermediate focus point 157a. The distance of the flow splitter 150 from the intermediate focus point 157a may be in the region of 5 to 15 cm. However, it should be understood that the arrangement of the flow splitter 150 in the radiation source SO is not limited to such a distance and other values for the distance may be selected. For example, the distance may be selected dependent on space available at or in proximity of the intermediate focus region and/or thermal loads that may act on the flow splitter 150, e.g. due to the radiation at the intermediate focus region. In other words, the distance may be selected such that any thermal effects on the flow splitter 150, such as for example melting of the flow splitter 150, are minimized or prevented.

The flow splitter 150 may be arranged to extend at least partially along the central or longitudinal axis of the EUV vessel 100, which in this example corresponds to at least a part of the optical axis OA of the EUV collector 102. This arrangement may allow the flow splitter 150 to symmetrically direct the gas supplied by the DGL supply 110 around the flow splitter 150, for example, to reduce or prevent the interaction between the gas supplied by the DGL supply 110 and the gas supplied by the showerhead 101 and/or between the gas supplied by the DGL supply 110 and the gas supplied by the curtain supply 122. Additionally, this arrangement may allow the flow splitter 150 to symmetrically direct the gas supplied by the DGL supply 110 around the flow splitter 150, for example, to reduce or prevent the interaction between the gas supplied by the DGL supply 110 and the gas supplied by the center supply 106 and/or the perimeter supply 108 and/or may prevent the formation of a jet of the gas supplied by the DGL supply 110, e.g. towards EUV collector 102.

Figure 19A:
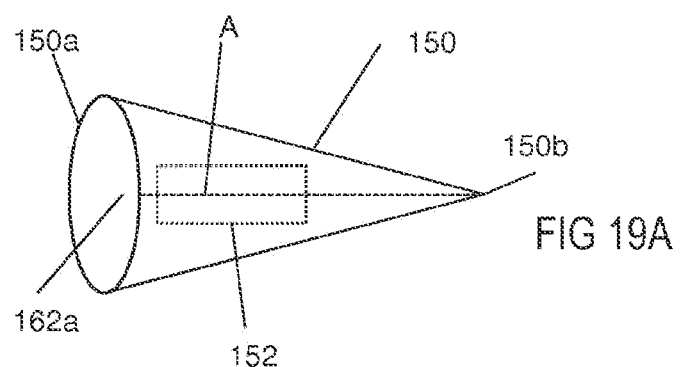
FIG. 19A is a schematic view of an embodiment of the guiding device of FIG. 17.

The exemplary flow splitter 150 depicted in FIG. 19A is arranged to taper from a first 150a end towards a second end 150b. The first end 150a of the flow splitter 150 may comprise or define an enlarged portion. The flow splitter 150 may be arranged in the EUV vessel 100 such that the first end 150a, e.g. the enlarged portion, of the flow splitter 150 is positioned distal from the intermediate focus region 157. The second end 150b of the flow splitter 150 may define or comprises a pointed portion 150a. The flow splitter 150 may be arranged in the EUV vessel 100 such that the second end 150b, e.g. the pointed portion, of the flow splitter is positioned at or proximal to the intermediate focus region 157. The exemplary flow splitter 150 depicted in FIG. 19A comprises a conical shape.

Figure 19B:
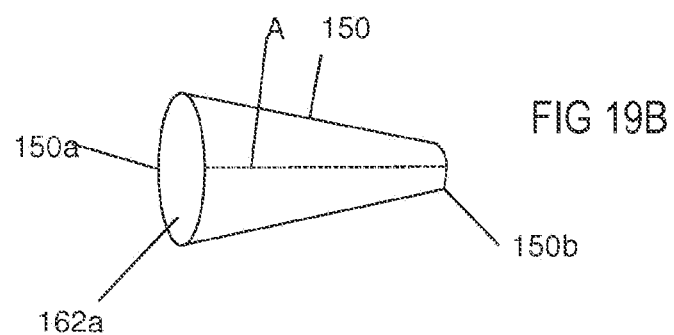
FIG. 19B is a schematic view of an embodiment of the guiding device of FIG. 17.

FIG. 19B depicts a further exemplary arrangement of the flow splitter 150. The flow splitter 150 depicted in FIG. 19B is similar to that depicted in FIG. 19A. The first end 150a of the flow splitter 150 defines or comprises the enlarged portion. The second end 150b of the flow splitter 150 comprises or defines a rounded portion. The exemplary flow splitter depicted in FIG. 19B may be considered as comprising a substantially truncated conical shape. It should be understood that the flow splitter disclosed herein is not limited to a conical or truncated conical shape. In other examples, the flow splitter may comprise a conical or truncated conical shape having one or more flat portions. Alternatively, the flow splitter may comprise a spiral or helical shape.

Referring to FIGS. 19A and 19B, an extension or dimension of the flow splitter 150, for example along the longitudinal or central axis A of the flow splitter 150, may be selected depending on a dimension, volume and/or shape of the EUV vessel 100. The extension or dimension of the flow splitter 150 may be selected such that the flow splitter 150 interacts with the gas supplied by the DGL supply 110 and/or the flow splitter directs the gas supplied by the DGL supply 110 around the flow splitter 150, as described above, e.g. when the flow splitter 150 is arranged in the EUV vessel 100. An exemplary extension or dimension of the flow splitter 150 along the longitudinal or central axis A of the flow splitter 150 may comprise about 3 to 30 cm, e.g. 10 to 20 cm. However, it should be understood that the exemplary flow splitter disclosed herein is not limited to such an extension or dimension.

The EUV source SO may include a heating element 152, which may be part or comprised in the flow splitter 150. The heating element 152 may be configured to increase a temperature of the flow splitter 150, for example to increase an amount of the gas supplied by the DGL supply 110 that is directed around the flow splitter 150.

The heating element 152 may be configured to increase the temperature of the flow splitter 150 to or above a first temperature at which an increased amount of the gas supplied by the DGL supply 110 is directed around the flow splitter 150. For example, an increase of the temperature of the flow splitter 150 to or above the first temperature may result in an increase of the velocity of at least some of the atoms of the gas supplied by the DGL supply 110, e.g. when at least a portion of the gas supplied by the DGL supply 110 comes into contact with the flow splitter 150. An increase of the temperature of the flow splitter 150 to or above the first temperature may cause heat to be transferred to a portion of the gas supplied by the DGL supply 110 that comes into contact with the flow splitter 150. The transfer of heat to the portion of the gas supplied by the DGL supply may cause the gas of the portion to expand and/or a viscosity of the gas of the portion to increase. In other words, the gas of the portion of the gas supplied by the DGL supply 110 that comes into contact with the flow splitter 150 may comprise an increased viscosity. The gas of the portion of gas supplied by the DGL supply 110 comprising the increased viscosity may act on another portion of the gas supplied by the DGL supply 110, which is incident on the flow splitter 150 and/or cause the other portion of the gas supplied by the DGL supply 110 to be directed around the flow splitter 150. In other words, due to the increased viscosity of the gas of the portion of the gas supplied by the DGL supply 110, the effective dimension of the flow splitter 150 may be considered as being increased relative to the actual dimension of the flow splitter 150.

The first temperature may be equal to or larger than the melting temperature of the fuel used to create the plasma 107. In other words, the first temperature may be selected dependent on the fuel used to create the plasma 107. For example, when tin is used as a fuel, the heating element 152 may be configured to increase the temperature of the flow splitter 150 to temperatures of about or larger than 230° C. (which largely corresponds to the melting temperature of tin). For temperatures below 200° C., any fuel, e.g. tin, deposited on the flow splitter 150 may be solid. The solid fuel may cause diffraction or block at least a portion of the EUV radiation 115 directed towards the intermediate focus 157a.

The heating element 152 may be configured to maintain the temperature of the flow splitter 150 below a second temperature. At or above the second temperature, diffusion of debris that may be present on the flow splitter occurs or increases. For example, at the second temperature or above the second temperature diffusion of debris that may be present on the flow splitter 150 may be increased. For example, the diffusion coefficient of tin vapor in a hydrogen atmosphere may increase with increasing temperature. By maintaining the temperature of the flow splitter 150 below the second temperature, diffusion of debris in the EUV vessel 100 may be reduced. The amount of debris on the flow splitter 150 may be considered to be small, for example, due to the flow splitter 150 being arranged in the EUV vessel 100 to direct the gas supplied by the DGL supply 110 around the flow splitter 150.

The heating element 152 may be embedded in the flow splitter 150. It will be appreciated that in other embodiments, the heating element may be provided separately. In such embodiments, the heating element may be arranged to increase the temperature of the flow splitter. The heating element 152 may be provided in the form of a resistive heating element. It will be appreciated that in other embodiments, the flow splitter may be inductively heated and/or the heating element may be provided in the form of an electromagnetic element, e.g. a coil or the like. An electronic oscillator, e.g. a radio frequency generator, may be provided to generate electric currents in the electromagnetic element, which may result in heat being generated in the electromagnetic element.

Figure 19C:
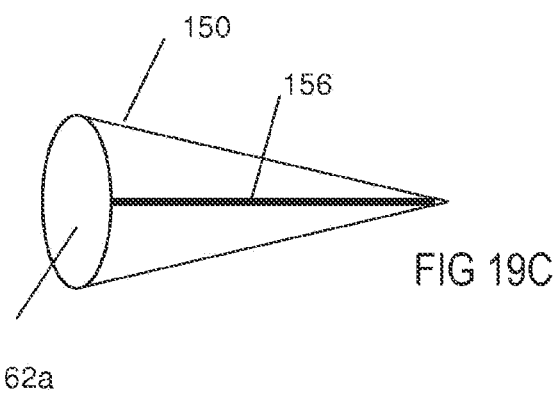
FIG. 19C is a schematic view of a further embodiment of the guiding device of FIG. 17.

Referring to FIGS. 17 and 19C, in some embodiments, the flow splitter 150 may be configured for cooling by a coolant. The flow splitter 150 may be cooled, for example to reduce the thermal loads that may act on the flow splitter 150, e.g. due to the EUV radiation at the intermediate focus region 157. The flow splitter 150 may be cooled to maintain a temperature of the flow splitter 150 below a melting temperature of the fuel used to create the plasma 107. This may prevent distribution/diffusion of liquid fuel that may be present on the flow splitter 150 onto the internal wall 104 or any other component of the radiation source SO. As described above, the amount of debris that may be present on the flow splitter 150 is considered to be small, for example, due to the flow splitter 150 being arranged in the EUV vessel 100 to direct the gas supplied by the DGL supply 110 around the flow splitter 150.

The coolant may be supplied by a coolant source 154. For example, the flow splitter 150 may comprise a channel 156 for receiving the coolant from the coolant source 154 and/or flowing the coolant through the flow splitter 150. The flow splitter 150 may be configured for connection to the coolant source 154. The coolant source 154 may be configured to supply the flow splitter 150 with a coolant. For example, the coolant source 154 may be configured to supply the flow splitter 150 with a coolant to decrease a temperature of the flow splitter 150, e.g. below a melting temperature of the fuel fused to create the plasma 107 and/or the second temperature, as described above. The coolant may be provided in the form of a coolant fluid, e.g. a coolant liquid or a coolant/cold gas etc. It will be appreciated that the flow splitter may be configured for being cooled by the coolant instead to or addition to comprising the heating element 152.

Figure 20:
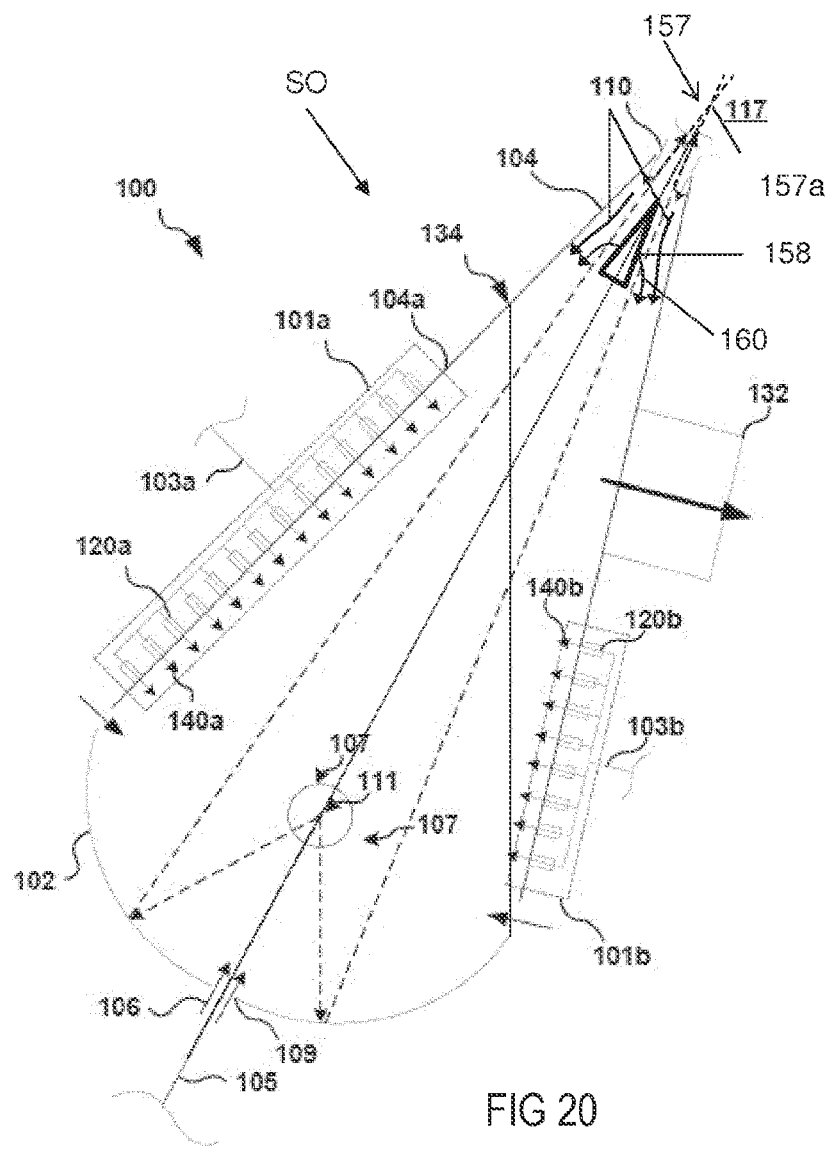
FIG. 20 is a cross-sectional view of the EUV vessel of FIG. 10 comprising a further embodiment of the guiding device.

FIG. 20 schematically depicts a further embodiment of the EUV source SO. The EUV source SO depicted in FIG. 20 is similar to that depicted in FIG. 17. The exemplary flow splitter 150 of the radiation source SO depicted in FIG. 20 includes a plurality of further openings 158, which may be provided in the form of nozzles or slits. The plurality of further openings 158 (or each further opening of the plurality of further openings 158) may be configured to direct a fifth gas flow 160 towards the EUV collector 102. The fifth gas flow may comprise a flow rate in the range of about 1 to 50 slm. The plurality of further openings 158 may be arranged on the flow splitter 150 such that the fifth gas flow 160 from the plurality of further openings 158 interacts with the gas supplied by the DGL supply 110. The interaction between the gas supplied by the DGL supply 110 and the fifth gas flow 160 may direct or push the gas supplied by the DGL supply 110 into proximity with the inner wall 104 of the EUV vessel 100. The provision of the plurality of further openings 158 for directing the fifth gas flow 160 towards the EUV collector 102 may lead to an increased spreading of the gas supplied by the DGL supply 110. The increased spreading of the gas supplied by the DGL supply 110 may result in a reduced or suppressed interaction between the gas supplied by the DGL supply 110 and the gas supplied by the showerhead 101 and/or between the gas supplied by the DGL supply 110 and the gas supplied by the curtain supply 122.

The plurality of further openings 158 may be circumferentially, peripherally and/or axially arranged on the flow splitter 150. In other words, the plurality of further openings 158 may be arranged to extend around the flow splitter 150 and/or in a direction of the central or longitudinal axis A of the flow splitter 150. The plurality of further openings 158 may be symmetrically arranged on the flow splitter 150, for example to cause a symmetric flow of the gas supplied by the DGL supply 110 and/or the fifth gas flow 160 around the flow splitter 150.

The DGL supply 110 may be configured to supply the fifth gas flow 160 to the flow splitter 150. For example, the flow splitter 150 may be connected or connectable to the DGL supply 110 e.g. to enable supply of the fifth gas flow 160 to the flow splitter 150. It will be appreciated that in other example, the debris mitigation system may comprise a further gas supply system, which may be configured to supply the gas flow to the flow splitter. The flow splitter may be connected or connectable to the further gas supply system, e.g. to enable supply of the gas flow to the flow splitter. Although the flow splitter 150 depicted in FIG. 20 comprises a plurality of further openings 158, it will be appreciated that in other embodiments the flow splitter may comprise a single further opening, which may be configured to direct the fifth gas flow towards the EUV collector.

Figure 21:
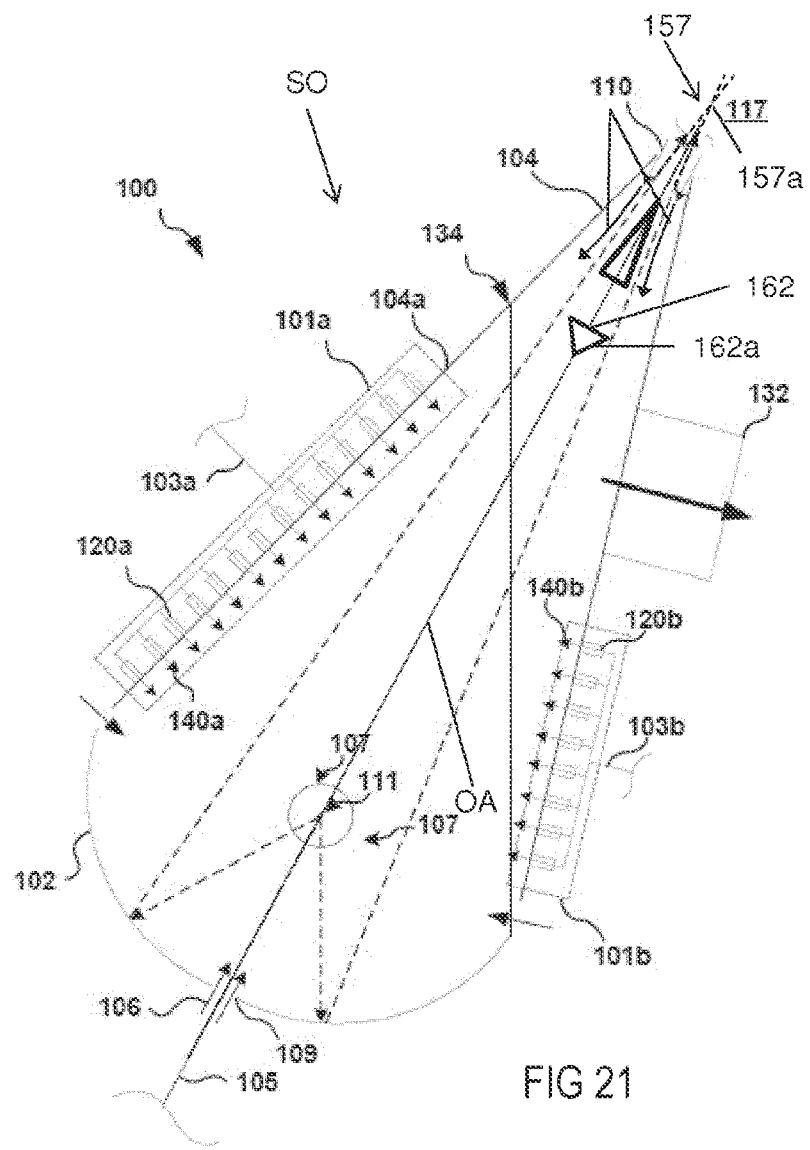
FIG. 21 is a cross-sectional view of the EUV vessel of FIG. 17 comprising a debris receiving surface.

FIG. 21 schematically depicts a further embodiment of the EUV source SO. The EUV source SO depicted in FIG. 21 is similar to that depicted in FIG. 17. The exemplary EUV source SO depicted in FIG. 21 comprises a debris receiving surface 162a, which may be part of or provided by a bar or obscuration bar 162. The bar 162 may be arranged in the EUV vessel 100 to reduce or prevent debris from reaching the intermediate focus region 157. The bar 162 may be arranged to intersect or extend across the optical axis OA of the EUV collector 102. In this arrangement, the bar 162 can be considered to obscure the direct line of sight of debris, which may include ballistic particulate debris, and/or of a portion of the laser radiation 105, e.g. the portion of the laser radiation 105 that passes through the material target region 111. In other words, the bar 162 may be configured to reflect the portion of the laser radiation 105 away from the intermediate focus region 157 of the EUV source SO.

In the exemplary EUV source depicted in FIG. 21, the flow splitter 150 is arranged between the bar 162 and the intermediate focus region 157. In this arrangement, the bar 162 is arranged to extend over or overlap with at least a portion or all of the flow splitter 150. For example, the bar 162 may be arranged to extend over or overlap with the enlarged portion of the first end 150b of the flow splitter 150 so that debris generated by the plasma 107 is incident on the debris receiving surface 162a of the bar 162. In other words, flow splitter 150 may be arranged in the shadow of the bar 162.

Although in the exemplary EUV source SO depicted in FIG. 21, the debris receiving surface 162a was described as being part of the bar 162, it will be appreciated that in other embodiments of the EUV source, such as for example any of those described in relation to FIGS. 17 and 20, the debris receiving surface 162a may be provided by or be part of the flow splitter 150. In such case, the flow splitter 150 may comprise any of the features of the bar 162, described above. Additionally, the flow splitter 150 may be configured such that the flow splitter 150 is able to withstand the heat or heat/thermal load created by the plasma 107 or that of the EUV radiation 115 at the intermediate focus region 157. The flow splitter 150 may be configured to reflect the portion of the laser radiation 105 that passes through the material target region 111, away from the intermediate focus region 157. For example, when the debris receiving surface 162a is provided by the flow splitter 150, the extension or dimension of the flow splitter 150, e.g. in a direction perpendicular and/or parallel to the central or longitudinal axis A of the flow splitter 150, may be increased relative to the extension or dimension, e.g. in a direction perpendicular and/or parallel to the central or longitudinal axis A, of a flow splitter 150 that is used in combination with the bar 162.

The first, second, third, fourth and/or fifth gas flow may comprise hydrogen gas. It will be appreciated that in other embodiments another gas or a mixture of gases may be used. For example, in other embodiments the first, second, third, fourth and/or fifth gas flow may comprise argon or helium gas.

The material of the flow splitter 150 may be selected to be corrosion resistant, e.g. to be resistant against corrosion by the fuel in the environment in the EUV source SO, e.g. the hydrogen environment in the EUV source SO. The material of the flow splitter 150 may be selected to be resistant to the thermal loads acting on the flow splitter, e.g. due to the EUV radiation 115 in the radiation source SO and/or the plasma 107, and/or to the increase of the temperature of the flow splitter 150 to or above the first temperature, as described above. The exemplary flow splitter 150 may comprise a metal or metal alloy. For example, the material of flow splitter may be or comprise molybdenum, tungsten, aluminium, stainless steel, copper or an alloy thereof. The flow splitter 150 may comprise a metal or metal alloy surface. The metal or metal alloy surface of the flow splitter may lead to an improved recombination of hydrogen radials, which may be present in the radiation source SO. For example, hydrogen (H 2) molecules may split into hydrogen radicals due to their absorption of heat and/or radiation or ion collisions. The hydrogen radicals may be beneficial for removing debris, e.g. tin, from the internal wall 104 of the radiation source. The presence of hydrogen radicals may cause contamination in the EUV vessel 100, such as spitting of fuel, for example, when the hydrogen radicals diffuse into layers of fuel in the EUV vessel 100 that are liquid. By providing the flow splitter with a metal or metal alloy surface, the recombination of hydrogen radicals may be improved and/or the contamination, e.g. spitting of fuel, in the EUV vessel reduced.

It will be appreciated that in other embodiments the flow splitter may comprise another material, such as for example a ceramic material. The ceramic material may comprise a silicon dioxide, zirconium nitride, or zirconium oxide material. Although specific reference may be made in this text to embodiments in the context of a lithographic apparatus, embodiments of the invention may be used in one or more other apparatuses. Embodiments may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "at least part of the lithographic apparatus" may be considered as encompassing the illumination system IL, patterning device MA, and/or the projection system PS. The term "radiation source" may be considered as encompassing the laser 162. The term "prevent" may be considered to encompass substantially prevent. The term "intermediate focus region" may be considered to encompass a region at and/or near the intermediate focus point. The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the EUV radiation source SO.

Although the flow splitter 150 was described as being arranged in a EUV vessel comprising the asymmetric exhaust 132, it will be appreciated that in other embodiments the flow splitter may be used in an EUV vessel comprising a symmetric exhaust, such as for example depicted in FIGS. 9B to 9C, 12A. Additionally or alternatively, the flow splitter may be used in an EUV vessel comprising a curtain flow supply, such as for example depicted in FIGS. 16A and 16B. The flow splitter may also be used in the EUV vessel depicted in FIGS. 9A and 11.

Additionally, it will be understood that each of the foregoing embodiments may be practiced with a temperature control system that conditions the inner vessel walls 104, as well as other components included in the EUV vessel 100 to achieve certain temperatures. Certain portions of the inner vessel walls 104, for example, may be kept at temperatures that are below a melting point of Sn, whereas other portions may be kept at temperatures that are above the melting point of Sn. In these and other embodiments, the temperatures of each of the regions of the inner vessel wall 104 may also be changed, or cycle between temperatures that are above and below the melting point of Sn.

In an embodiment, there is provided a radiation source comprising: a chamber comprising a plasma formation region; a radiation collector arranged in the chamber, the radiation collector configured to collect radiation emitted at the plasma formation region and to direct the collected radiation to an intermediate focus region; a debris mitigation system configured to direct a first gas flow from the intermediate focus region towards the plasma formation region; and a guiding device arranged in the chamber such that the first gas flow is directed around the guiding device.

In an embodiment, the guiding device is arranged such that the first gas flow is symmetrically directed around and/or diffused by the guiding device. In an embodiment, the debris mitigation system is configured to direct a second gas flow from the radiation collector towards the plasma generation region. In an embodiment, the guiding device is configured to reduce interaction between the first gas flow and the second gas flow. In an embodiment, the guiding device is configured to prevent interaction between the first gas flow and the second gas flow. In an embodiment, the guiding device is configured to prevent formation of a jet of the first gas flow towards the radiation collector. In an embodiment, the guiding device is arranged in the chamber to extend at least partially along an optical axis of the radiation collector. In an embodiment, the guiding device is arranged at or in proximity of the intermediate focus region. In an embodiment, the guiding device is arranged to taper from a first end of the guiding device towards a second end of the guiding device, the first end comprising an enlarged portion and the second end comprising a pointed portion or rounded portion. In an embodiment, the guiding device is arranged in the chamber such that the first end of the guiding device is positioned distal from the intermediate focus region and the second end of the guiding device is positioned at or proximal to the intermediate focus region. In an embodiment, the guiding device comprises a plurality of openings, the plurality of openings configured to direct a third gas flow towards the radiation collector. In an embodiment, the plurality of openings are arranged on the guiding device such that the third gas flow from the plurality of openings interacts with the first gas flow to direct or push the first flow of gas into proximity with at least a portion of the chamber. In an embodiment, the guiding device comprises a heating element configured to increase a temperature of the guiding device. In an embodiment, the heating element is configured to increase the temperature of the guiding device to a first temperature at which an increased amount of the first gas flow is directed around the guiding device and/or to maintain the temperature of the guiding device below a second temperature at or above which diffusion of debris that is present on the guiding device increases. In an embodiment, the guiding device is configured for cooling by a coolant, the coolant being supplied by a coolant source. In an embodiment, the radiation source comprises a debris receiving surface, the debris receiving surface being arranged in the chamber to reduce or prevent debris from reaching the intermediate focus region. In an embodiment, the debris receiving surface is arranged to intersect or extend across the optical axis of the radiation collector. In an embodiment, the guiding device is arranged between the debris receiving surface and the intermediate focus region. In an embodiment, the debris receiving surface is arranged to extend over or overlap with at least a portion or all of the guiding device so that debris generated at the plasma formation region is incident on the debris receiving surface. In an embodiment, the debris receiving surface is comprised in, part of or provided by the guiding device.

In an embodiment, there is provided a method of reducing debris deposition in a radiation source, the method comprising: directing a first gas flow from an intermediate focus region of the radiation source towards a plasma generation region of the radiation source; and directing the first gas flow around a guiding device arranged in a chamber of the radiation source.

In an embodiment, there is provided an extreme ultraviolet (EUV) source, comprising: a vessel having an inner vessel wall and an intermediate focus (IF) region; an EUV collector disposed inside the vessel connected to the inner vessel wall, the EUV collector including a reflective surface, the reflective surface configured to directionally face the IF region of the vessel; a showerhead disposed along at least a portion of the inner vessel wall, the showerhead including a plurality of nozzles configured to introduce gas into the vessel, the showerhead having at least one inlet configured to supply the gas into the showerhead; and one or more exhausts configured to remove gas introduced into the vessel, the one or more exhausts being oriented along at least a portion of the inner vessel wall so that the gas is caused to flow away from the EUV collector.

In an embodiment, the EUV source further comprises a material target region disposed within the vessel for generating plasma radiation, the plasma radiation being collected by the reflective surface of the EUV collector and directed toward the IF region for entrance into at least part of a lithographic apparatus, wherein introduction of the gas into the vessel via the plurality of nozzles enables protection of the inner vessel wall from deposition of material. In an embodiment, the plurality of nozzles is oriented along at least a portion of an inner surface of the inner vessel wall in a direction that faces away from the inner surface of the inner vessel wall. In an embodiment, the inner vessel wall has a conical, cylindrical, or polyhedral shape. In an embodiment, the showerhead extends perimetrically and laterally along at least a portion of the inner vessel wall. In an embodiment, the EUV source further comprises an outer vessel wall surrounding the vessel, the outer vessel wall including one or more exhaust vents. In an embodiment, the showerhead includes one or more zones, each of the one or more zones including at least a portion of the plurality of nozzles, each of the one or more zones being separately supplied with gas to enable separately controllable zones for introducing gas into the vessel. In an embodiment, the inner vessel wall is defined by smooth surfaces, vane surfaces, or a combination of smooth surfaces and vane surfaces.

In an embodiment, there is provided an extreme ultraviolet (EUV) source, comprising: a vessel having an inner vessel wall and an intermediate focus (IF) region; an EUV collector disposed inside the vessel connected to the inner vessel wall, the EUV collector including a reflective surface that is configured to directionally face the IF region of the vessel; a first gas source configured to introduce gas into the vessel, the first gas source including a first plurality of inlets, the first plurality of inlets disposed proximate to the reflective surface of the EUV collector; a showerhead disposed along at least a portion of the inner vessel wall, the showerhead including a plurality of nozzles configured to introduce gas into the vessel, the showerhead having at least one inlet configured to supply gas into the showerhead; and an exhaust disposed along the inner vessel wall at an azimuthally asymmetric position and configured to exhaust gas from the vessel.

In an embodiment, the exhaust is further oriented proximate to a first region of the inner vessel wall, the first region of the inner vessel wall generally opposing a second region of the inner vessel wall that is located gravitationally above the EUV collector, the exhaust enabling gas introduced by the first gas source and the plurality of nozzles to flow away from the second region while the EUV source is operational. In an embodiment, the plurality of nozzles is distributed at least partially along a region of the inner vessel wall that is located gravitationally above the EUV collector. In an embodiment, the plurality of nozzles is oriented along an inner surface of the inner vessel wall in a direction that is away from the inner surface of the inner vessel wall, the orientation of the plurality of nozzles enabling a flow of gas that is at least partially directed away from at least a portion of the inner surface of the inner vessel wall. In an embodiment, the plurality of nozzles are disposed at least partially along a ceiling region of the inner vessel wall that is located gravitationally above the EUV collector, the plurality of nozzles oriented in a direction that faces away from the ceiling region, the introduction of the gas by the plurality of nozzles providing a diffusion barrier adjacent the ceiling region for excluding debris. In an embodiment, the showerhead includes one or more zones, each of the one or more zones including at least a portion of the plurality of nozzles, each of the one or more zones being separately supplied with gas to enable separately controllable zones for introducing gas into the vessel. In an embodiment, the inner vessel wall has a conical, cylindrical, or polyhedral shape.

In an embodiment, there is provided an extreme ultraviolet (EUV) source, comprising: a vessel having an inner vessel wall and an intermediate focus (IF) region; an EUV collector disposed inside the vessel connected to the inner vessel wall, the EUV collector including a reflective surface, the reflective surface configured to directionally face the intermediate focus region of the vessel; a vessel wall gas source disposed laterally at least partially along the inner vessel wall, the vessel wall gas source including a plurality of nozzle assemblies, each of the plurality of nozzle assemblies having at least a first outlet and a second outlet configured to introduce gas into the vessel, the first outlet configured to introduce gas in a first direction that is away from a second direction in which the second outlet is configured to introduce gas; and an exhaust configured to exhaust gas introduced into the vessel, the exhaust being proximate to the IF region to enable gas introduced by the vessel wall gas source to flow away from the EUV collector.

In an embodiment, the first direction and the second direction in which gas is introduced by the first outlet and the second outlet, respectively, of each the plurality of nozzle assemblies are oriented at least partially along a perimeter of the inner vessel wall to enable curtain flows of gas along the perimeter of the inner vessel wall. In an embodiment, at least a portion of the plurality of nozzle assemblies further includes a third outlet configured to introduce gas into the vessel, the third outlet configured to introduce gas away from the inner vessel wall. In an embodiment, the plurality of nozzle assemblies is distributed at least partially along a first region of the inner vessel wall that is located gravitationally above the EUV collector while the EUV source is operational, and wherein the exhaust is further oriented proximate to a second region of the inner vessel wall that opposes the first region of the inner vessel wall to enable gas that is introduced into the vessel to flow away from the first region of the inner vessel wall. In an embodiment, the inner vessel wall has a conical, cylindrical, or polyhedral shape.

In an embodiment, there is provided a radiation source comprising: a chamber comprising an inner wall and a material target region; a radiation collector arranged in the chamber, the radiation collector configured to collect radiation emitted at the material target region and to direct the collected radiation to an intermediate focus region; a debris mitigation system configured to direct a first gas flow from the intermediate focus region towards the material target region, the debris mitigation system configured to direct a second gas flow from a portion of the inner wall of the chamber into the chamber; a guiding device arranged in the chamber such that the first gas flow is directed around the guiding device; and an exhaust configured to remove gas supplied by the debris mitigation system from the chamber.

In an embodiment, the exhaust is arranged to extend from a portion of the inner wall of the chamber at an azimuthally asymmetric position. In an embodiment, the debris mitigation system comprises a showerhead arranged along at least a portion of the inner wall of the chamber, the showerhead including a plurality of nozzles configured to introduce the second gas flow into the chamber. In an embodiment, the guiding device is configured to reduce interaction between the first gas flow and the second gas flow. In an embodiment, the debris mitigation system is configured to direct a third gas flow from a position at or proximate to the guiding device in the chamber towards the material target region. In an embodiment, the guiding device is configured to reduce interaction between the first gas flow and the third gas flow. In an embodiment, the debris mitigation system is configured to direct a fourth gas flow from the radiation collector towards the material target region. In an embodiment, the guiding device is configured to reduce interaction between the first gas flow and the fourth gas flow. In an embodiment, the guiding device is arranged to taper from a first end of the guiding device towards a second end of the guiding device, the first end comprising an enlarged portion and the second end comprising a pointed portion or rounded portion. In an embodiment, the guiding device is arranged in the chamber such that the first end of the guiding device is positioned distal from the intermediate focus region and the second end of the guiding device is positioned at or proximal to the intermediate focus region. In an embodiment, the guiding device is arranged in the chamber to extend at least partially along an optical axis of the radiation collector. In an embodiment, the guiding device comprises a plurality of openings, the plurality of openings configured to direct a fifth gas flow towards the radiation collector. In an embodiment, the plurality of openings are arranged on the guiding device such that the fifth gas flow from the plurality of openings interacts with the first gas flow to direct or push the first flow of gas into proximity with at least a portion of the inner wall of the chamber. In an embodiment, the guiding device comprises a heating element configured to increase a temperature of the guiding device. In an embodiment, the heating element is configured to increase the temperature of the guiding device to a first temperature at which an increased amount of the first gas flow is directed around the guiding device and/or to maintain the temperature of the guiding device below a second temperature at which diffusion of debris that is present on the guiding device increases. In an embodiment, the guiding device is configured for cooling by a coolant, the coolant being supplied by a coolant source. In an embodiment, the radiation source comprises a debris receiving surface, the debris receiving surface arranged in the chamber to reduce or prevent debris from reaching the intermediate focus region. In an embodiment, the debris receiving surface is comprised in, part of or provided by the guiding device.

In an embodiment, there is provided a radiation system comprising a laser and a radiation source as described herein. In an embodiment, there is provided a lithographic system comprising a lithographic apparatus arranged to project a pattern from a patterning device onto a substrate, and a radiation system as described herein arranged to provide at least some of the radiation to the lithographic apparatus.

In an embodiment, there is provided a method of reducing debris deposition in a radiation source, the method comprising: directing a first gas flow from an intermediate focus region of the radiation source towards a material target region of the radiation source; directing a second gas flow from a portion of an inner wall of a chamber of the radiation source into the chamber; directing the first gas flow around a guiding device arranged in the chamber of the radiation source; and removing gas from the chamber.

In an embodiment, there is provided a radiation source comprising: a chamber comprising an inner wall and a material target region; a radiation collector arranged in the chamber, the radiation collector configured to collect radiation emitted at the material target region and to direct the radiation beam of the collected radiation to an intermediate focus region; a debris mitigation system comprising a first gas supply system and a second gas supply system; an exhaust configured to remove gas supplied by the debris mitigation system from the chamber, wherein the first gas supply system is configured to direct a first gas flow from the intermediate focus region towards the material target region or the plasma formation region, the first gas supply system comprising one or more openings arranged to direct the first gas flow in a direction substantially opposite to a propagation direction of the radiation beam into the chamber, and wherein the second gas supply system comprises one or more openings arranged to direct the second gas flow in a direction substantially perpendicular or tilted under an angle to the propagation direction of the first gas flow.

In an embodiment, the second gas supply system comprises a pair of counter gas flow jets. In an embodiment, the first gas flow and the second gas flow interact via their momentum exchange such that a substantially unidirectional gas flow field is established towards the exhaust. In an embodiment, the second gas supply system is arranged in proximity of the intermediate focus region, downstream of the first gas flow. In an embodiment, the first and the second gas supply systems are arranged such that, in close vicinity of an interception point of the first and second flows, a velocity of the first gas flow is substantially equal to the velocity of the second gas flow. In an embodiment, a guiding device is arranged in the chamber such that the first gas flow is directed around the guiding device. In an embodiment, the radiation source comprises a showerhead disposed along at least a portion of the inner vessel wall, the showerhead including a plurality of nozzles configured to introduce gas into the vessel, the showerhead having at least one inlet configured to supply the gas into the showerhead; and one or more exhausts configured to remove gas introduced into the vessel, the one or more exhausts being oriented along at least a portion of the inner vessel wall so that the gas is caused to flow away from the EUV collector. In an embodiment, the exhaust is disposed along the inner vessel wall at an azimuthally asymmetric position and configured to exhaust gas from the vessel.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

As will be appreciated, aspects of one or more embodiments herein may incorporated into one or more other embodiments herein as, for example, a substitution or modification.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope and equivalents of the claims set out below.

The invention claimed is:

1. A radiation source comprising:
   a chamber comprising an inner wall and a material target region;
   a radiation collector arranged in the chamber, the radiation collector configured to collect radiation emitted at the material target region and to direct the collected radiation to a focus region; and
   a guiding device arranged in the chamber between the material target region and the focus region such that a gas flow is split around the guiding device and directed to flow between the guiding device and the inner wall, the guiding device comprising an opening configured to introduce gas into the chamber and connectable to a gas source.

2. The radiation source of claim 1, wherein the guiding device is arranged in the chamber to extend at least partially along an optical axis of the radiation collector.

3. The radiation source of claim 1, wherein the guiding device is arranged to taper from a first end of the guiding device towards a second end of the guiding device, the first end comprising an enlarged portion and the second end comprising a pointed portion or rounded portion.

4. The radiation source of claim 1, wherein the guiding device is elongate along a direction and the guiding device comprises a plurality of openings distributed around the direction to provide gas into the chamber.

5. The radiation source of claim 1, further comprising:
   a first gas supply system configured to direct a first gas flow from the focus region towards the material target region, and
   a second gas supply system comprising one or more openings arranged to direct a second gas flow in a direction substantially perpendicular or tilted under an angle to the propagation direction of the first gas flow.

6. A lithographic system comprising a lithographic apparatus arranged to project a pattern from a patterning device onto a substrate, and the radiation source according to claim 1 arranged to provide at least some of the radiation to the lithographic apparatus.

7. An inspection system comprising an inspection apparatus configured to inspect a substrate with radiation, and the radiation source according to claim 1 arranged to provide at least some of the radiation to the inspection apparatus.

8. A radiation source comprising:
   a chamber comprising an inner wall and a material target region;
   a radiation collector arranged in the chamber, the radiation collector configured to collect radiation emitted at the material target region and to direct the collected radiation to a focus region; and
   a structure arranged in the chamber to at least block particles emitted from the material target region towards the focus region, the structure comprising an opening configured to introduce gas into the chamber and connectable to a gas source,
   wherein the structure is spaced away from the inner wall.

9. The radiation source of claim 8, wherein the structure is arranged in the chamber to extend at least partially along an optical axis of the radiation collector.

10. The radiation source of claim 8, wherein the structure is arranged to taper from a first end of the structure towards a second end of the structure, the first end comprising an enlarged portion and the second end comprising a pointed portion or rounded portion.

11. The radiation source of claim 8, wherein the structure is elongate along a direction and the structure comprises a plurality of openings distributed around the direction to provide gas into the chamber.

12. The radiation source of claim 8, further comprising:
    a first gas supply system configured to direct a first gas flow from the focus region towards the material target region, and
    a second gas supply system comprising one or more openings arranged to direct a second gas flow in a direction substantially perpendicular or tilted under an angle to the propagation direction of the first gas flow.

13. A lithographic system comprising a lithographic apparatus arranged to project a pattern from a patterning device onto a substrate, and the radiation source according to claim 8 arranged to provide at least some of the radiation to the lithographic apparatus.

14. An inspection system comprising an inspection apparatus configured to inspect a substrate with radiation, and the radiation source according to claim 8 arranged to provide at least some of the radiation to the inspection apparatus.

15. A radiation source comprising:
    a chamber comprising an inner wall and a material target region;
    a radiation collector arranged in the chamber, the radiation collector configured to collect radiation emitted at the material target region and to direct the collected radiation to a focus region; and
    a structure arranged in the chamber between the material target region and the focus region and configured to allow radiation from the collector to pass around the structure between the structure and the inner wall, the structure comprising an opening configured to introduce gas into the chamber and connectable to a gas source.

16. The radiation source of claim 15, wherein the structure is arranged in the chamber to extend at least partially along an optical axis of the radiation collector.

17. The radiation source of claim 15, wherein the structure is arranged to taper from a first end of the structure towards a second end of the structure, the first end comprising an enlarged portion and the second end comprising a pointed portion or rounded portion.

18. The radiation source of claim 15, wherein the structure is elongate along a direction and the structure comprises a plurality of openings distributed around the direction to provide gas into the chamber.

19. A lithographic system comprising a lithographic apparatus arranged to project a pattern from a patterning device onto a substrate, and the radiation source according to claim 15 arranged to provide at least some of the radiation to the lithographic apparatus.

20. An inspection system comprising an inspection apparatus configured to inspect a substrate with radiation, and the radiation source according to claim 15 arranged to provide at least some of the radiation to the inspection apparatus.

* * * * *